United States Patent
Liu et al.

(10) Patent No.: US 12,414,330 B2
(45) Date of Patent: Sep. 9, 2025

(54) MULTI-GATE DEVICE INCLUDING SEMICONDUCTOR FIN BETWEEN DIELECTRIC FINS AND METHOD OF FABRICATION THEREOF

(71) Applicant: TAIWAN SEMICONDUCTOR MANUFACTURING COMPANY, LTD., Hsinchu (TW)

(72) Inventors: Ko-Cheng Liu, Hsinchu (TW); Chang-Miao Liu, Hsinchu (TW); Huiling Shang, Hsinchu Country (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 497 days.

(21) Appl. No.: 17/832,651

(22) Filed: Jun. 5, 2022

(65) Prior Publication Data

US 2023/0395681 A1    Dec. 7, 2023

(51) Int. Cl.
*H10D 30/67* (2025.01)
*H10D 62/10* (2025.01)
(Continued)

(52) U.S. Cl.
CPC ..... *H10D 30/6735* (2025.01); *H10D 30/6733* (2025.01); *H10D 30/6757* (2025.01);
(Continued)

(58) Field of Classification Search
CPC ..... H01L 21/823412; H01L 21/823431; H01L 21/823468; H01L 21/823481; H01L 27/088; H01L 27/0886; H01L 29/0649; H01L 29/0673; H01L 29/0847; H01L 29/165; H01L 29/267; H01L 29/42392; H01L 29/66439; H01L 29/66545; H01L 29/6656; H01L 29/66772; H01L 29/775; H01L 29/7848; H01L 29/78645;
(Continued)

(56) References Cited

U.S. PATENT DOCUMENTS 8,772,109 B2   7/2014  Colinge
8,785,285 B2   7/2014  Tsai et al.
(Continued)

FOREIGN PATENT DOCUMENTS

TW   202147436 A   12/2021

*Primary Examiner* — Cheung Lee
(74) *Attorney, Agent, or Firm* — HAYNES AND BOONE, LLP

(57) ABSTRACT

A method includes forming a semiconductor fin protruding from a substrate, forming a cladding layer on sidewalls of the semiconductor fin, forming first and second dielectric fins sandwiching the semiconductor fin, and removing the cladding layer. The removal of the cladding layer forms trenches between the semiconductor fin and the first and second dielectric fins. After the removing of the cladding layer, a dummy gate structure is formed over the semiconductor fin and in the trenches. The method also includes recessing the semiconductor fin in a region proximal to the dummy gate structure, forming an epitaxial feature on the recessed semiconductor fin, and forming a metal gate stack replacing the dummy gate structure. A top surface of the recessed semiconductor fin in the region has a concave shape.

20 Claims, 44 Drawing Sheets

(51) Int. Cl.
    *H10D 64/01* (2025.01)
    *H10D 84/01* (2025.01)
    *H10D 84/03* (2025.01)

(52) U.S. Cl.
    CPC ......... *H10D 62/115* (2025.01); *H10D 64/017* (2025.01); *H10D 64/021* (2025.01); *H10D 84/0128* (2025.01); *H10D 84/0147* (2025.01); *H10D 84/0151* (2025.01); *H10D 84/0158* (2025.01); *H10D 84/038* (2025.01)

(58) Field of Classification Search
    CPC .......... H01L 29/78696; H10D 30/0273; H10D 30/501–509; H10D 30/6735; H10D 62/115; H10D 64/017
    See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2019/0122934 A1 | 4/2019 | Chang et al. |
| 2020/0294859 A1 | 9/2020 | Chang et al. |
| 2021/0091179 A1* | 3/2021 | Wang ................ H01L 29/66469 |
| 2021/0098304 A1* | 4/2021 | Chang ............... H01L 29/66553 |
| 2021/0257480 A1* | 8/2021 | Jhan .................. H01L 29/66545 |

* cited by examiner

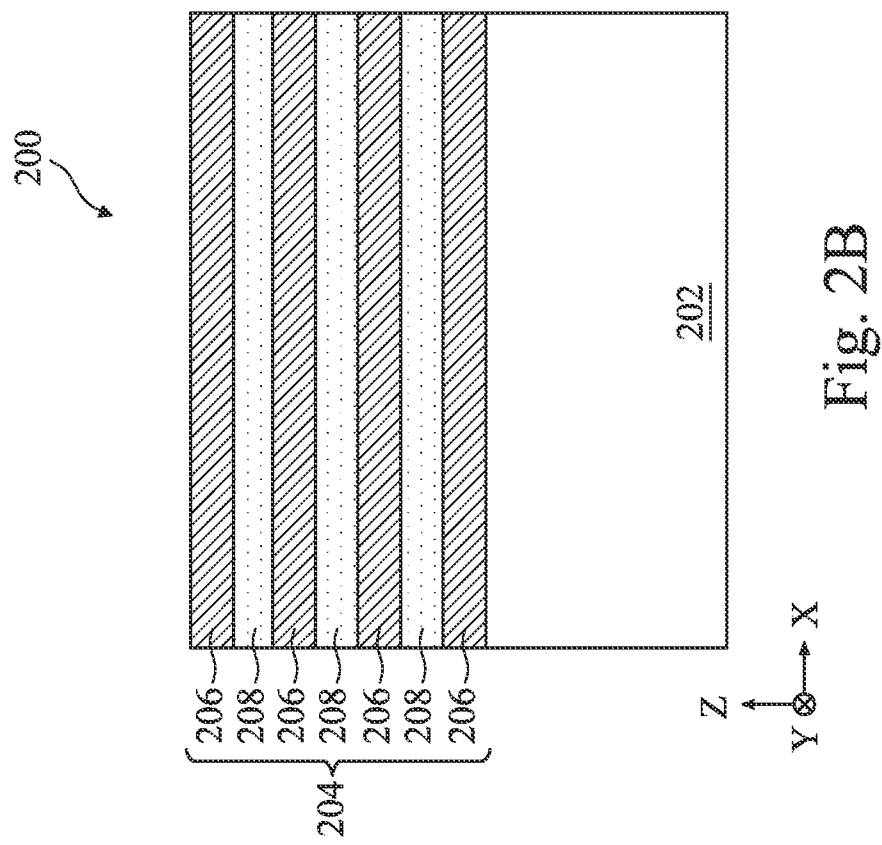
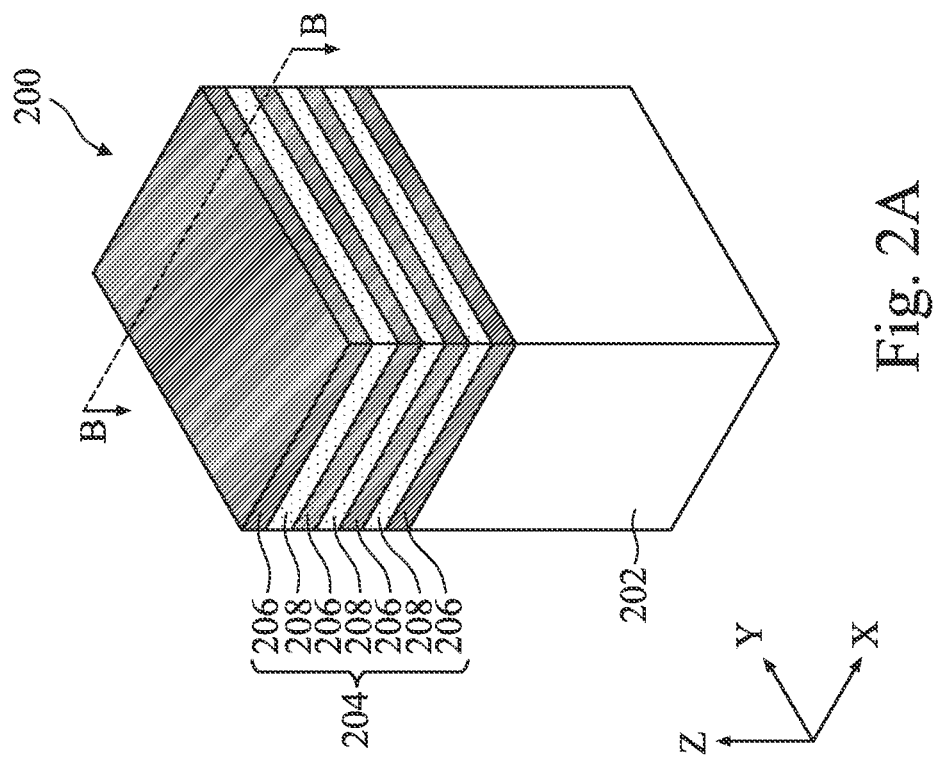

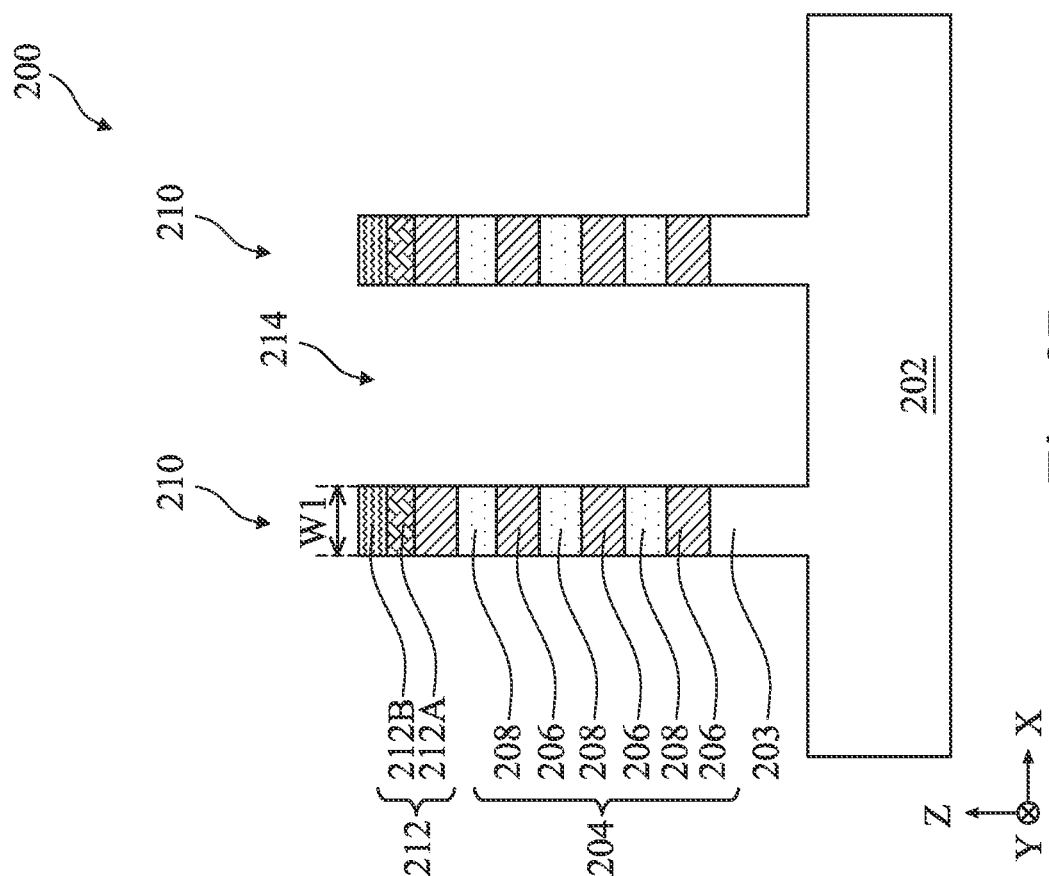
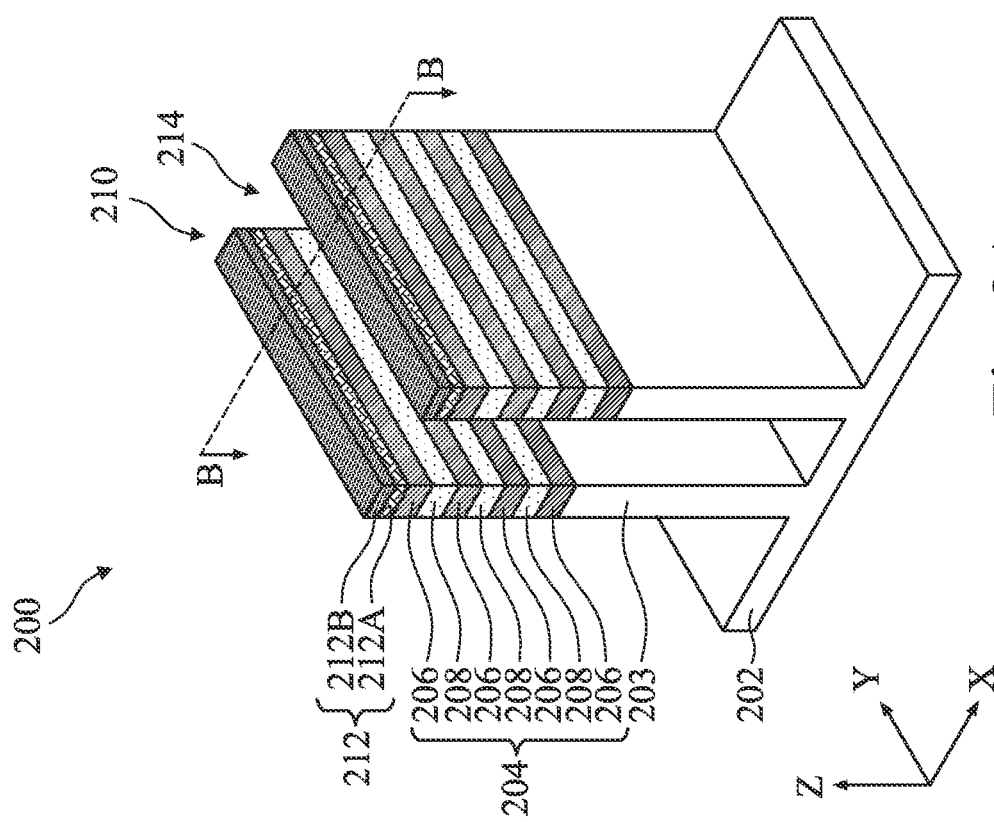
Fig. 3A
Fig. 3B

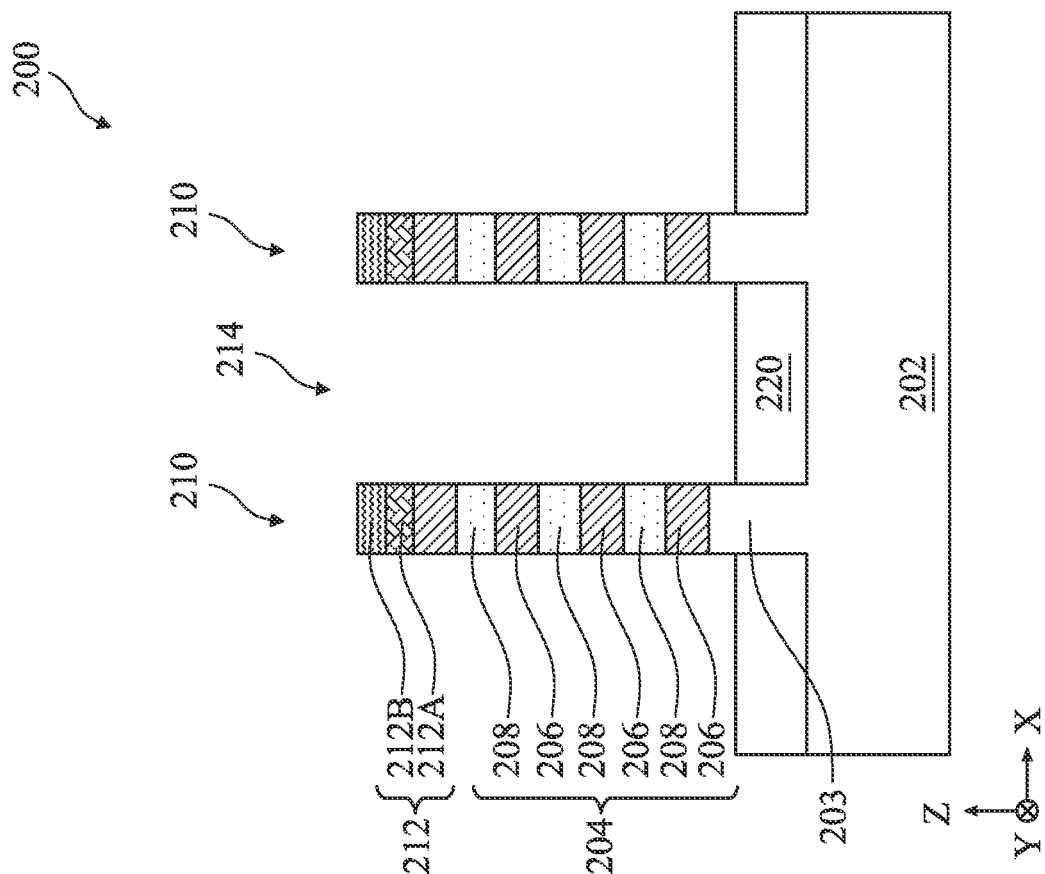
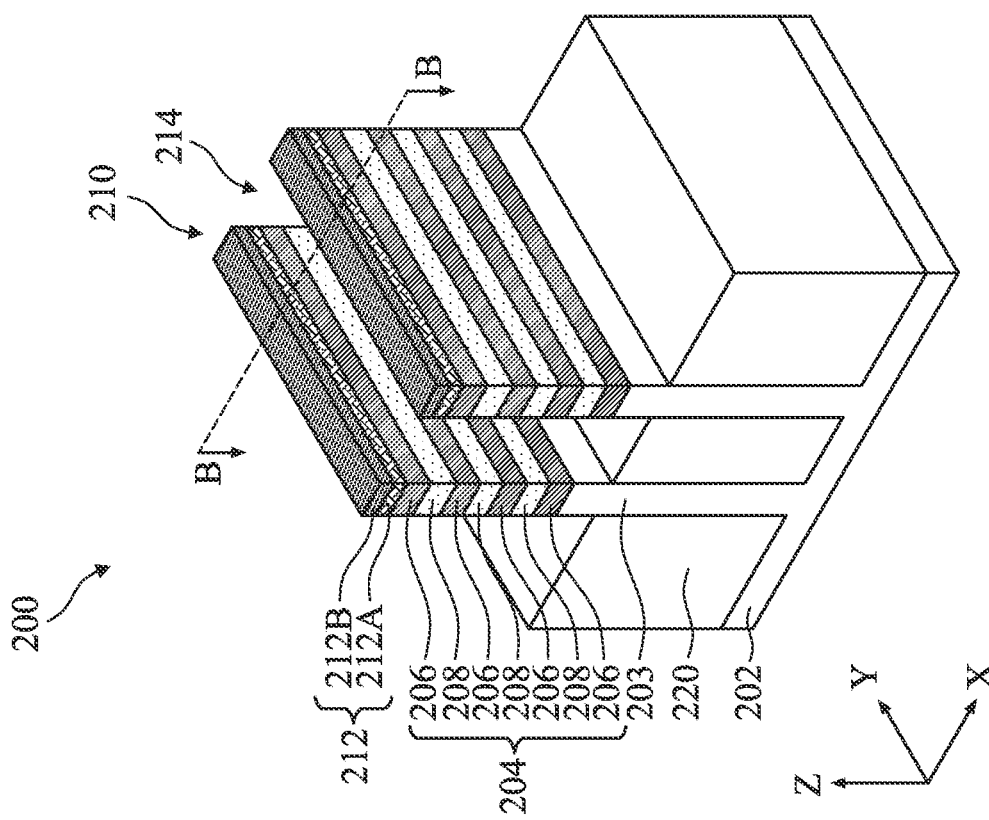
Fig. 4A
Fig. 4B

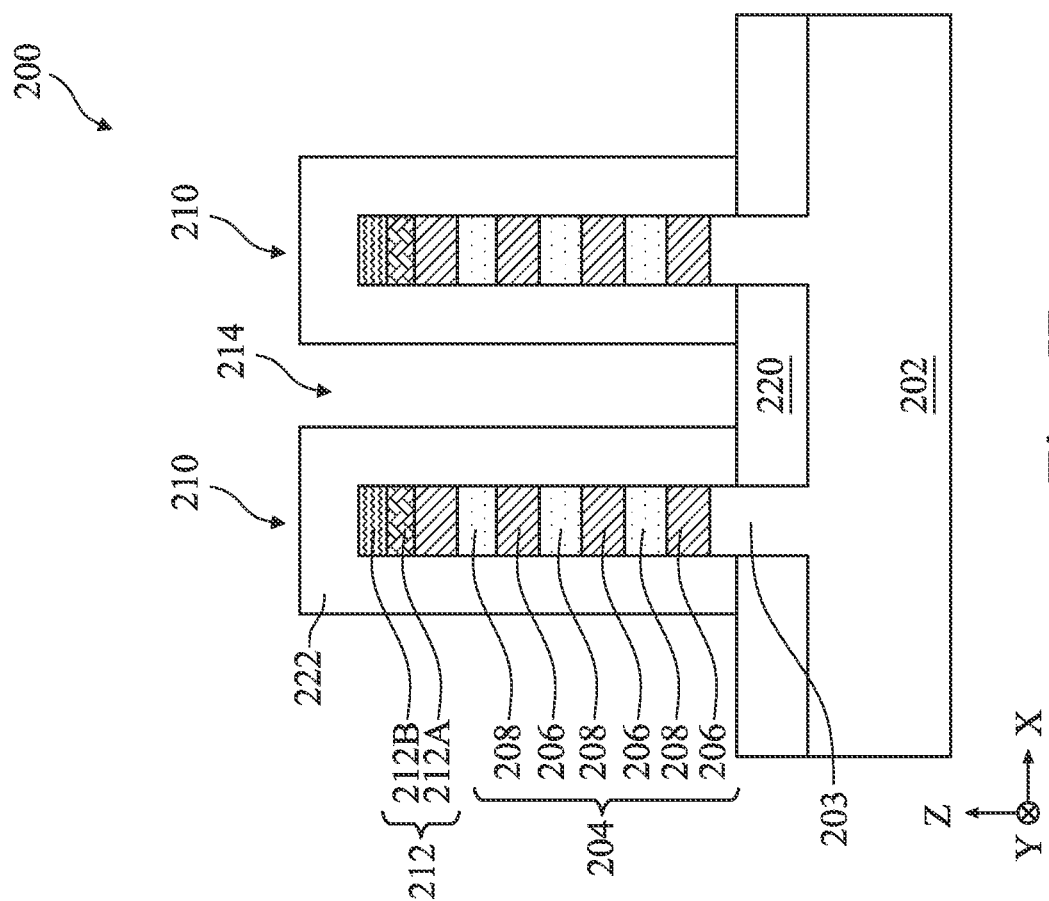
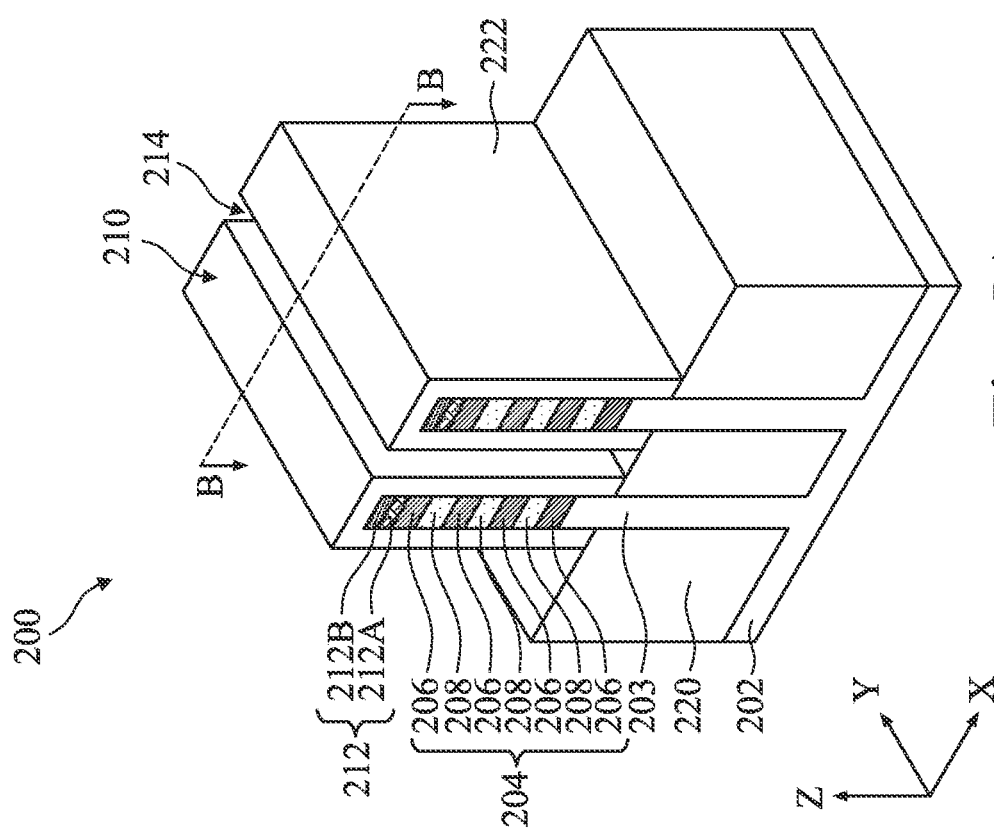
Fig. 5A
Fig. 5B

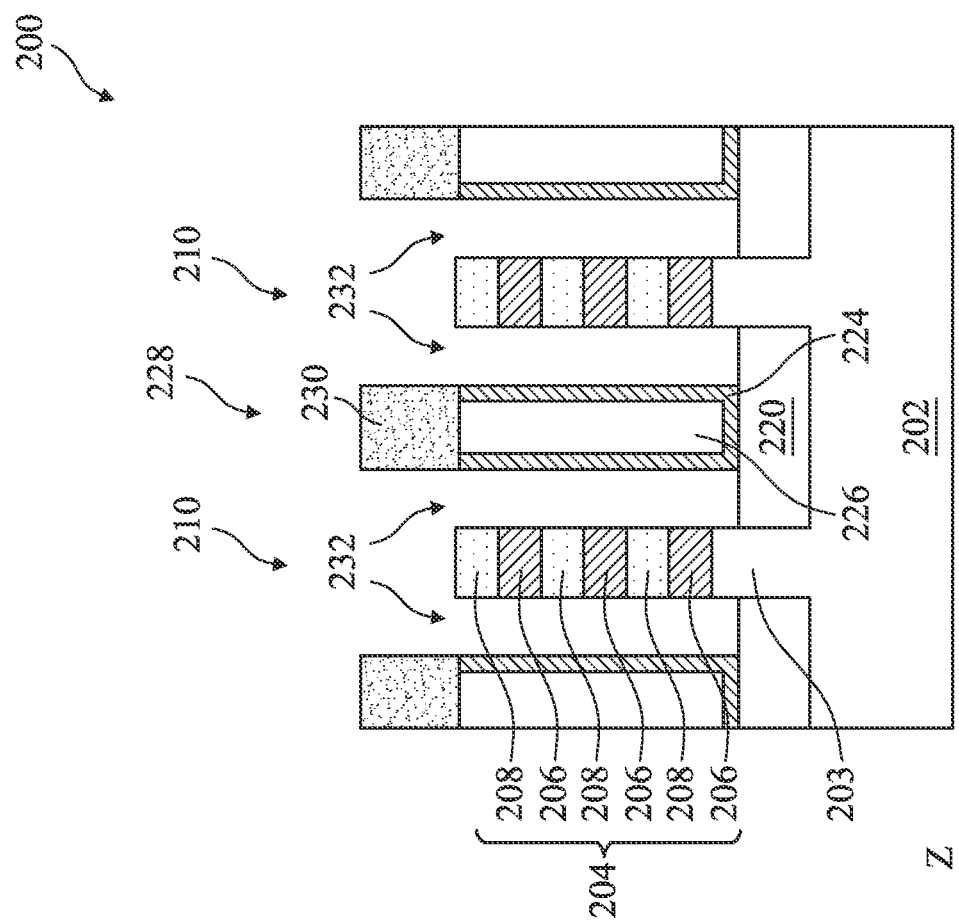
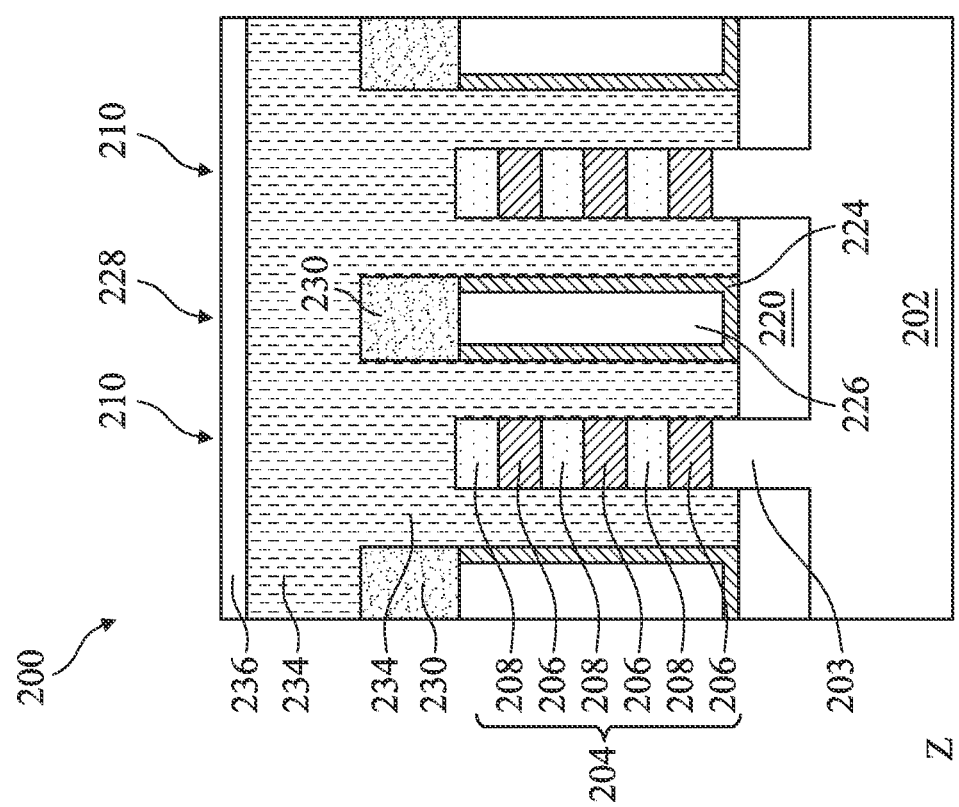
Fig. 9C
Fig. 9D

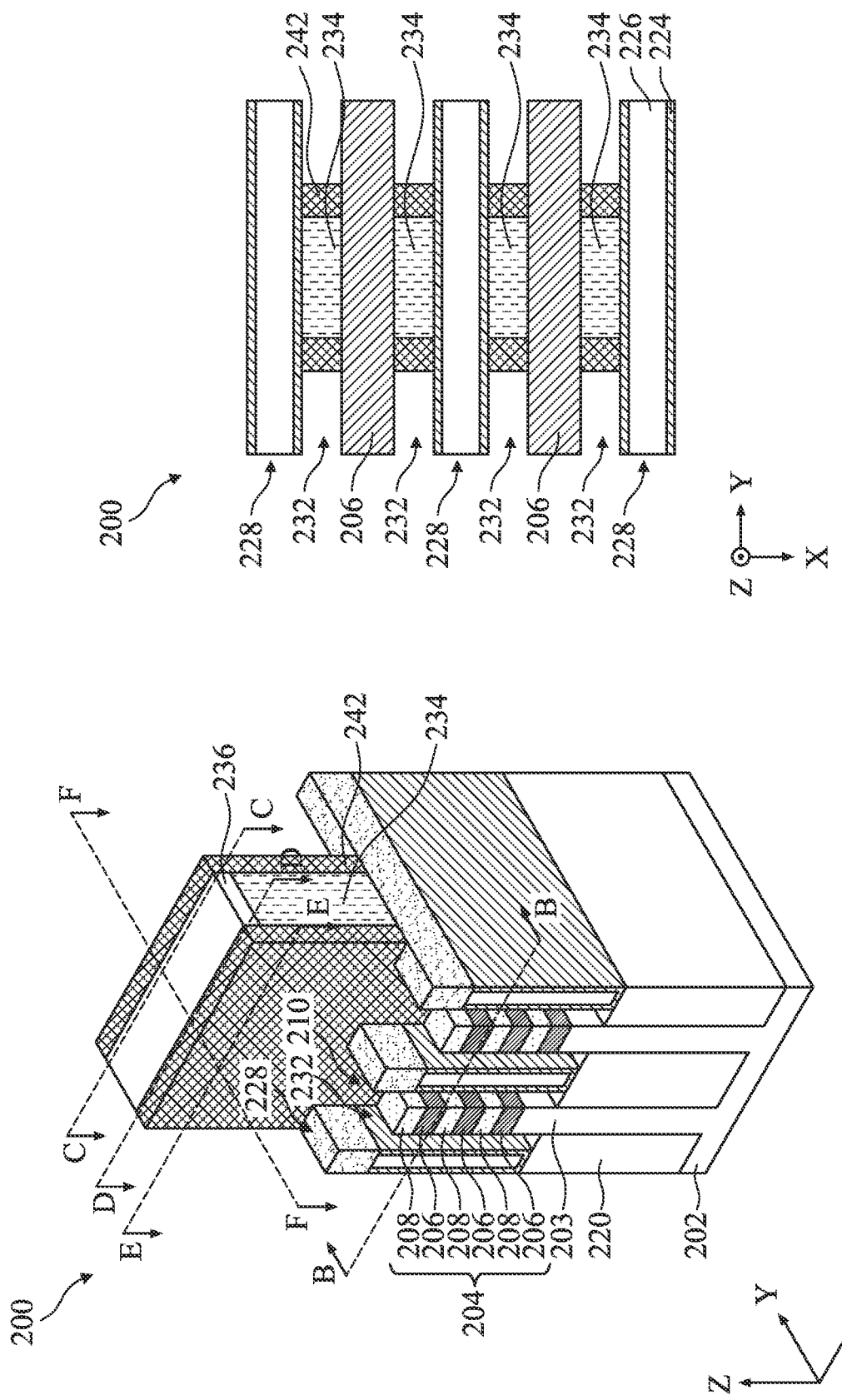

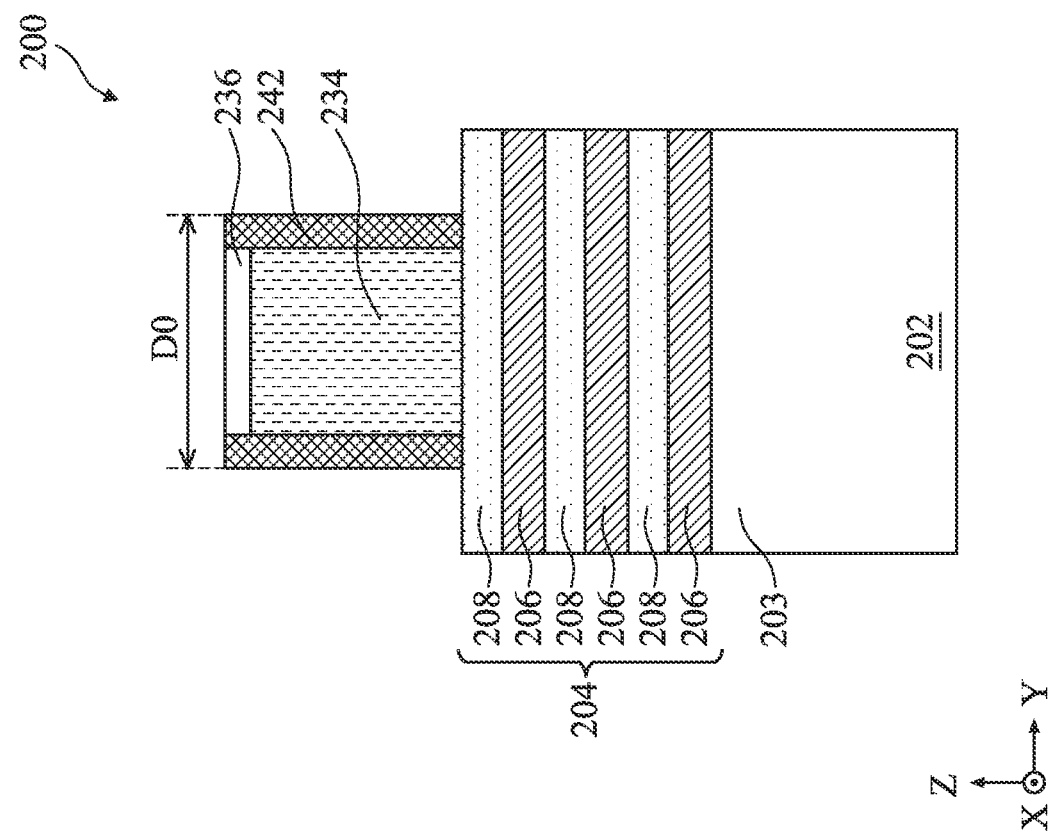
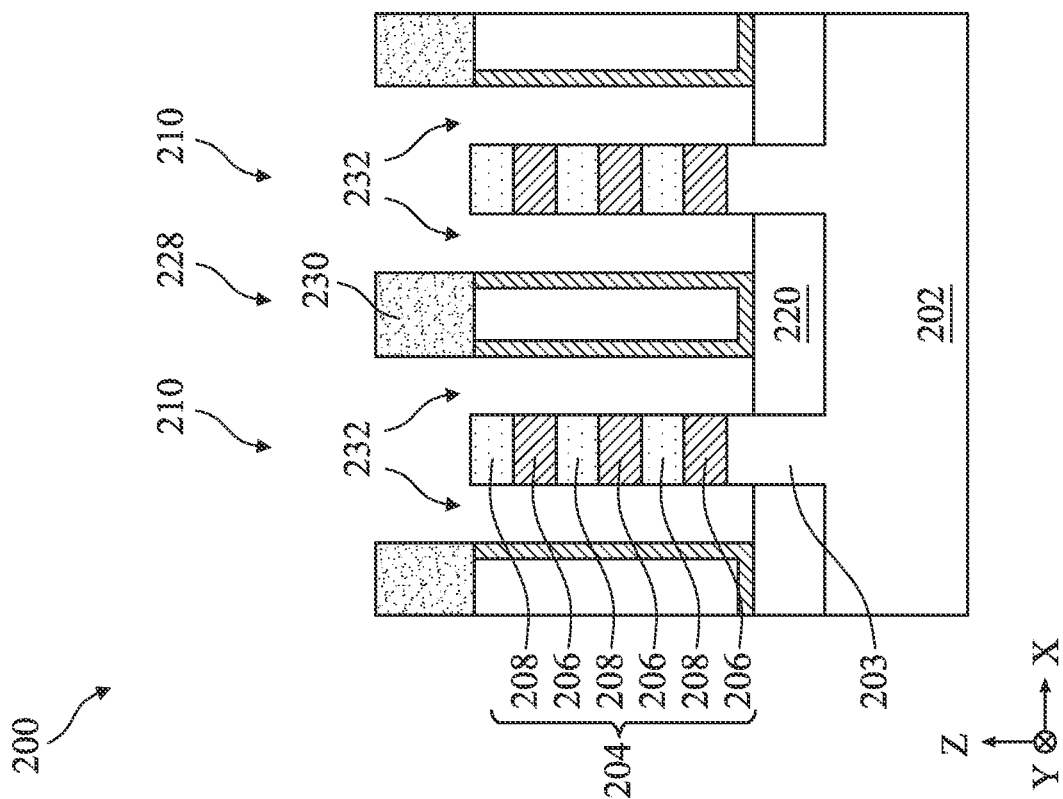
Fig. 10F
Fig. 10E

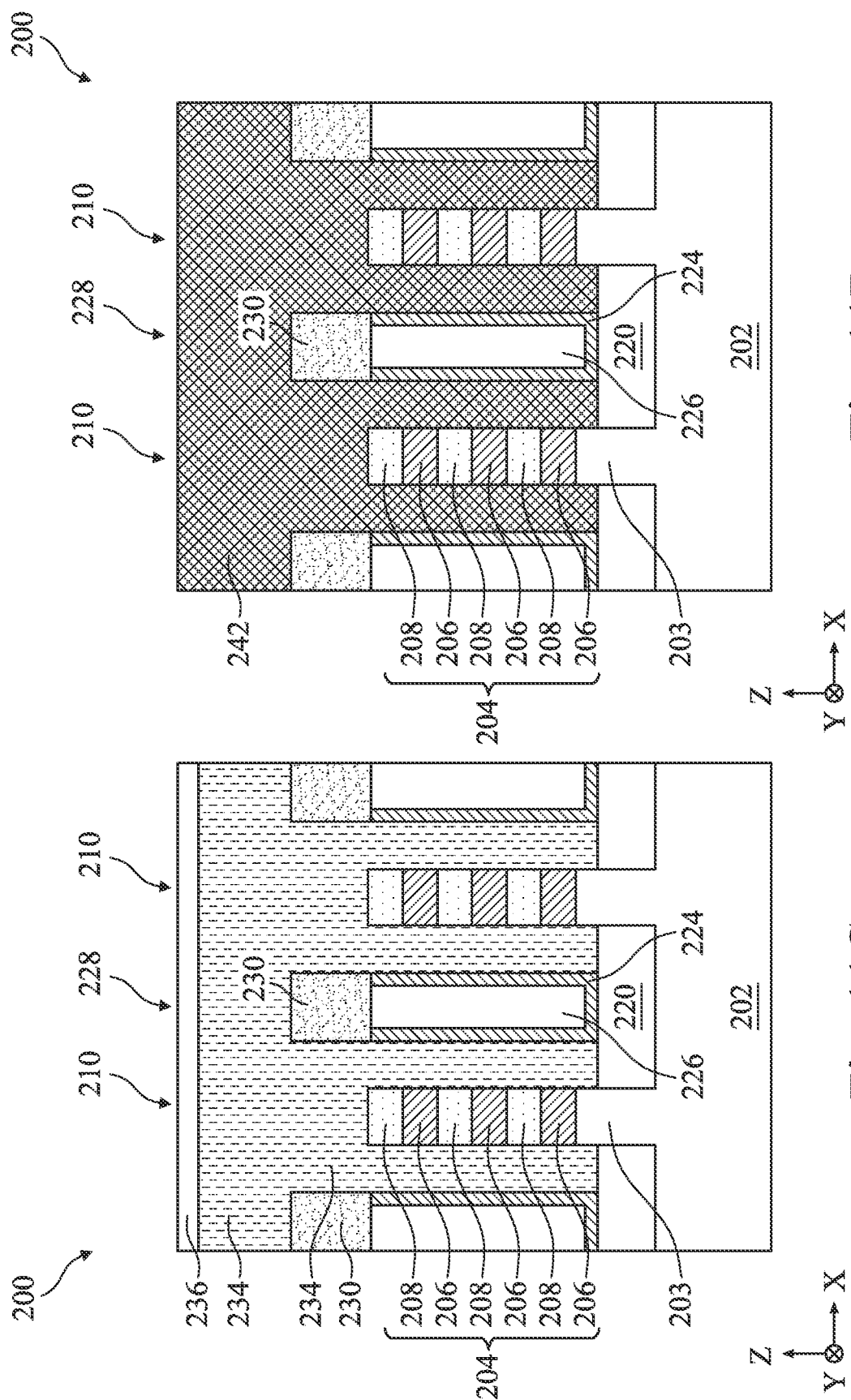

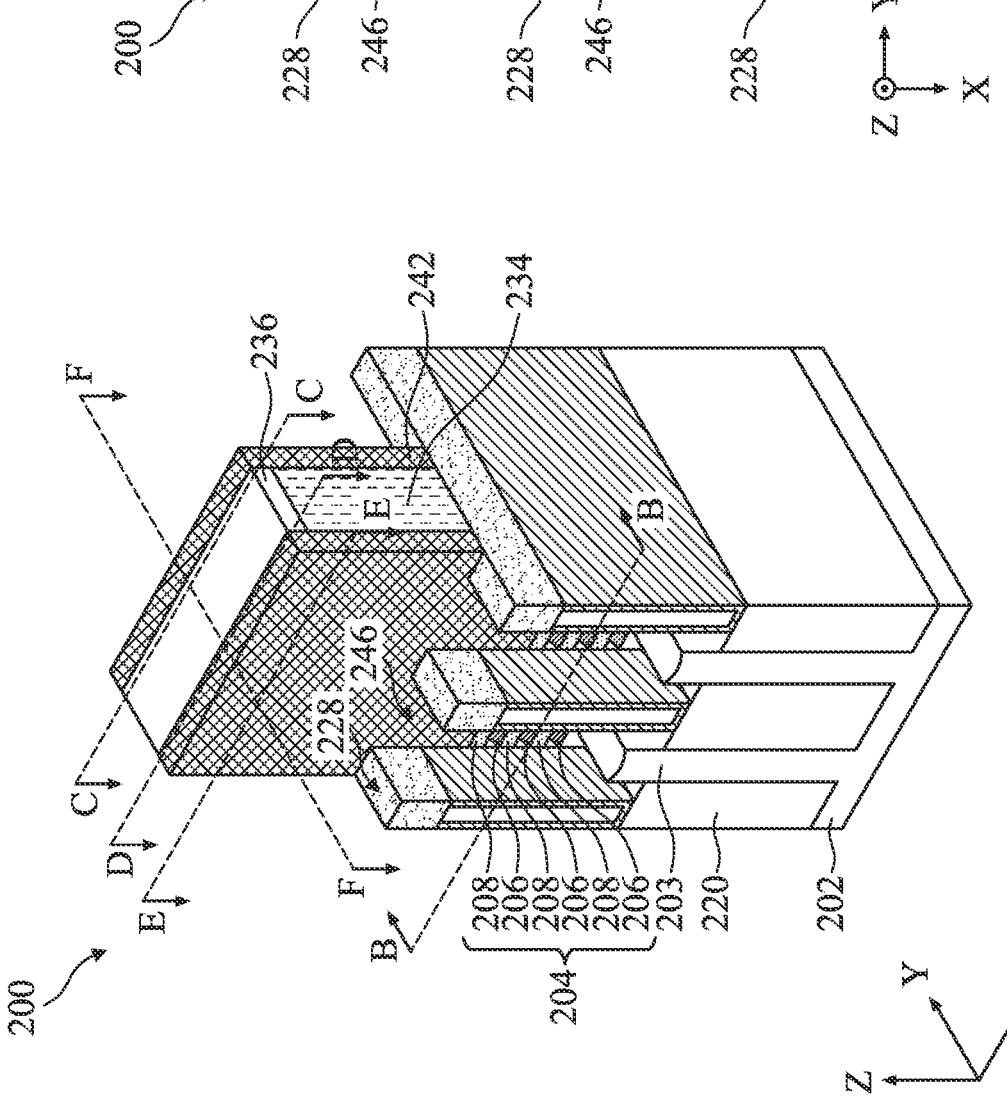
Fig. 12A
Fig. 12B

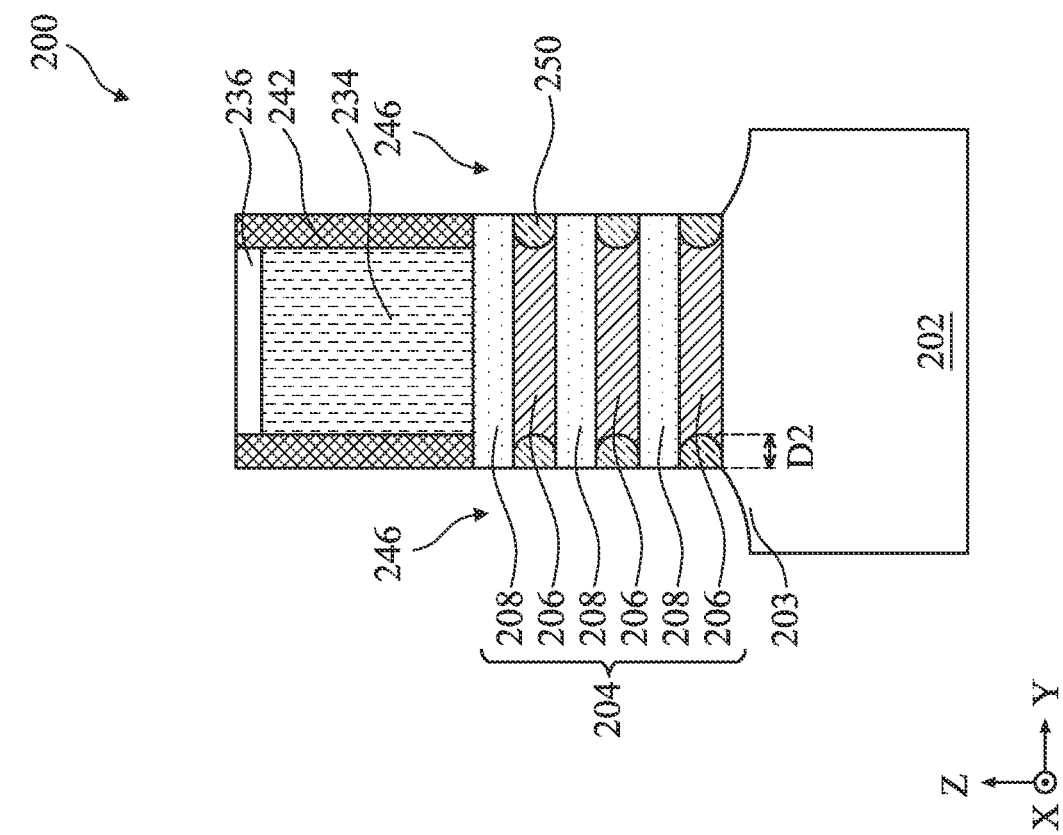
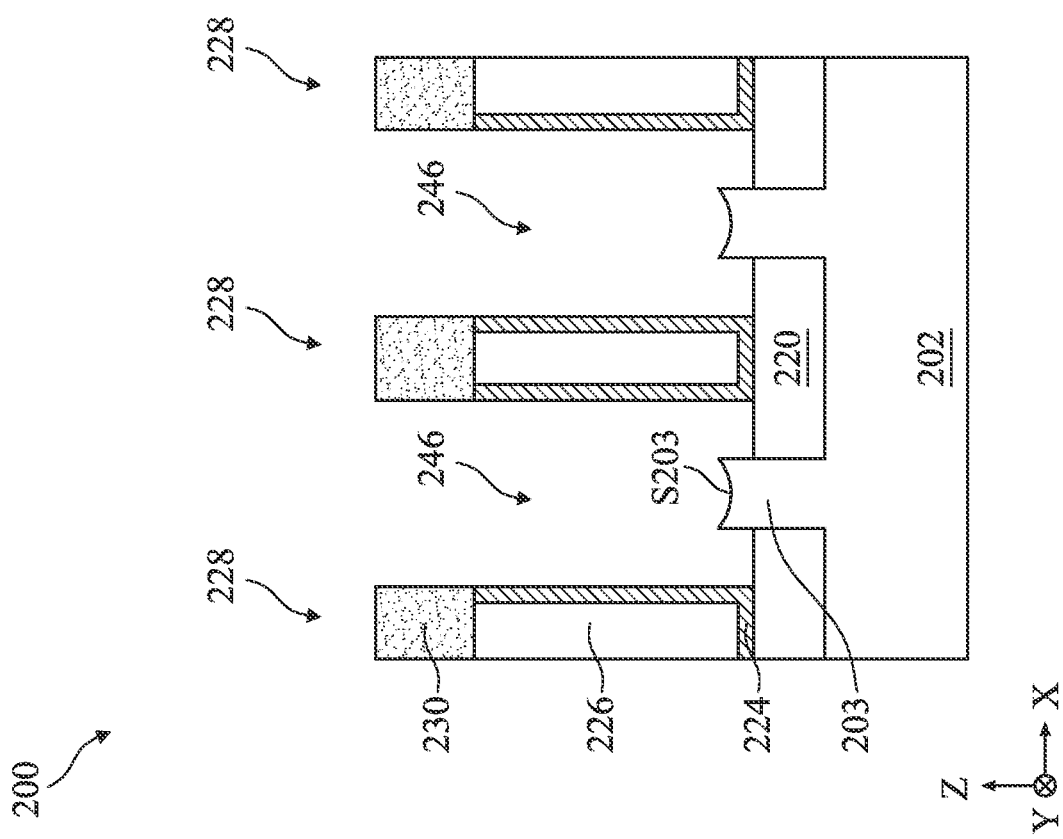
Fig. 13F
Fig. 13E

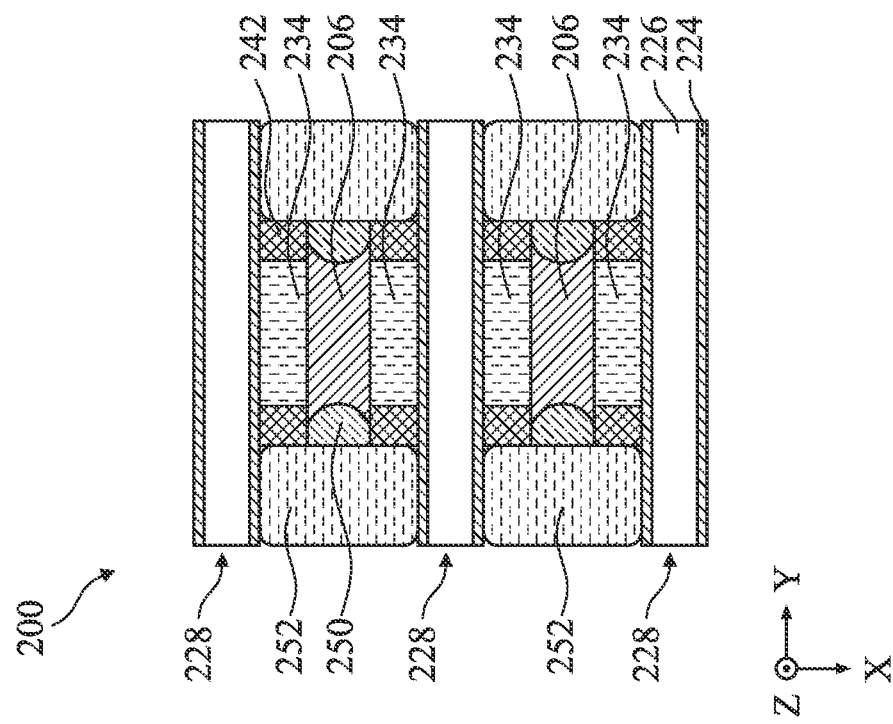
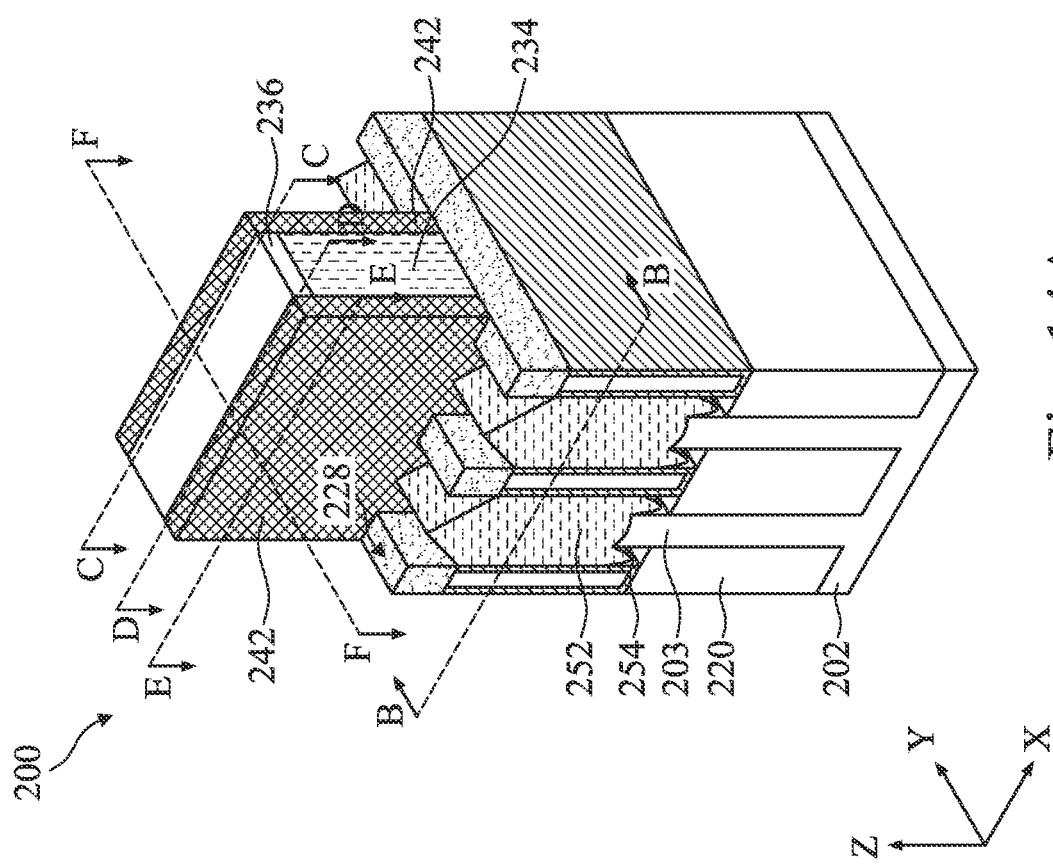
Fig. 14A
Fig. 14B

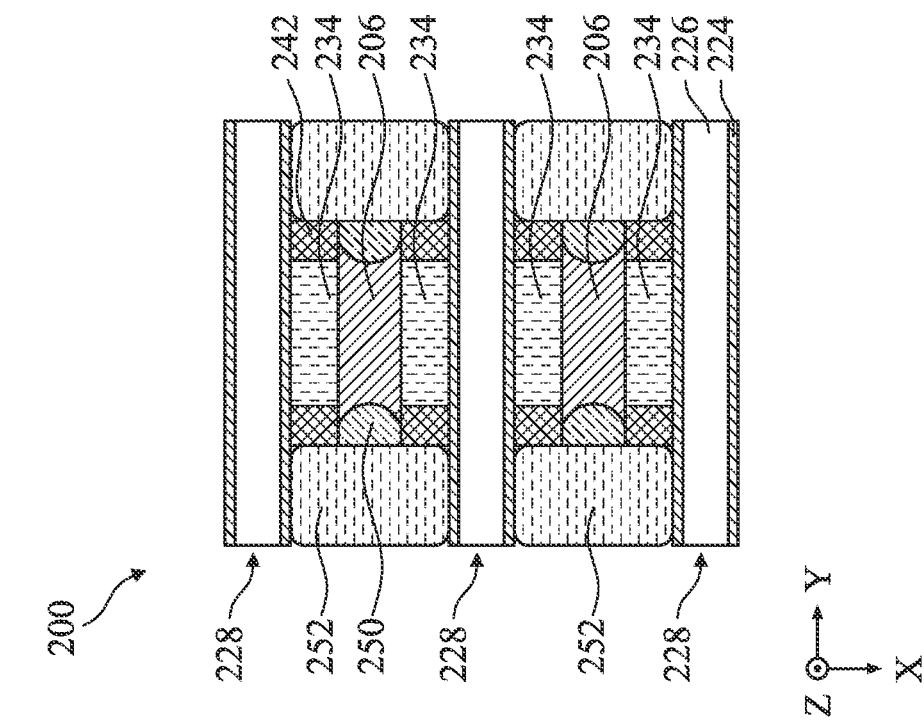
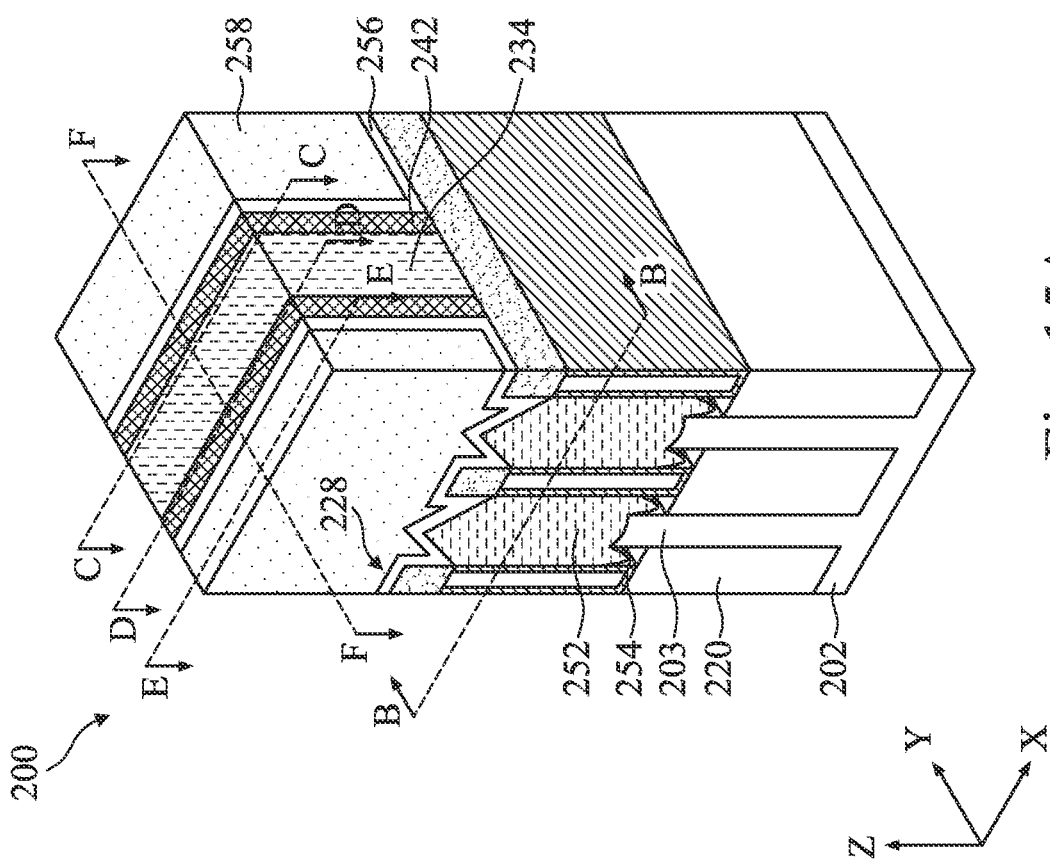
Fig. 15B
Fig. 15A

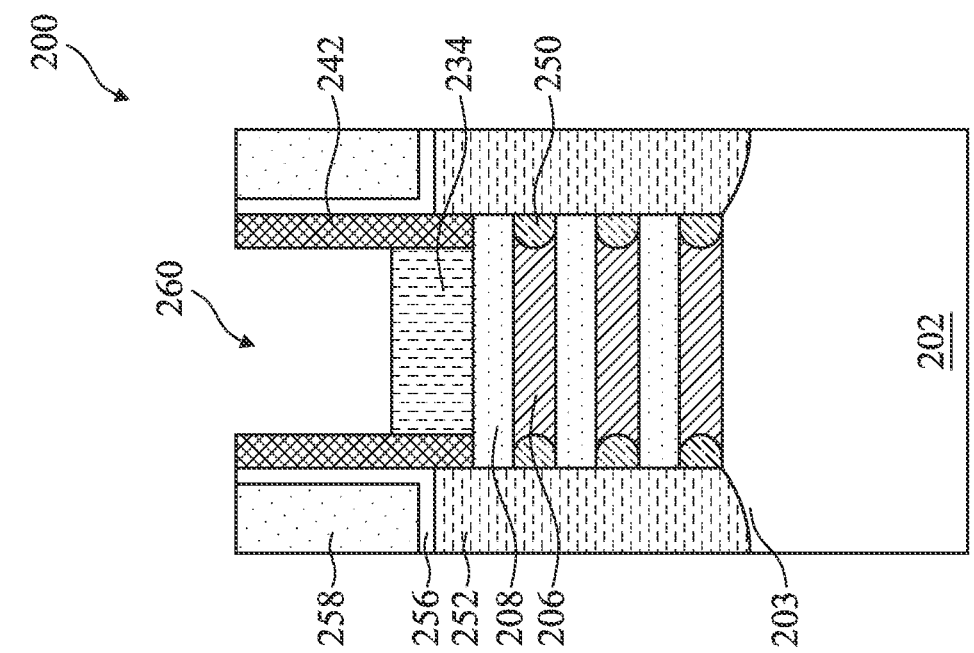
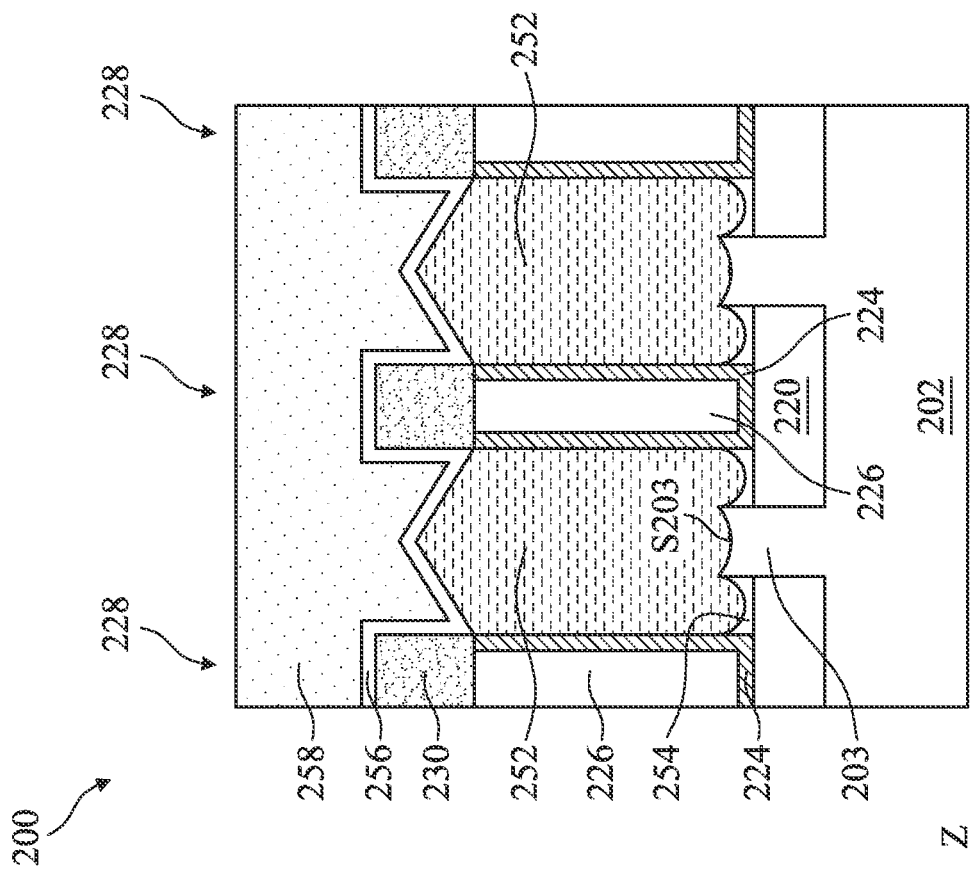
Fig. 16F
Fig. 16E

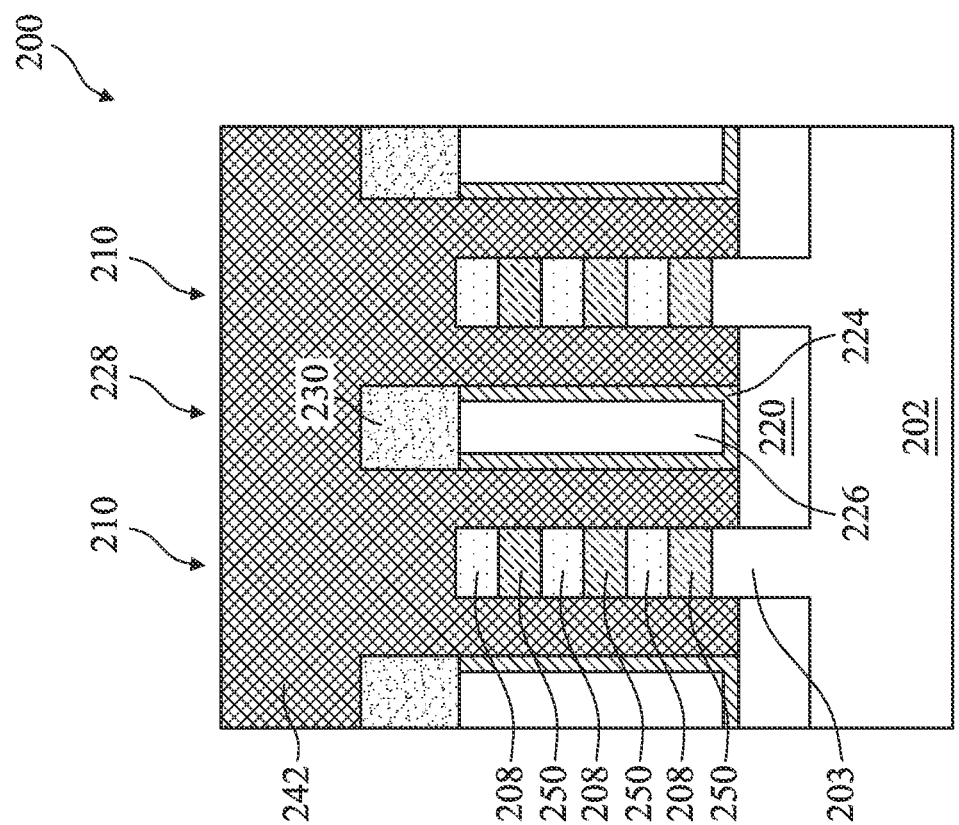
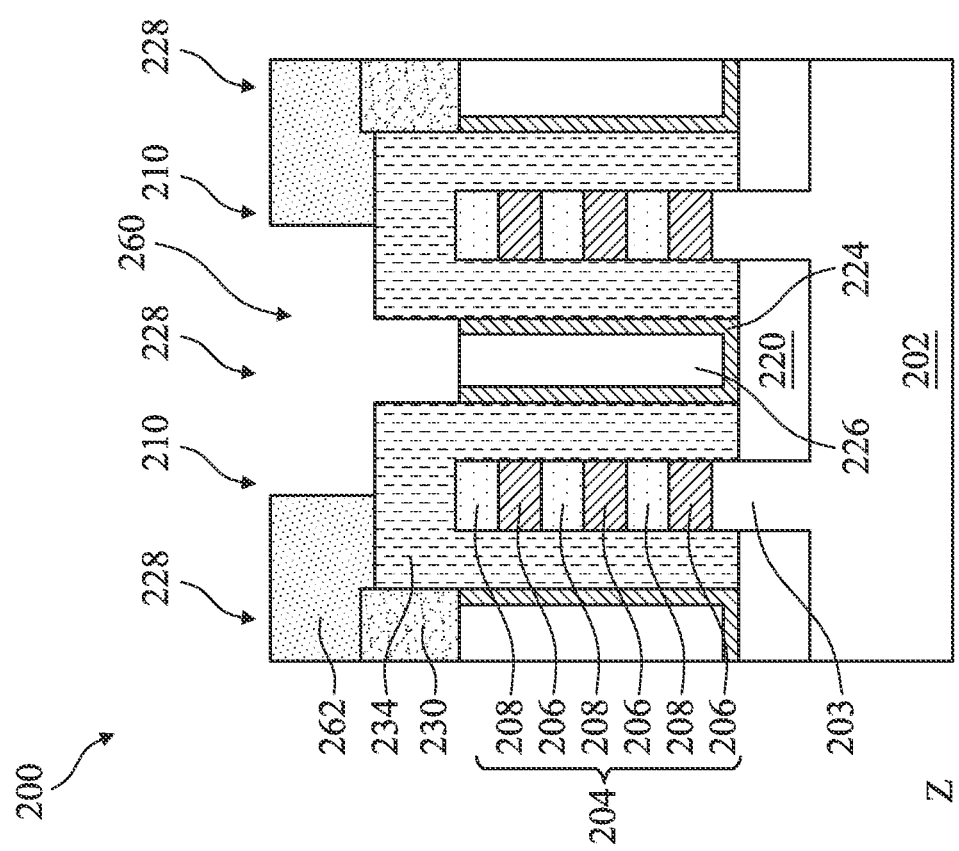
Fig. 17D
Fig. 17C

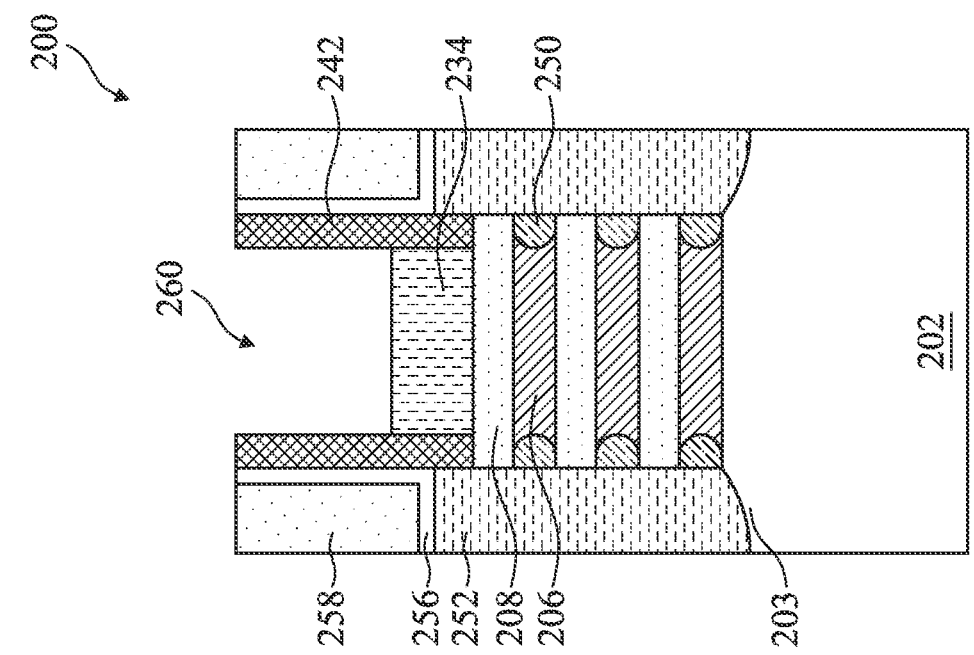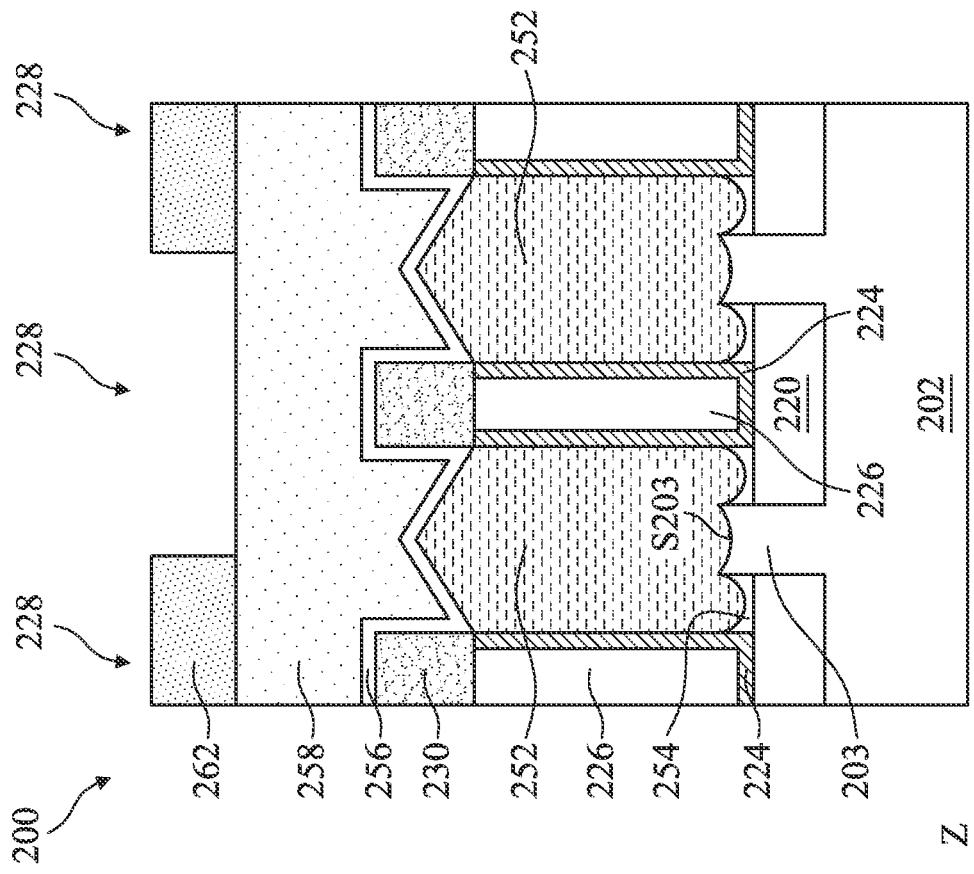

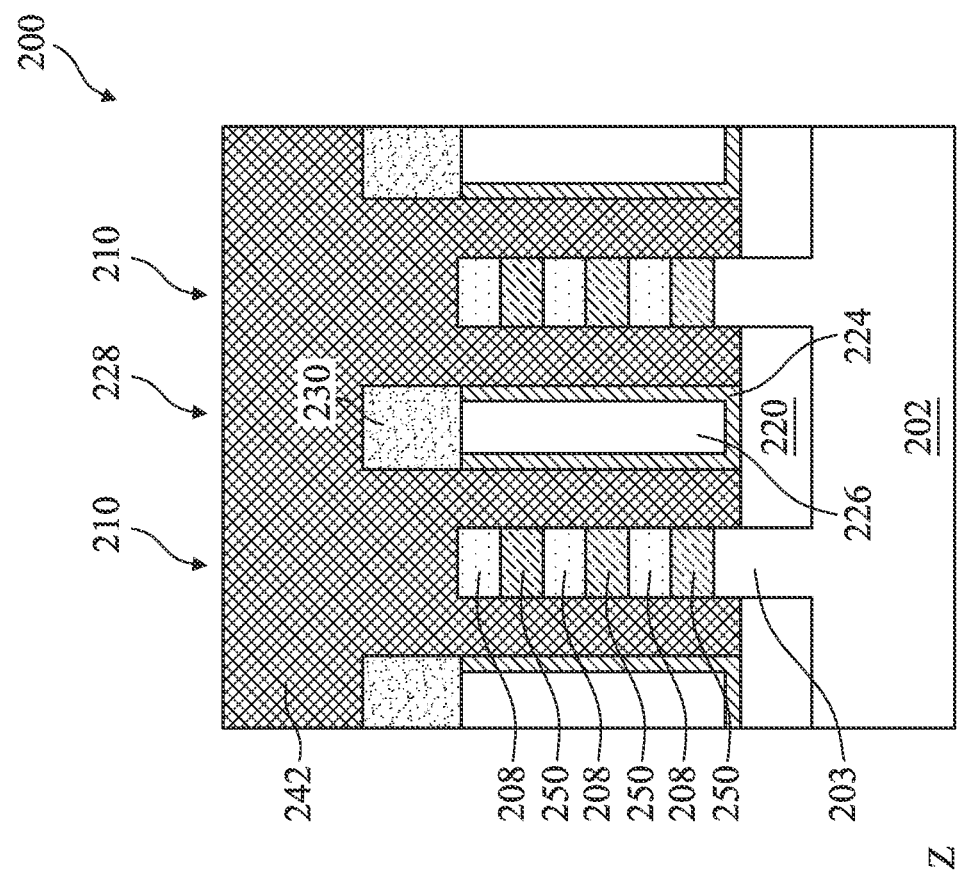
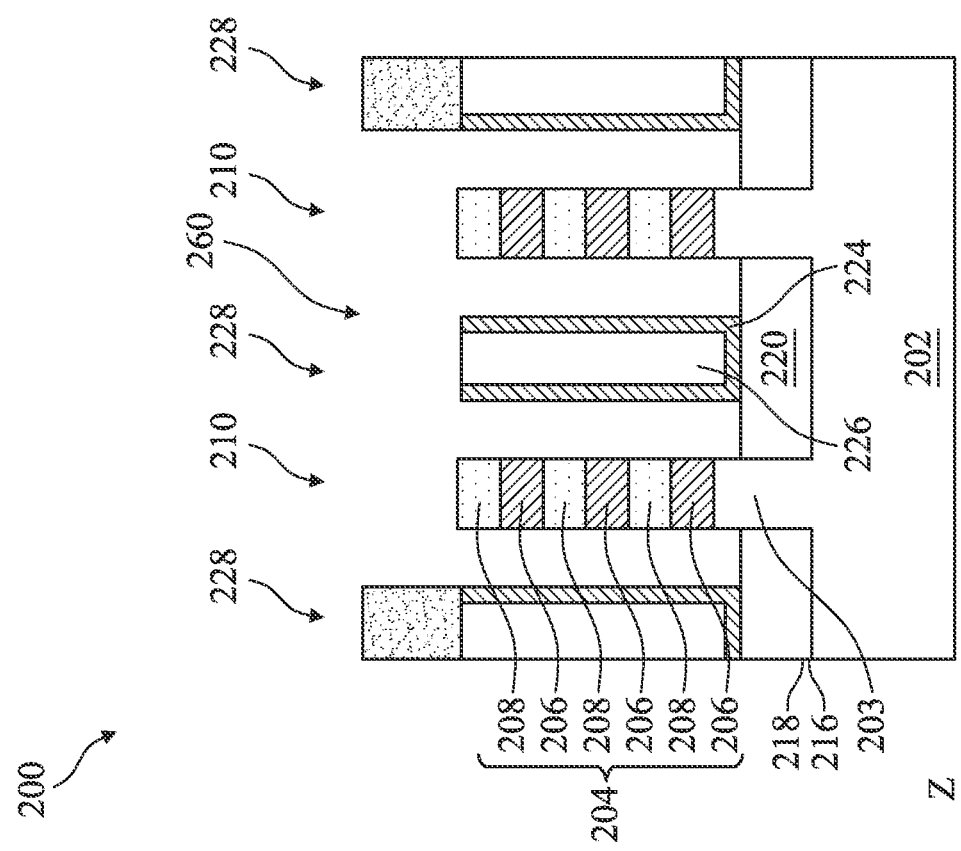
Fig. 18D
Fig. 18C

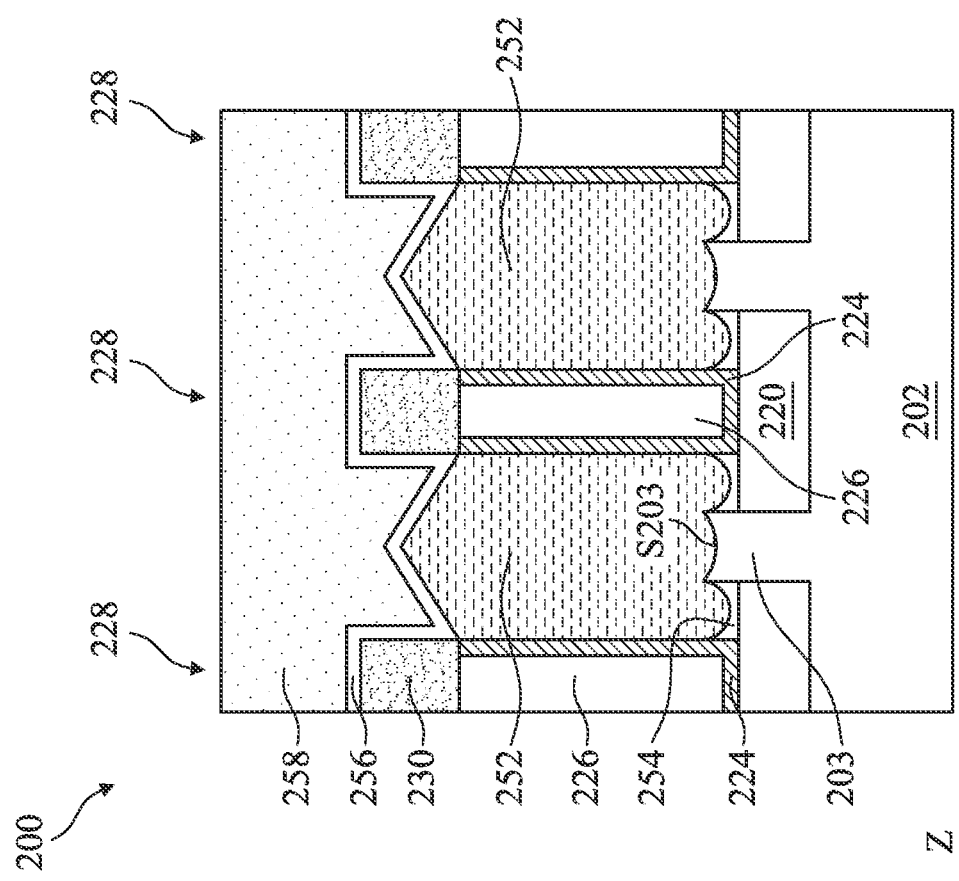
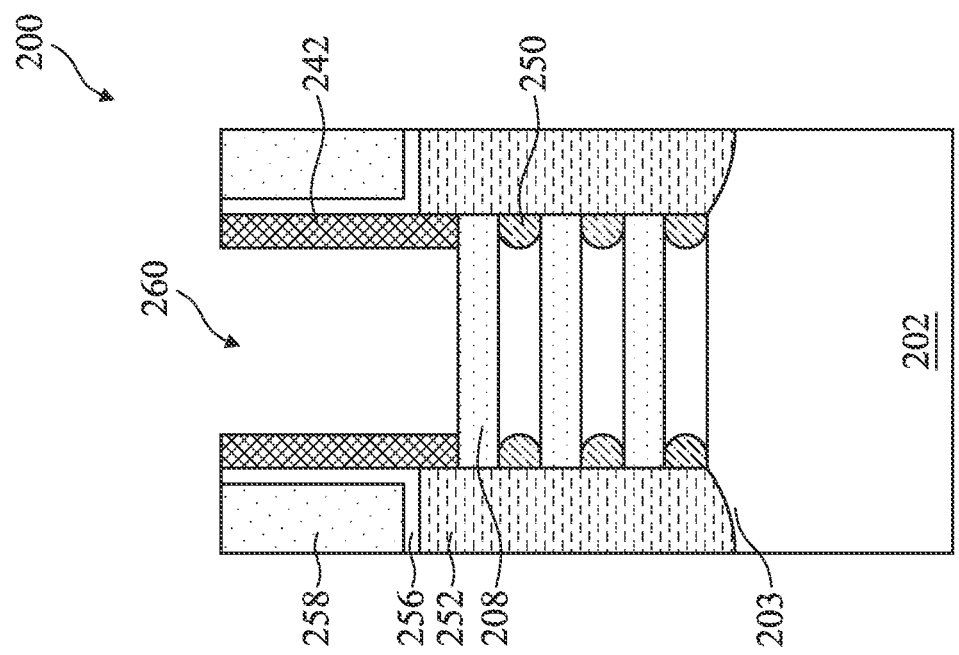
Fig. 19E
Fig. 19F

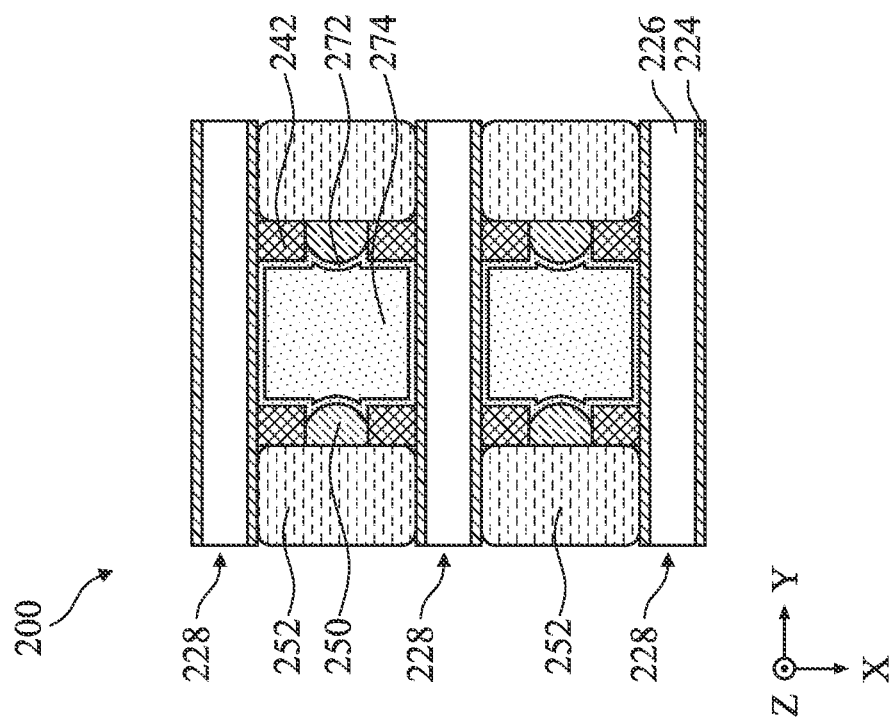
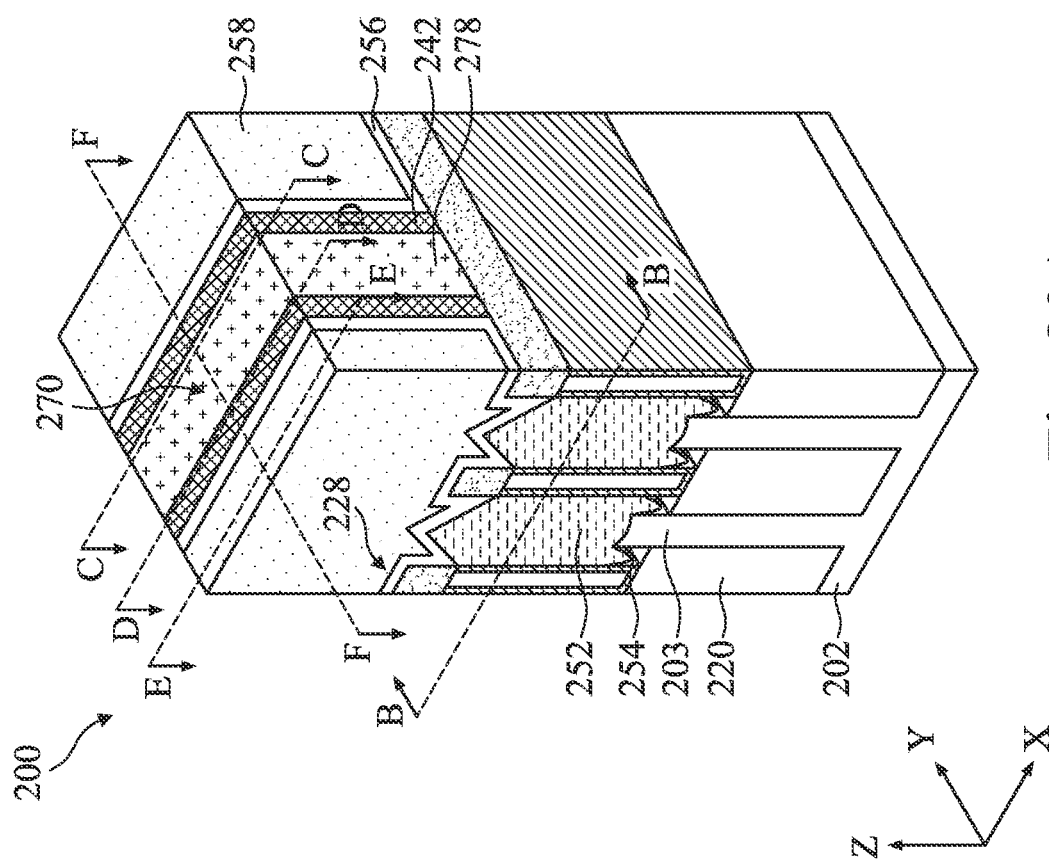
Fig. 20A
Fig. 20B

MULTI-GATE DEVICE INCLUDING SEMICONDUCTOR FIN BETWEEN DIELECTRIC FINS AND METHOD OF FABRICATION THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA devices get their name from the gate structure which can extend around the channel region providing access to the channel on four sides. GAA devices are compatible with conventional complementary metal-oxide-semiconductor (CMOS) processes and their structure allows them to be aggressively scaled while maintaining gate control and mitigating SCEs.

To continue to provide the desired scaling and increased density for multi-gate devices (e.g., FinFETs and GAA devices) in advanced technology nodes, dielectric fins have been introduced to improve the uniformity of fins (including semiconductor fins and dielectric fins) and define space for source/drain (S/D) features. Sacrificial cladding layers comprising semiconductor materials may also be introduced to fill between semiconductor fins and dielectric fins to reserve space for metal gate stacks in a replacement gate process. However, the existence of sacrificial cladding layers imposes etching depth limitations during forming S/D recesses, non-uniformity during inner spacer formation, and cleaning complexity during channel layer release. Therefore, while the current methods have been satisfactory in many respects, challenges with respect to performance of the resulting device may not be satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 3A, 4A, 5A, 6A, 7A, 8A, 9A, 10A, 11A, 12A, 13A, 14A, 15A, 16A, 17A, 18A, 19A, and 20A illustrate perspective views of a semiconductor structure during a fabrication process according to the method of FIGS. 1A and 1B, according to aspects of the present disclosure.

FIGS. 2B, 3B, 4B, 5B, 6B, 7B, 8B, 9B, 9C, 9D, 10B, 10C, 10D, 10E, 10F, 11B, 11C, 11D, 11E, 11F, 12B, 12C, 12D, 12E, 12F, 13B, 13C, 13D, 13E, 13F, 14B, 14C, 14D, 14E, 14F, 15B, 15C, 15D, 15E, 15F, 16B, 16C, 16D, 16E, 16F, 17B, 17C, 17D, 17E, 17F, 18B, 18C, 18D, 18E, 18F, 19B, 19C, 19D, 19E, 19F, 20B, 20C, 20D, 20E, and 20F illustrate cross-sectional views of a semiconductor structure during a fabrication process according to the method of FIGS. 1A and 1B, according to aspects of the present disclosure.

DETAILED DESCRIPTION

Figure 1A:
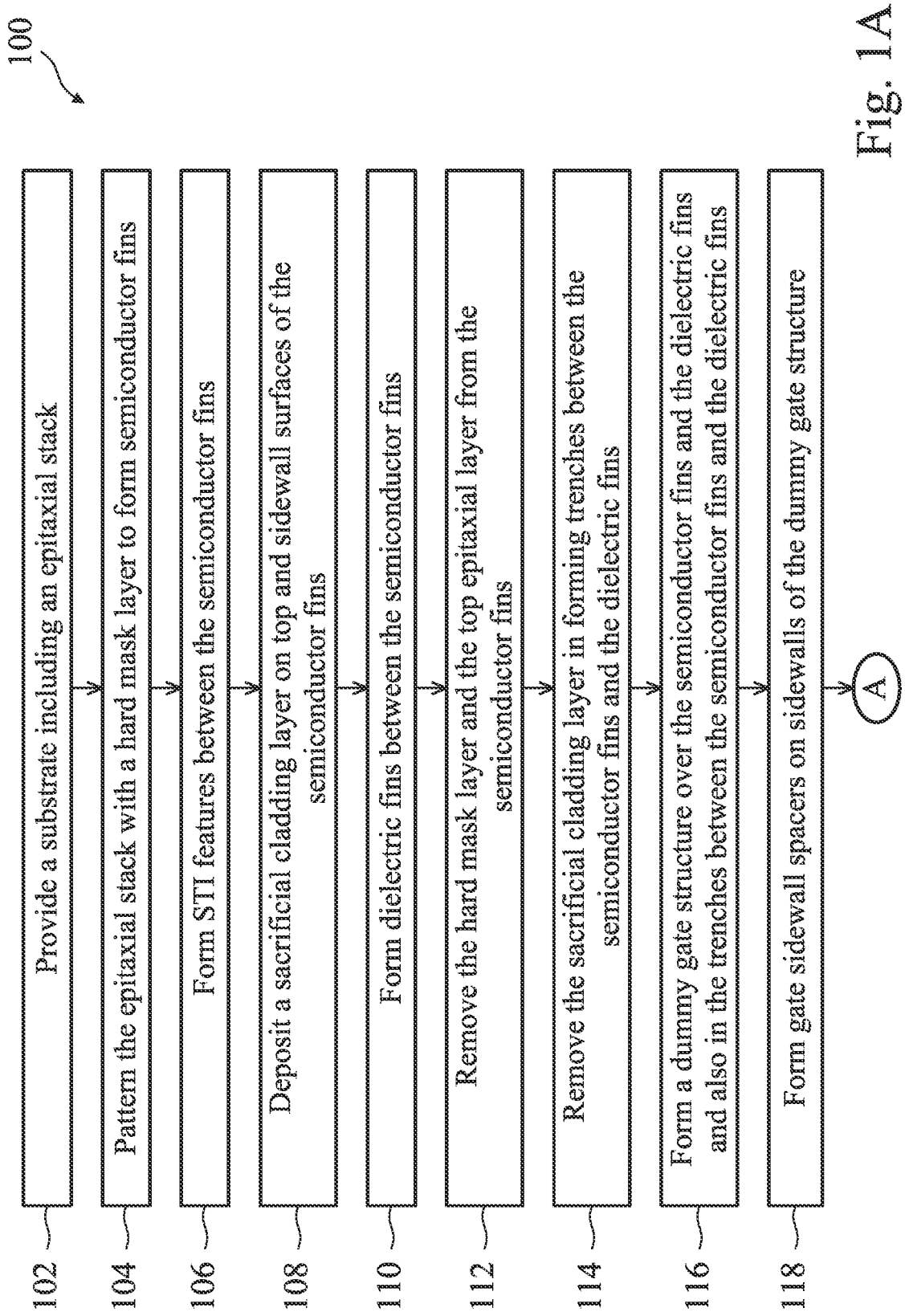
FIGS. 1A and 1B show a flow chart of a method for forming a multi-gate device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating multi-gate devices with dielectric fins and sacrificial cladding layers in advanced technology nodes. It is noted that multi-gate devices include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FinFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), bar-shaped channel(s), and/or other suitable channel configurations. Presented herein are embodiments of devices that may have one or more channel regions (e.g., nanowires/nanosheets) associated with a single, contiguous gate structure. However, one of ordinary skill would recognize that the teaching can apply to a single channel (e.g., single nanowire/nanosheet) or any number of channels. One of ordinary skill may recognize other examples of semiconductor devices that may benefit from aspects of the present disclosure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for providing dielectric fins for improving fin uniformity and defining space for source/drain (S/D) features, and a sacrificial cladding layer with amorphous or polycrystalline semiconductor material for reserving space for metal gate stacks. Embodiments discussed herein also includes removing the sacrificial cladding layer prior to the dummy gate structure formation. By removing the sacrificial cladding layers, S/D recesses may be formed above the isolation features to avoid forming a deep trench below the bottommost channel layer, which in turn reduces leakage current through the semiconductor substrate. Further, by removing the sacrificial cladding layer, it becomes easier to maintain inner spacer length uniformity, as there is no need to balance etching rates in lateral etching sacrificial epitaxial layers and sacrificial cladding layer for forming inner spacer cavities. Still further, by removing the sacrificial cladding layer, it becomes easier to clean the gate trench during the release of channel layers. Otherwise the different material compositions between sacrificial epitaxial layers and the sacrificial cladding layer increase the difficulty of channel layer release with one etchant and increase the risk of over etching the channel layers.

Figure 1B:
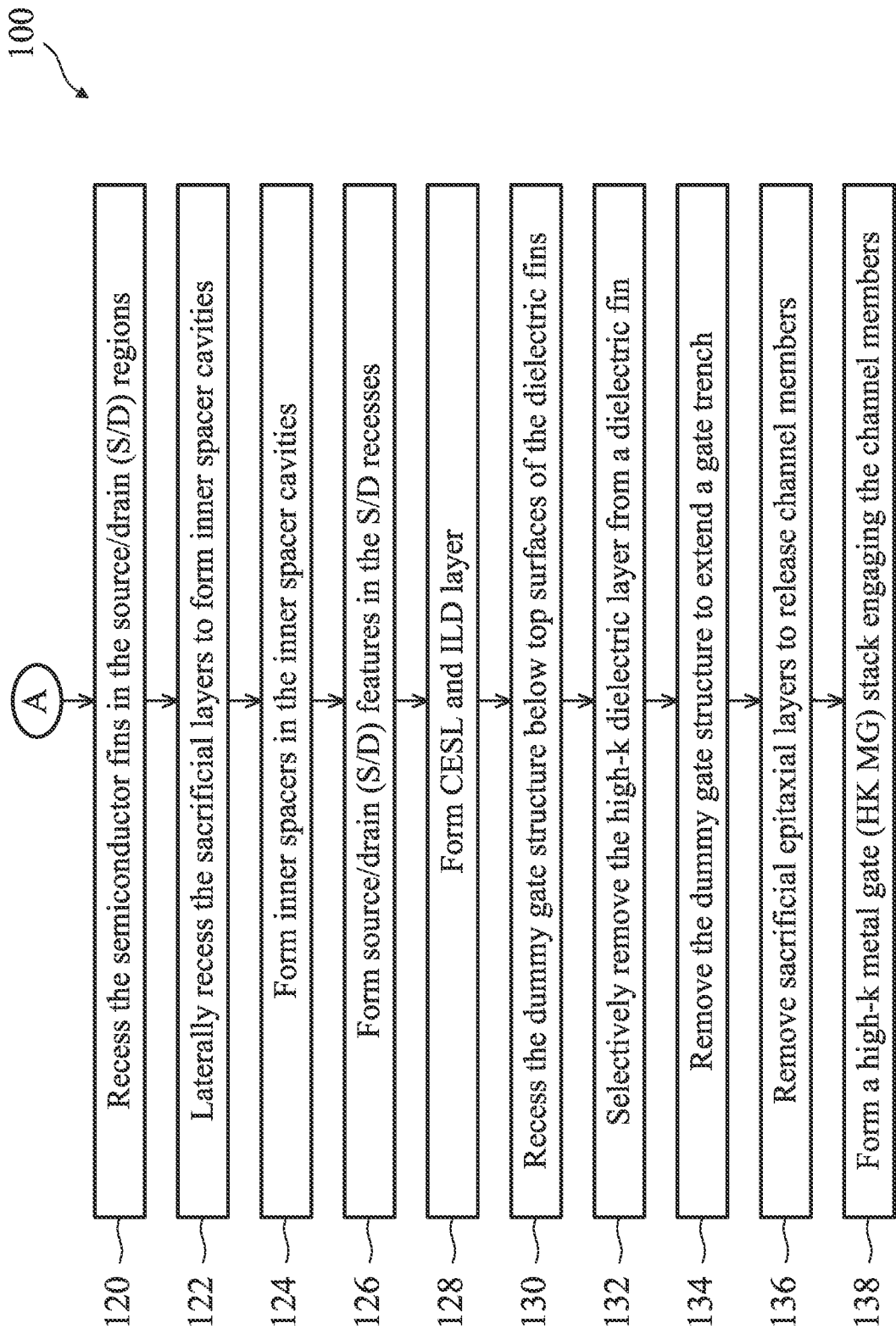

Illustrated in FIGS. 1A and 1B is a method 100 of semiconductor fabrication including fabrication of multi-gate devices. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2A-20F. FIGS. 2A, 3A, 4A, 5A, 6A, 7A, 8A, 9A, 10A, 11A, 12A, 13A, 14A, 15A, 16A, 17A, 18A, 19A, and 20A represent perspective views of an embodiment of a semiconductor device 200 according to various stages of the method 100 of FIGS. 1A and 1B. FIGS. 2B, 3B, 4B, 5B, 6B, 7B, and 8B are cross-sectional views taken in the X-Z plane along the B-B line in the corresponding figures numbered with suffix "A", which cut through a gate region and perpendicular to a lengthwise direction of a channel region of the to-be-formed multi-gate device. FIGS. 9B, 10B, 11B, 12B, 13B, 14B, 15B, 16B, 17B, 18B, 19B, and 20B are cross-sectional views taken in the X-Y plane along the B-B line in the corresponding figures numbered with suffix "A", which cut through one of the sacrificial epitaxial layers. FIGS. 9C, 10C, 11C, 12C, 13C, 14C, 15C, 16C, 17C, 18C, 19C, and 20C are cross-sectional views taken in the X-Z plane along the C-C line in the corresponding figures numbered with suffix "A", which cut through a gate region and perpendicular to a lengthwise direction of a channel region of the to-be-formed multi-gate device. FIGS. 9D, 10D, 11D, 12D, 13D, 14D, 15D, 16D, 17D, 18D, 19D, and 20D are cross-sectional views taken in the X-Z plane along the D-D line in the corresponding figures numbered with suffix "A", which cut through a gate sidewall spacer region and perpendicular to a lengthwise direction of a channel region of the to-be-formed multi-gate device. FIGS. 10E, 11E, 12E, 13E, 14E, 15E, 16E, 17E, 18E, 19E, and 20E are cross-sectional views taken in the X-Z plane along the E-E line in the corresponding figures numbered with suffix "A", which cut through a source/drain region and perpendicular to a lengthwise direction of a channel region of the to-be-formed multi-gate device. FIGS. 10F, 11F, 12F, 13F, 14F, 15F, 16F, 17F, 18F, 19F, and 20F are cross-sectional views taken in the Y-Z plane along the F-F line in the corresponding figures numbered with suffix "A", which cut through a channel region and adjacent source/drain regions of the to-be-formed multi-gate device.

As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including P-FETs, N-FETs, etc., which may be interconnected. Moreover, it is noted that the process steps of method 100, including any descriptions given with reference to FIGS. 2A-20F, as with the remainder of the method and exemplary figures provided in this disclosure, are merely exemplary and are not intended to be limiting beyond what is specifically recited in the claims that follow.

The method 100 at operation 102 (FIG. 1A) provides (or is provided with) a semiconductor device (or device) 200. Referring to FIGS. 2A and 2B, the device 200 includes a substrate 202 and an epitaxial stack 204 above the substrate 202. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n-wells, p-wells) may be formed on the substrate 202 in regions designed for different device types (e.g., n-type field effect transistors (N-FET), p-type field effect transistors (P-FET)). The suitable doping may include ion implantation of dopants and/or diffusion processes. The substrate 202 may have isolation features (e.g., shallow trench isolation (STI) features) interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or may have other suitable enhancement features.

The epitaxial stack 204 includes epitaxial layers 206 of a first composition interposed by epitaxial layers 208 of a second composition. The first and second compositions can be different. The epitaxial layers 208 may include the same composition as the substrate 202. In the illustrated embodiment, the epitaxial layers 206 are silicon germanium (SiGe) and the epitaxial layers 208 are silicon (Si). However, other embodiments are possible including those that provide for a first composition and a second composition having different oxidation rates and/or etch selectivity. For example, in some embodiments, either of the epitaxial layers 206, 208 of the first composition or the second composition may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In some embodiments, the epitaxial layers 206 and 208 are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process. By way of example, epitaxial growth of the epitaxial layers 206, 208 of the first composition or the second composition may be performed by a molecular beam epitaxy (MBE) process, a metalorganic chemical vapor deposition (MOCVD) process, and/or other suitable epitaxial growth processes. In various embodiments, the substrate 202 is a crystalline substrate, and the epitaxial layers 206, 208 are crystalline semiconductor layers.

In some embodiments, each epitaxial layer 206 has a thickness ranging from about 4 nanometers (nm) to about 8 nm. The epitaxial layers 206 may be substantially uniform in thickness. Yet the top epitaxial layer 206 may be thinner (e.g., half the thickness) than other epitaxial layers 206 thereunder in some embodiments. The top epitaxial layer 206 functions as a capping layer providing protections to other epitaxial layers in subsequent processes. In some embodiments, each epitaxial layer 208 has a thickness ranging from about 4 nm to about 8 nm. In some embodiments, the epitaxial layers 208 of the stack are substantially uniform in thickness. As described in more detail below, the epitaxial layers 208 or portions thereof may form channel member(s) of the subsequently-formed multi-gate device 200 and the thickness is chosen based on device performance considerations. The term channel member(s) (or channel layer(s)) is used herein to designate any material portion for channel(s) in a transistor with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The epitaxial layers 206 in channel regions(s) may eventually be removed and serve to define a vertical distance between adjacent channel members for a subsequently-formed multi-gate device and the thickness is chosen based on device performance considerations. Accordingly, the epitaxial layers 206 may also be referred to as sacrificial layers, and epitaxial layers 208 may also be referred to as channel layers.

It is noted that four (4) layers of the epitaxial layers 206 and three (3) layers of the epitaxial layers 208 are alternately arranged as illustrated in FIGS. 2A and 2B, which is for illustrative purposes only and not intended to be limiting beyond what is specifically recited in the claims. It can be appreciated that any number of epitaxial layers can be formed in the epitaxial stack 204; the number of layers depending on the desired number of channels members for the device 200. In some embodiments, the number of epitaxial layers 208 is between 2 and 10. It is also noted that while the epitaxial layers 206, 208 are shown as having a particular stacking sequence, where an epitaxial layer 206 is the topmost layer of the epitaxial stack 204, other configurations are possible. For example, in some cases, an epitaxial layer 208 may alternatively be the topmost layer of the epitaxial stack 204. Stated another way, the order of growth for the epitaxial layers 206, 208, and thus their stacking sequence, may be switched or otherwise be different than what is shown in the figures, while remaining within the scope of the present disclosure.

The method 100 then proceeds to operation 104 (FIG. 1A) where semiconductor fins (also referred to as device fins or fin elements) are formed by patterning. With reference to the example of FIGS. 3A and 3B, in an embodiment of operation 104, a plurality of semiconductor fins 210 extending from the substrate 202 are formed. In various embodiments, each of the semiconductor fins 210 includes a base portion 203 (also referred to as mesa) formed from the substrate 202 and an epitaxial stack portion 204 formed from portions of each of the epitaxial layers of the epitaxial stack including epitaxial layers 206 and 208. The semiconductor fins 210 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fins 210 by etching initial epitaxial stack 204. The etching process can include dry etching, wet etching, reactive ion etching (RIE), and/or other suitable processes.

In the illustrated embodiment, a hard mask (HM) layer 212 is formed over the epitaxial stack 204 prior to patterning the semiconductor fins 210. In some embodiments, the HM layer 212 includes an oxide layer 212A (e.g., a pad oxide layer that may include silicon oxide) and a nitride layer 212B (e.g., a pad nitride layer that may include silicon nitride) formed over the oxide layer 212A. The oxide layer 212A may act as an adhesion layer between the epitaxial stack 204 and the nitride layer 212B and may act as an etch stop layer for etching the nitride layer 212B. In some examples, the HM layer 212 includes thermally grown oxide, chemical vapor deposition (CVD)-deposited oxide, and/or atomic layer deposition (ALD)-deposited oxide. In some embodiments, the HM layer 212 includes a nitride layer deposited by CVD and/or other suitable technique.

The semiconductor fins 210 may subsequently be fabricated using suitable processes including photolithography and etch processes. The photolithography process may include forming a photoresist layer (not shown) over the HM layer 212, exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers formed thereupon, while an etch process forms trenches 214 in unprotected regions through the HM layer 212, through the epitaxial stack 204, and into the substrate 202, thereby leaving the plurality of extending semiconductor fins 210. The trenches 214 may be etched using dry etching, wet etching, RIE, and/or other suitable processes. In some examples, a width W1 of the semiconductor fin 210 ranges from about 20 nm to about 30 nm.

Numerous other embodiments of methods to form the semiconductor fins on the substrate may also be used including, for example, defining the fin region (e.g., by mask or isolation regions) and epitaxially growing the epitaxial stack 204 in the form of the semiconductor fins 210. In some embodiments, forming the semiconductor fins 210 may include a trim process to decrease the width of the semiconductor fins 210. The trim process may include wet and/or dry etching processes.

At operation 106, the method 100 (FIG. 1A) forms isolation features, such as shallow trench isolation (STI) features, between the semiconductor fins 210. Referring to FIGS. 4A and 4B, STI features 220 is disposed on the substrate 202 interposing the semiconductor fins 210. By way of example, in some embodiments, a dielectric layer is first deposited over the substrate 202, filling the trenches 214 with dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a SACVD process, a flowable CVD process, an ALD process, a PVD process, and/or other suitable process. In some embodiments, after deposition of the dielectric layer, the device 200 may be annealed, for example, to improve the quality of the dielectric layer. In some embodiments, the dielectric layer may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. In some embodiments, the HM layer 212 functions as a CMP stop layer. Subsequently, the dielectric layer interposing the semiconductor fins 210 are recessed. Still referring to the example of FIGS. 4A and 4B, the STI features 220 are recessed providing the semiconductor fins 210 extending above the STI features 220. In some embodiments, the recessing process may include a dry etching process, a wet etching process, and/or a combination thereof. In some embodiments, a recessing depth is controlled (e.g., by controlling an etching time) so as to result in a desired height of the exposed upper portion of the semiconductor fins 210. In the illustrated embodiment, the desired height exposes each of the layers of the epitaxial stack 204. In furtherance of the embodiment, a top surface of the STI features 220 is recessed below the bottommost epitaxial layer 206.

At operation 108, the method 100 (FIG. 1A) deposits a cladding layer on top and sidewall surfaces of the semiconductor fins. Referring to FIGS. 5A and 5B, in the illustrated embodiment, the cladding layer 222 is selectively deposited over the device 200. In particular, the cladding layer 222 may be selectively and conformally deposited over the exposed surfaces of the semiconductor fins 210. In various embodiments, the cladding layer 222 is not deposited on top surfaces of the STI features 220 between the semiconductor fins 210. For example, the cladding layer 222 may be a semiconductor layer and deposited by an epitaxial growing process, such that the epitaxial growth of the cladding layer 222 is limited to exposed semiconductor surfaces of the semiconductor fins 210, which functions as a seed layer, but not on dielectric material surfaces of the STI features 220. Alternatively, the cladding layer 222 may be deposited as a blanket layer covering the device 200. Subsequently, horizontal portions of the cladding layer 222 are removed in an anisotropic etch process, such as a dry etching process (e.g., RIE etching), leaving remaining portions on top and sidewall surfaces of the semiconductor fins 210. By way of example, the cladding layer 222 may be deposited by an MBE process, an MOCVD process, an ALD process, and/or other suitable deposition processes. As will be explained in detail below, the cladding layer 222 reserves a space for subsequently formed metal gate stack and will be removed in a subsequent processing stage. Therefore, the cladding layer 222 is also referred to as a sacrificial cladding layer.

In some embodiments, the cladding layer 222 includes the same semiconductor material as the epitaxial layers 206, such as silicon germanium (SiGe), but in difference germanium concentrations. For example, the molar ratio of germanium may range from about 15% to about 25% in the epitaxial layers 206, and the molar ratio of germanium may range from about 40% to about 50% in the cladding layer 222. The difference in germanium concentration provides etch selectivity between the cladding layer 222 and the epitaxial layers 206. In some alternative embodiments, the cladding layer 222 includes the same semiconductor material as the epitaxial layers 206, such as silicon germanium (SiGe), including the same germanium concentration. In furtherance of the embodiment, an oxide liner (not shown) may be formed on exposed semiconductor surfaces of the semiconductor fins 210 prior to the deposition of the cladding layer 222. The oxide liner separates the cladding layer 222 from the epitaxial layers 206 and protects the epitaxial layers 206 in subsequent removal of the cladding layer 222. The oxide liner is formed by oxidizing exposed semiconductor surfaces of the semiconductor fins 210. The oxidation process results in the oxide liner having a determined thickness. For example, the oxide liner may have a thickness from about 1 nm to about 3 nm. In some embodiments, the oxidation process comprises a rapid thermal oxidation (RTO) process, high pressure oxidation (HPO), chemical oxidation process, in-situ stream generation (ISSG) process, or enhanced in-situ stream generation (EISSG) process. In some embodiments, the RTO process is performed at a temperature of about 400° C. to about 700° C., using $O_2$ and $O_3$ as reaction gases, for about 1 second to about 30 seconds. In other embodiments, an HPO is performed using a process gas of $O_2$, $O_2+N_2$, $N_2$, or the like, at a pressure from about 1 atm to about 25 atm and a temperature from about 300° C. to about 700° C., for about 1 minute to about 10 minutes. Examples of a chemical oxidation process include wet SPM clean, wet $O_3/H_2O$, or the like. The $O_3$ may have a concentration of about 1 ppm to about 50 ppm.

In some embodiments, the semiconductor material in the cladding layer 222 is in either amorphous form or polycrystalline form, such as amorphous SiGe or polycrystalline SiGe in some embodiments. In yet some embodiments, the cladding layer 222 may have a mixture of semiconductor material in both amorphous form and polycrystalline form, such as 60% SiGe in amorphous form and 40% SiGe in polycrystalline form. The term "amorphous or polycrystalline" is used herein to designate composition in amorphous form, polycrystalline form, or a combination thereof.

Figure 6B:
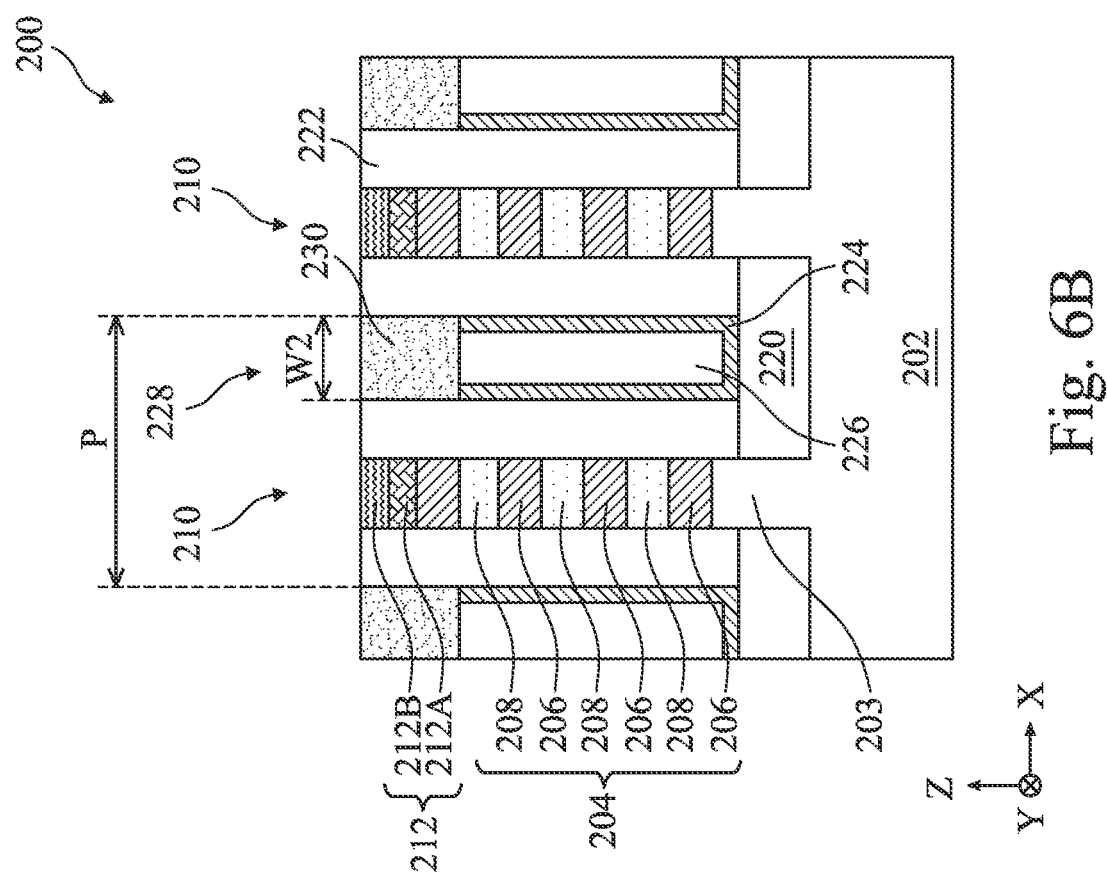
Figure 6A:
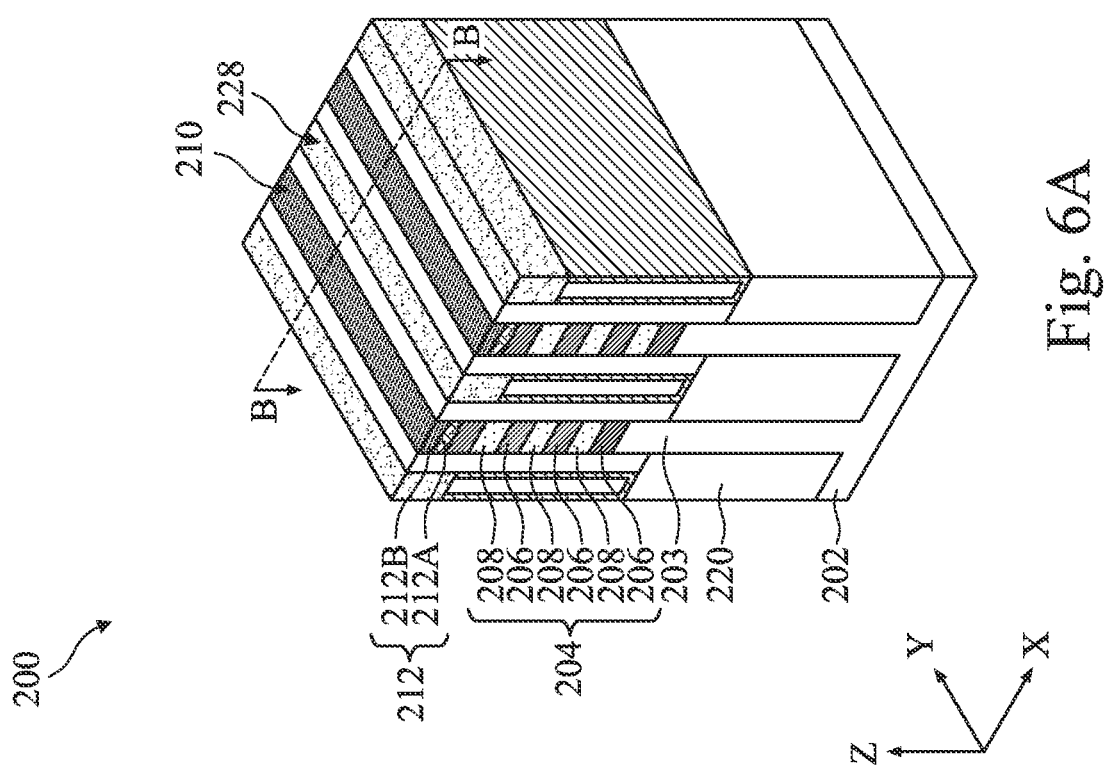

At operation 110, the method 100 (FIG. 1A) forms dielectric fins between adjacent semiconductor fins. Referring to FIGS. 6A and 6B, in an embodiment of operation 110, a dielectric layer 224 is deposited conformally within the trenches 214 including along sidewalls of the cladding layer 222 and along a top surface of the STI features 220. Thereafter, a dielectric layer 226 is deposited over the dielectric layer 224. In at least some embodiments, the dielectric layers 224, 226 may collectively define a dielectric fin 228 (or hybrid fin 228). In some cases, a dielectric fin 228 may further include a high-k dielectric layer formed over the dielectric layers 224 and 226, for example after recessing of the dielectric layers 224 and 226, as discussed below. Generally, and in some embodiments, the dielectric layers 224 and 226 may include SiN, SiCN, SiOC, SiOCN, SiOx, or other appropriate material. In some examples, the dielectric layer 224 may include a low-k dielectric layer, and the dielectric layer 226 may include a flowable oxide layer. In various cases, the dielectric layers 224 and 226 may be deposited by a CVD process, an ALD process, a PVD process, a spin-coating and baking process, and/or other suitable process. In some examples, after depositing the dielectric layers 224 and 226, a CMP process may be performed to remove excess material portions and to planarize a top surface of the device 200.

The method 100 at operation 110 may further include a recessing process, a high-k dielectric layer deposition process, and a CMP process. Still referring to FIGS. 6A and 6B, in an embodiment of operation 110, a recessing process is performed to remove top portions of the dielectric layers 224 and 226. In some embodiments, the recessing process may include a dry etching process, a wet etching process, and/or a combination thereof. In some embodiments, a recessing depth is controlled (e.g., by controlling an etching time) to result in a desired recess depth. In some embodiments, the recessing process may optionally remove at least part of the cladding layer 222. After performing the recessing process, and in a further embodiment of operation 110, a high-k dielectric layer 230 is deposited within trenches formed by the recessing process. In some embodiments, the high-k dielectric layer 230 may include $HfO_2$, $ZrO_2$, HfAlOx, HfSiOx, $Y_2O_3$, $Al_2O_3$, or another high-k material. The high-k dielectric layer 230 may be deposited by a CVD process, an ALD process, a PVD process, and/or other suitable process. After deposition of the high-k dielectric layer 230, and in a further embodiment of operation 110, a CMP process is performed to remove excess material portions and to planarize a top surface of the device 200. In some examples, the CMP process removes a portion of the cladding layer 222 from the top of the semiconductor fins 210 to expose the HM layer 212. Thus, in various cases, a dielectric fin 228 is defined as having a lower portion including the recessed portions of the dielectric layers 224, 226 and an upper portion including the high-k dielectric layer 230. In some examples, a height of the high-k dielectric layer 230 may be about 20 nm to about 30 nm with a width W2 ranging from about 15 nm to about 25 nm, and a pitch P of the dielectric fins 228 may range from about 60 nm to about 70 nm. In some cases, a dielectric fin 228 may be alternatively described as a bi-layer dielectric having a high-k upper portion and a low-k lower portion. In some examples, a height ratio of the upper portion to the lower portion may be about 1:20 to about 20:1. The height ratio may be adjusted, for example, by changing the recess depth and thus the height of the high-K dielectric layer 230, as noted above. In the illustrated embodiment, the recessed top surface of the dielectric layers 224 and 226 is substantially level (or termed as coplanar) with a top surface of the top epitaxial layer 208. In some embodiments, the dielectric fins 228 are used to effectively prevent the undesirable lateral merging of the epitaxial S/D features formed on adjacent semiconductor fins 210, as will be discussed in more detail below.

Figure 7B:
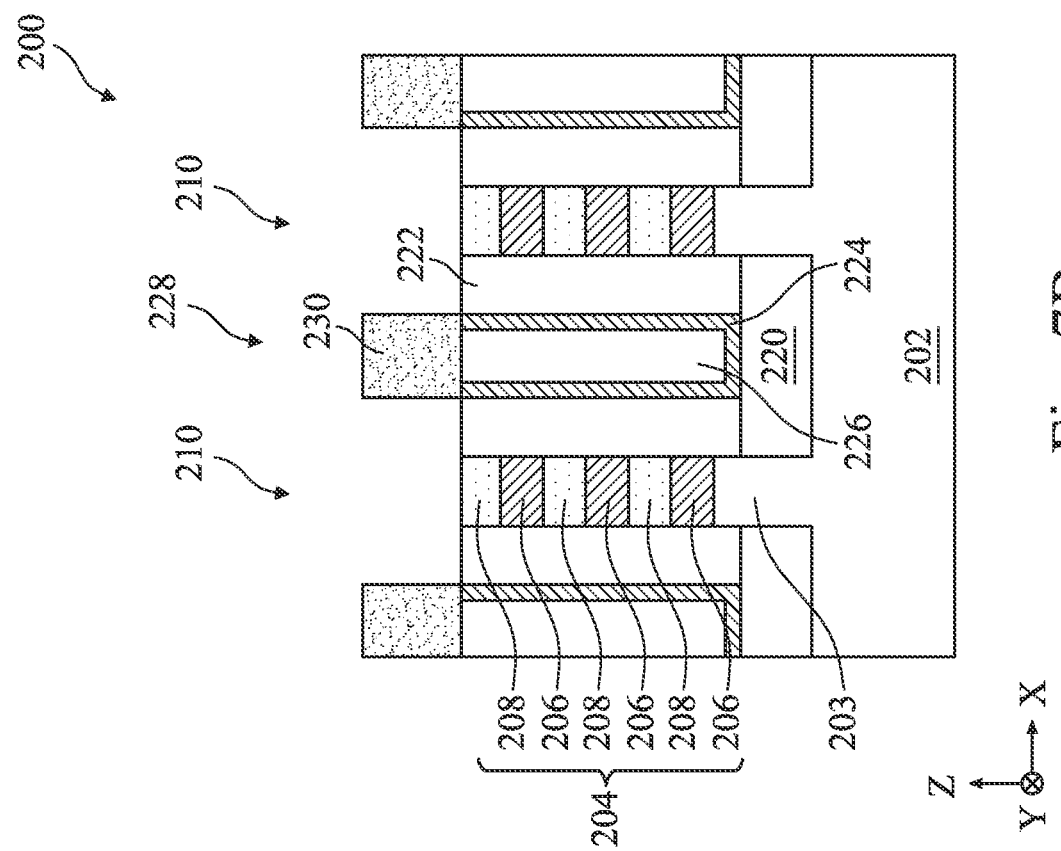
Figure 7A:
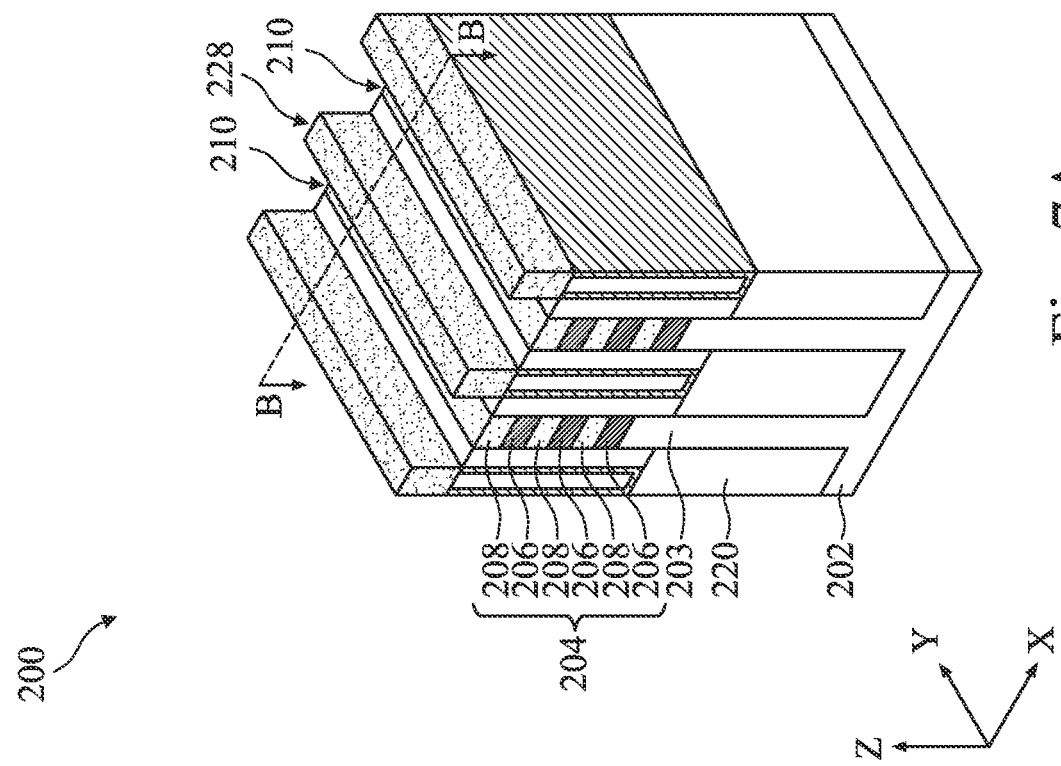

At operation 112, the method 100 (FIG. 1A) removes the HM layer 212 and a top portion of the cladding layer 222. Referring to FIGS. 7A and 7B, in an embodiment of operation 112, the HM layer 212 and a top portion of the cladding layer 222 may initially be etched-back. The topmost epitaxial layer 206 may act as an etch stop layer for etching the HM layer 212 and be subsequently removed. The top portion of the cladding layer 222 may be removed together with the topmost epitaxial layer 206 by the same etchant that targets the same semiconductor material, such as SiGe. In some embodiments, a top surface of the etched-back cladding layer 222 is substantially level with top surfaces of the topmost epitaxial layer 208 of the semiconductor fins 210. In some embodiments, the etch-back of the HM layer 212 and the top portion of the cladding layer 222 may be performed using a wet etch process, a dry etch process, a multiple-step etch process, and/or a combination thereof. The HM layer 212 may be removed, for example, by a wet etching process using $H_3PO_4$ or other suitable etchants.

Figure 8B:
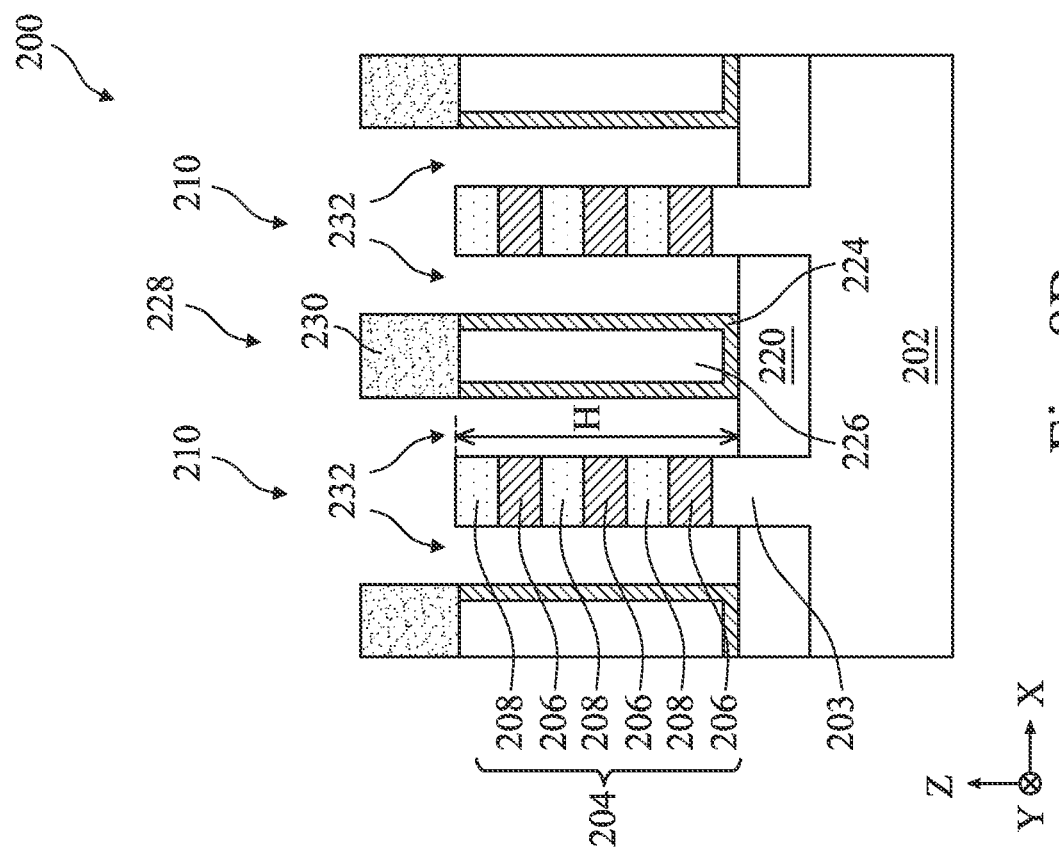
Figure 8A:
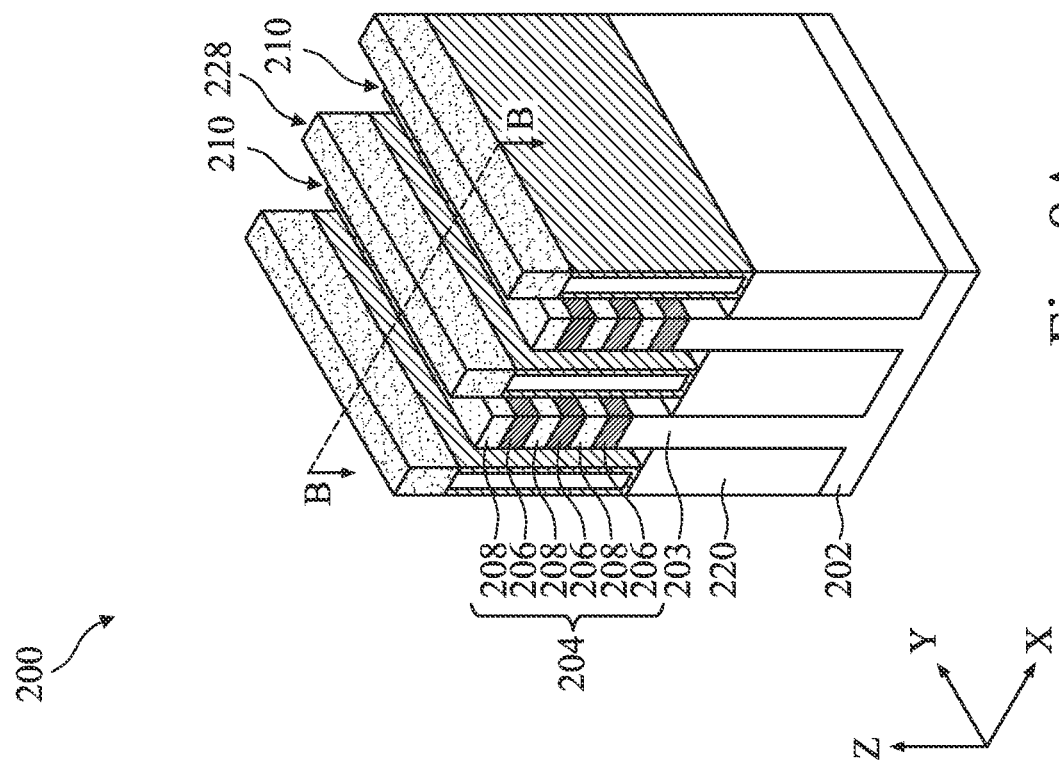

At operation 114, the method 100 (FIG. 1A) removes the remaining portion of the cladding layer 222. Referring to FIGS. 8A and 8B, in an embodiment of operation 114, the epitaxial layers 206 and the cladding layer 222 both include SiGe but with different germanium concentrations, allowing for the selective removal of the cladding layer 222. In an embodiment, the cladding layer 222 is removed by a selective wet etching process. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by $O_3$ clean and then SiGeOx removed by an etchant such as $NH_4OH$. In an alternative embodiment of operation 114, the epitaxial layers 206 and the cladding layer 222 both include SiGe with the same germanium concentration but separated by an oxide liner formed on the semiconductor fins. The oxide liner functions as an etch stop layer during the removal of the cladding layer 222 and protects the epitaxial layers 206 underneath from etch loss. The cladding layer 222 may be removed in an etching process that includes dry etching, wet etching, reactive ion etching (RIE), and/or other suitable processes. After the removal of the cladding layer 222, trenches 232 are formed between opposing sidewalls of the semiconductor fins 210 and the dielectric fins 228. A top surface of the STI features 220 is exposed in the trenches 232. A distance H from the top surface of the top epitaxial layer 208 to the top surface of the STI features 220 may range from about 60 nm to about 70 nm.

The method 100 then proceeds to operation 116 (FIG. 1A) where a dummy gate structure is formed. While the present discussion is directed to a replacement gate (or gate-last) process whereby a dummy gate structure is formed and subsequently replaced, other configurations may be possible. With reference to FIGS. 9A-9D, a dummy gate structure 234 is formed. The dummy gate structure 234 will be replaced by a final gate stack at a subsequent processing stage of the device 200. In particular, the dummy gate structure 234 may be replaced at a later processing stage by a high-k dielectric layer (HK) and metal gate electrode (MG), as will be discussed in more detail below. In some embodiments, the dummy gate structure 234 is disposed over the semiconductor fins 210, the dielectric fins 228, and the STI features 220. The portion of the semiconductor fins 210 underlying the dummy gate structure 234 may be referred to as the channel region. The dummy gate structure 234 may also define source/drain (S/D) regions of the semiconductor fins 210, for example, the regions of the semiconductor fin 210 adjacent and on opposing sides of the channel region.

In some embodiments, the dummy gate structure 234 is formed by various process steps such as layer deposition, patterning, etching, as well as other suitable processing steps. Exemplary layer deposition processes include CVD (including low-pressure CVD, plasma-enhanced CVD, and/or flowable CVD), PVD, ALD, thermal oxidation, e-beam evaporation, or other suitable deposition techniques, or combinations thereof. In some embodiments, the dummy gate structure 234 includes a dummy dielectric layer and a dummy electrode layer. In some embodiments, the dummy dielectric layer may include $SiO_2$, silicon nitride, a high-k dielectric material and/or other suitable material. Subsequently, the dummy electrode layer is deposited. In some embodiments, the dummy electrode layer may include polycrystalline silicon (polysilicon). In forming the dummy gate structure for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate structure 234 is patterned through a hard mask 236. The hard mask 236 may include multiple layers, such as an oxide layer and a nitride layer over the oxide layer. In some embodiments, after formation of the dummy gate structure 234, the dummy dielectric layer is removed from the S/D regions of the semiconductor fins 210. The etch process may include a wet etch, a dry etch, and/or a combination thereof. The etch process is chosen to selectively etch the dummy dielectric layer without substantially etching the semiconductor fins 210, the hard mask 236, and the dummy electrode layer.

Figures 9A, 9B:
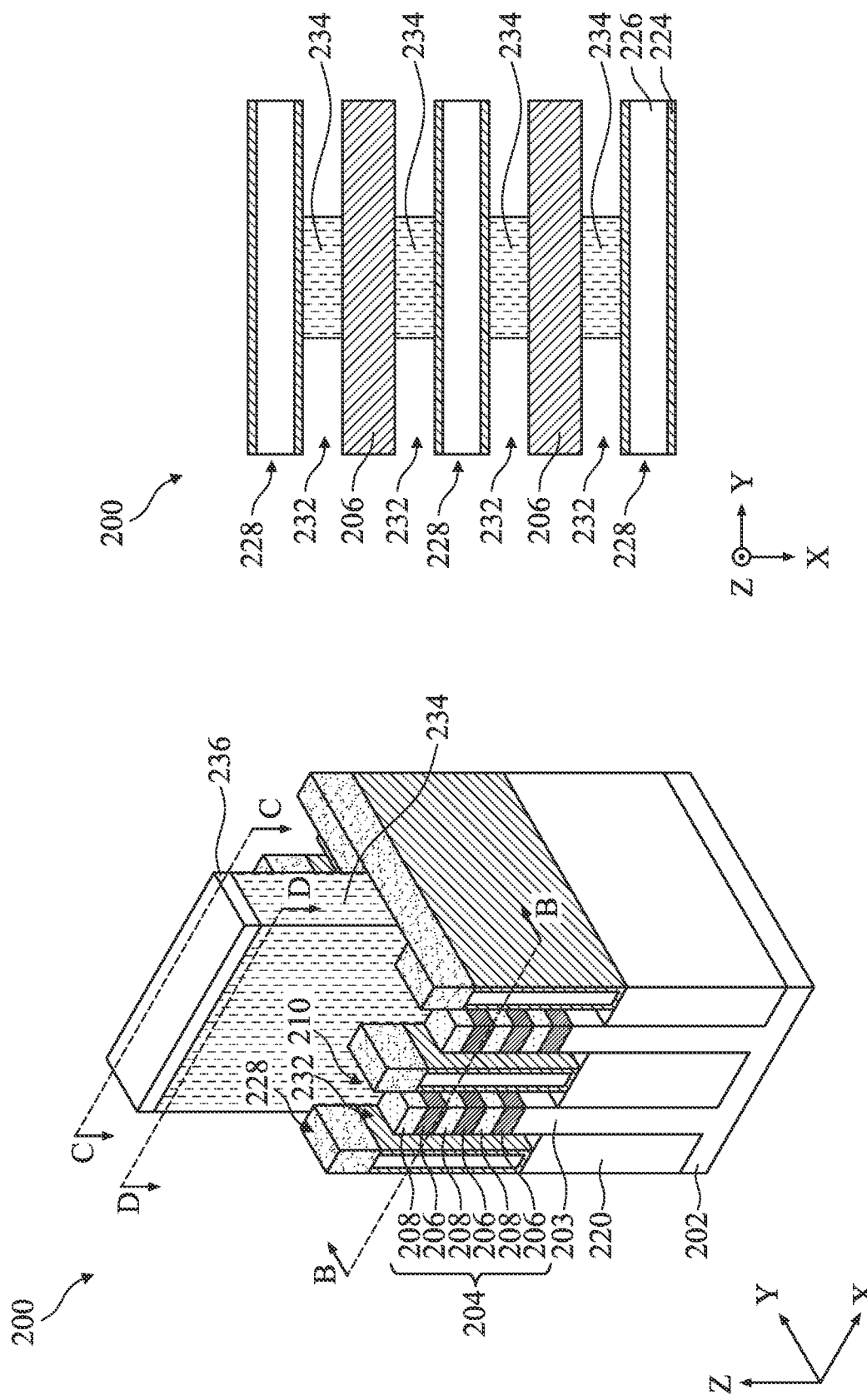

Referring to FIGS. 9B and 9C, due to the removal of the cladding layer 222 prior to the forming of the dummy gate structure 234, the dummy gate structure 234 is also formed in the trenches 232. That is, a bottom portion of the dummy gate structure 234 is laterally stacked between the semiconductor fins 210 and the dielectric fins 228. The bottom portion of the dummy gate structure 234 is in contact with the top surface of the STI features 220. In the illustrated embodiment, as the base portion 203 of the semiconductor fins 210 protrudes above the top surface of the STI features 220, a bottommost portion of the dummy gate structure 234 is below a bottom surface of the bottom epitaxial layer 206.

Figures 10C, 10D:
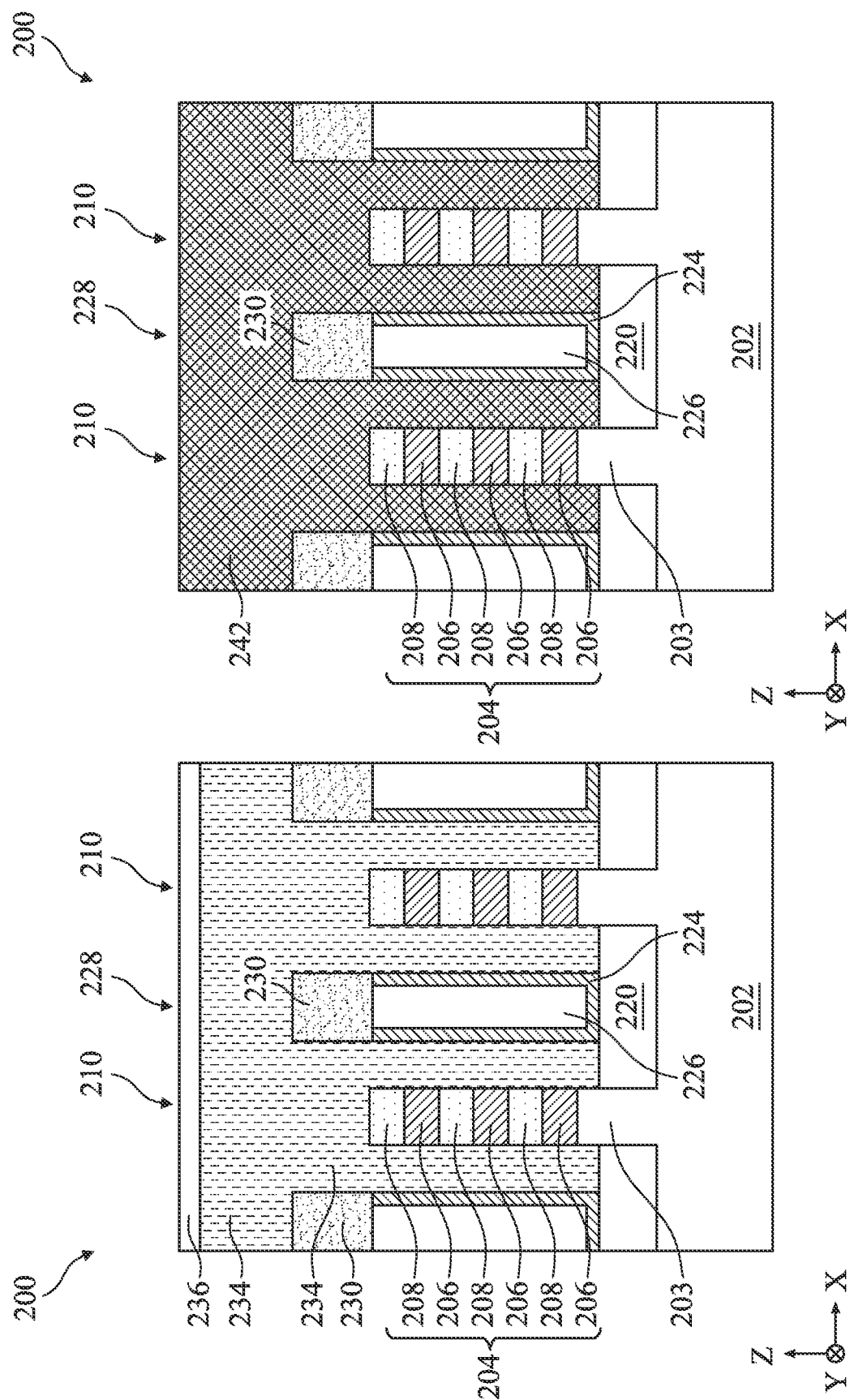

At operation 118, the method 100 (FIG. 1A) forms gate sidewall spacers on sidewall surfaces of the dummy gate structure 234. With reference to FIGS. 10A-10F, gate sidewall spacers 242 are formed. The gate sidewall spacers 242 may have a thickness from about 2 nm to about 10 nm. In some examples, the gate sidewall spacers 242 may include a dielectric material such as silicon oxide, silicon nitride, silicon carbide, silicon oxynitride, SiCN, silicon oxycarbide, SiOCN, a low-k material, and/or combinations thereof. In some embodiments, the gate sidewall spacers 242 include multiple layers, such as a liner spacer layer and a main spacer layer, and the like. By way of example, the gate sidewall spacers 242 may be formed by conformally depositing a dielectric material over the device 200 using processes such as a CVD process, a subatmospheric CVD (SACVD) process, a flowable CVD process, an ALD process, a PVD process, or other suitable process. Following the conformal deposition of the dielectric material, portions of the dielectric material used to form the gate sidewall spacers 242 may be etched-back to expose portions of the semiconductor fins 210 not covered by the dummy gate structures 234 (e.g., for example, in source/drain regions). In some cases, the etch-back process removes portions of dielectric material used to form the gate sidewall spacers 242 along a top surface of the dummy gate structure 234, thereby exposing the hard mask layer 236. In some embodiments, the etch-back process may include a wet etch process, a dry etch process, a multiple-step etch process, and/or a combination thereof. It is noted that after the etch-back process, the gate sidewall spacers 242 remain disposed on sidewall surfaces of the dummy gate structure 234. A distance D0 between two external sidewalls of the gate sidewall spacers 242 may range from about 20 nm to about 30 nm (FIG. 10F).

Referring to FIGS. 10B and 10D, due to the removal of the cladding layer 222 prior to the forming of the dummy gate structure 234, the gate sidewall spacers 242 are also formed in the trenches 232. That is, a bottom portion of the gate sidewall spacers 242 is laterally stacked between the semiconductor fins 210 and the dielectric fins 228. The bottom portion of the gate sidewall spacers 242 is in contact with the top surface of the STI features 220. In the illustrated embodiment, as the base portion 203 of the semiconductor fins 210 protrudes above the top surface of the STI features 220, a bottommost portion of the gate sidewall spacers 242 is below a bottom surface of the bottom epitaxial layer 206.

At operation 120, the method 100 (FIG. 1B) recesses the semiconductor fins 210 in the S/D regions in forming S/D recesses. With reference to FIGS. 11A-11F, by recessing the semiconductor fins 210 that separate trenches 232 in the S/D regions, adjacent trenches 232 are adjoined, in forming larger trenches between adjacent dielectric fins 228 denoted as S/D recesses 246. In some embodiments of operation 120, the S/D recesses 246 is formed by an S/D etch process. An S/D etch process is performed to remove portions of the semiconductor fins 210 not covered by the dummy gate structure 234 and the gate sidewall spacers 242 (e.g., in S/D regions) and that were previously exposed (e.g., during the gate sidewall spacers etch-back process). In particular, the S/D etch process may serve to remove portions of the epitaxial layers 206 and 208 in the S/D regions of the device 200 to expose underlying base portions 203 of the semiconductor fins 210. In some embodiments, the S/D etch process may include a dry etching process, a wet etching process, and/or a combination thereof.

Figure 11B:
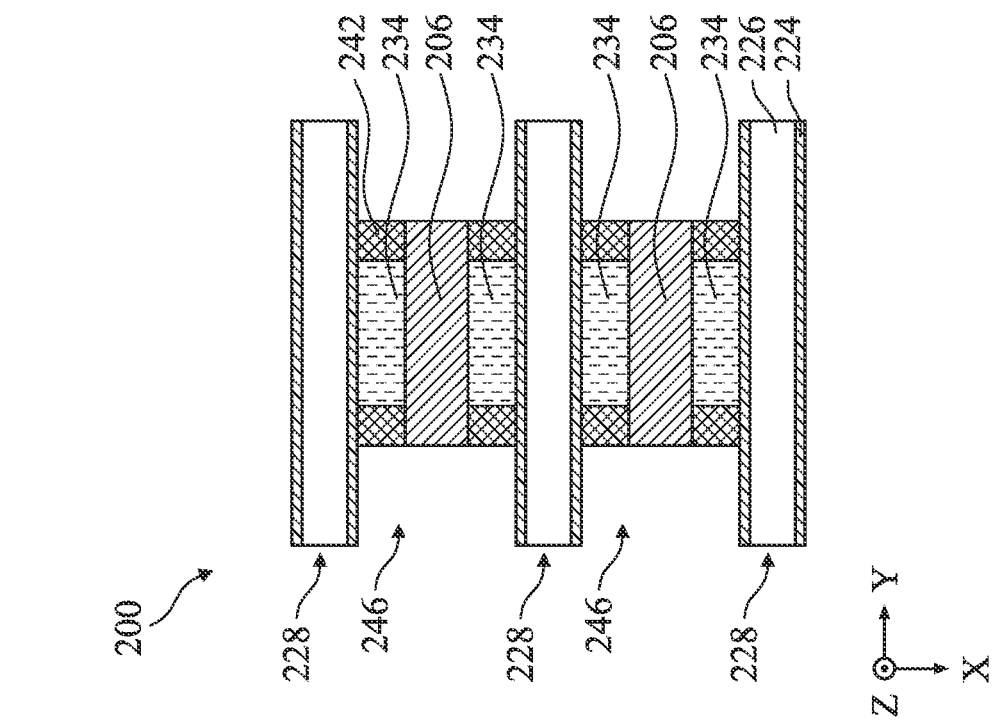
Figure 11A:
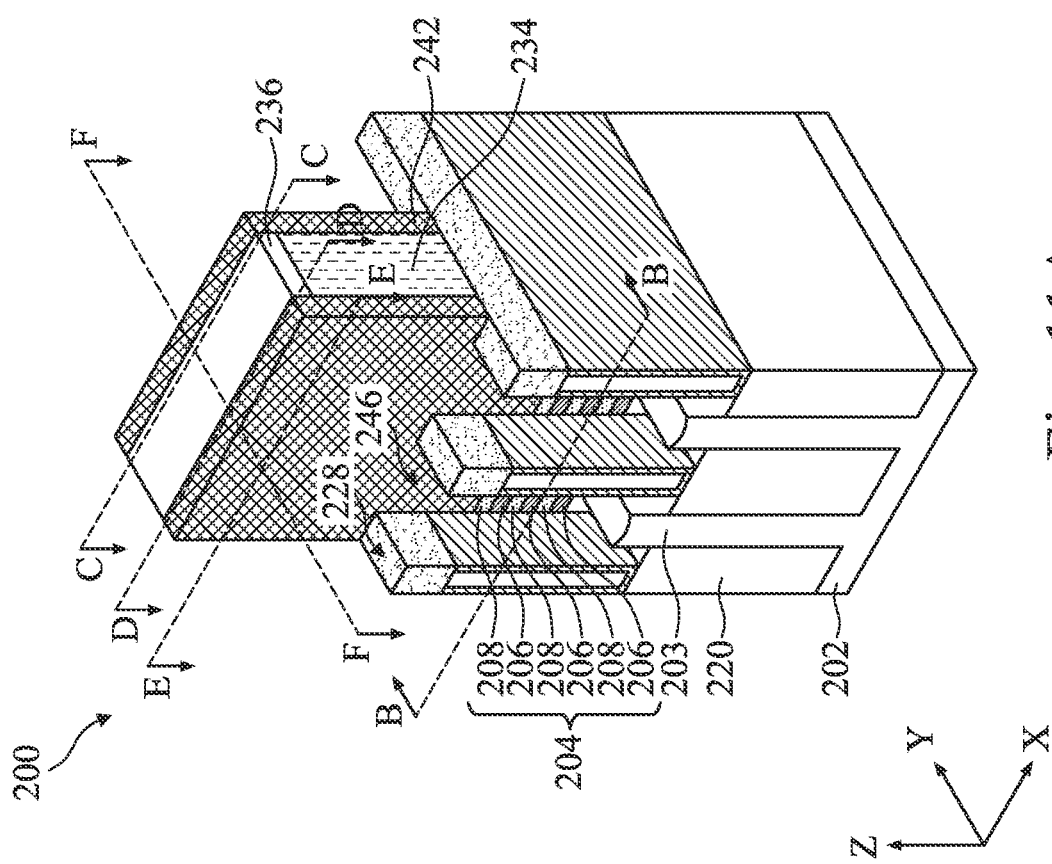
Figure 11F:
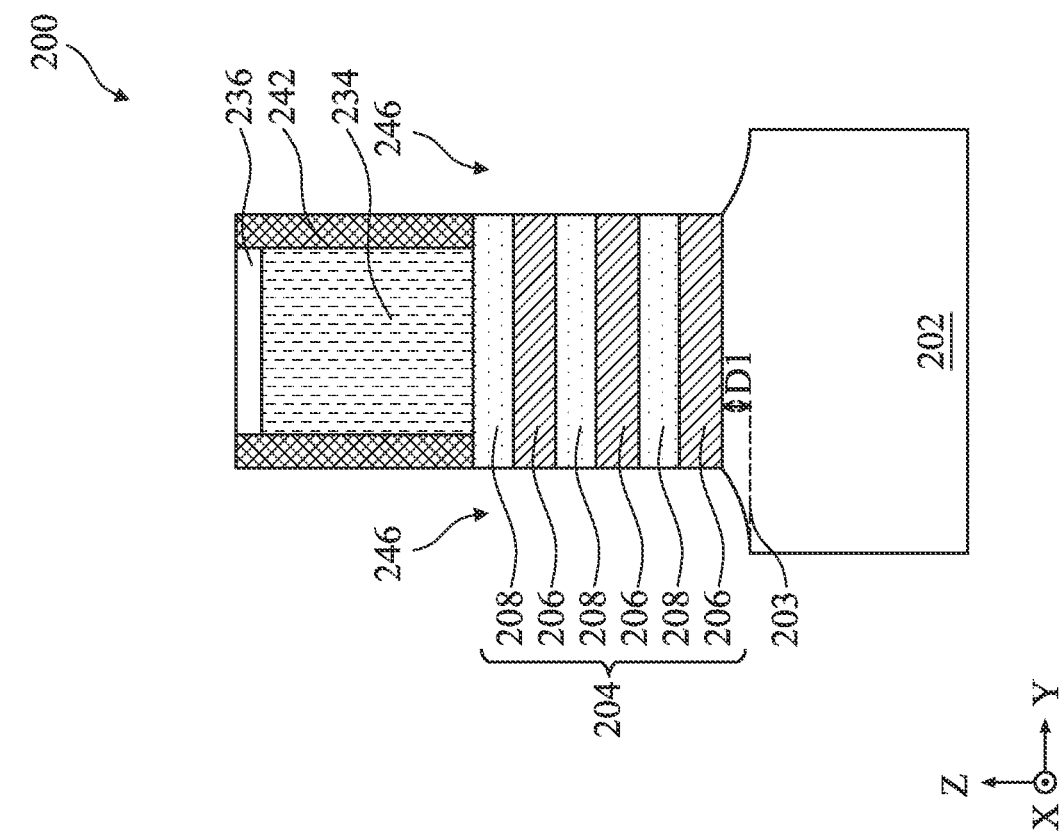
Figure 11E:
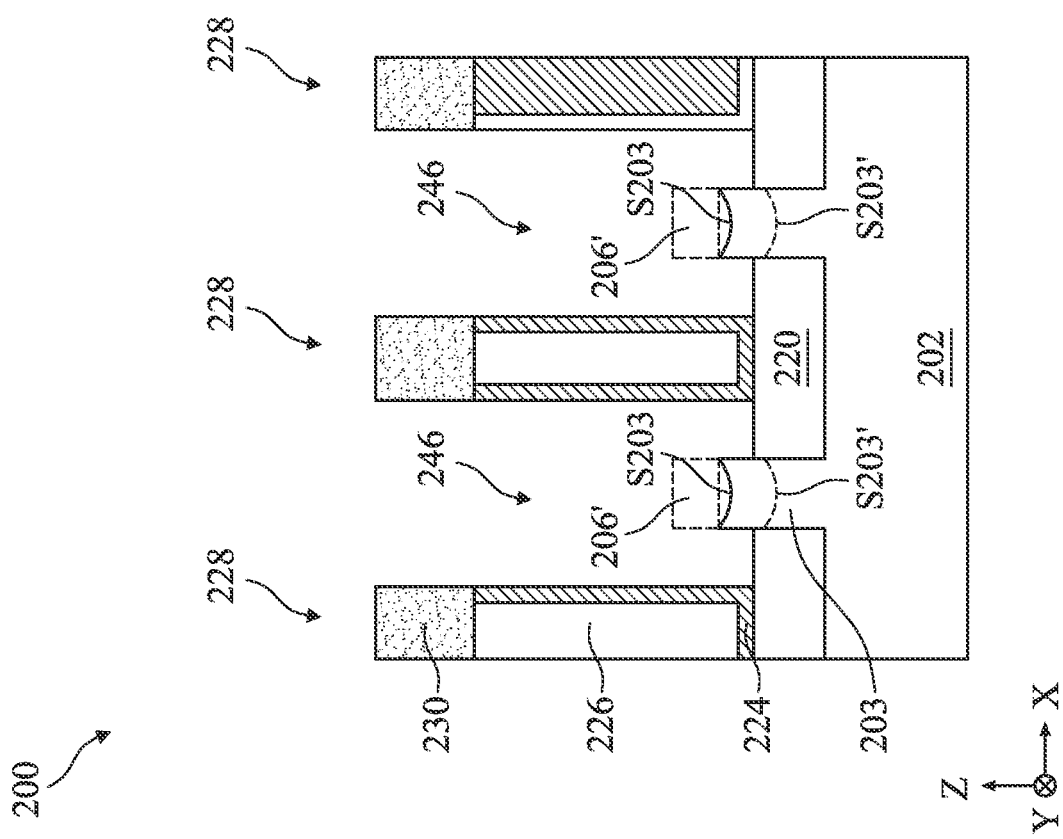

In some embodiments, a recessing depth is controlled (e.g., by controlling an etching time) such that the base portion 203 remains protruding above the STI features 220. Referring to FIG. 11E, in the illustrated embodiment, the S/D etch process stops when the bottom epitaxial layer 206 (represented by dotted box 206') is removed. The top surface S203 of the base portion 203 may have a dishing profile due to certain etch loss during the S/D etch process. The tips of the dishing profile may align with a bottom surface of the bottom epitaxial layer 206 in the channel region. The top surface S203 is above the STI features 220. If the cladding layer 222 is not removed, the base portion 203 may have to be recessed below the STI features 220 to fully expose the cladding layer 222 in order to avoid shorting between subsequently formed S/D features and metal gate stacks. A top surface of the base portion 203 in such a scenario is represented by dotted line S203', which is below the STI features 220. With the elevated top surface S203 instead of S203', the S/D trenches 246 becomes shallower (a distance D1 measured from bottom of the S/D recess 246 to the bottom surface of the epitaxial stack 204 may be less than about 5 nm), which translates to a thicker base portion 203 and less gate drive applied on the semiconductor substrate underneath the subsequently formed S/D features. In some examples, the base portion 203 may gain extra thickness from about 5 nm to about 15 nm. The substrate leakage is thus suppressed.

At operation 122, the method 100 (FIG. 1B) forms inner spacer cavities. With reference to FIGS. 12A-12F, by laterally recessing the epitaxial layers 206 through S/D recesses 246, inner spacer cavities 248 are formed. In some embodiments of operation 122, a lateral etching (or horizontal recessing) is performed to recess the epitaxial layers 206 to form inner spacer cavities 248. The amount of etching of the epitaxial layers 206 is in a range from about 2 nm to about 10 nm in some embodiments. In furtherance of some embodiments, end portions (edges) of the recessed epitaxial layers 206 are substantially flush with the sidewall surfaces of the dummy gate structure 234. Here, "being substantially flush" means the difference in the relative position is less than about 1 nm. When the epitaxial layers 206 are SiGe, the lateral etching process may use an etchant selected from, but not limited to, ammonium hydroxide (NH$_4$OH), tetramethylammonium hydroxide (TMAH), ethylenediamine pyrocatechol (EDP), and potassium hydroxide (KOH) solutions.

Figure 12D:
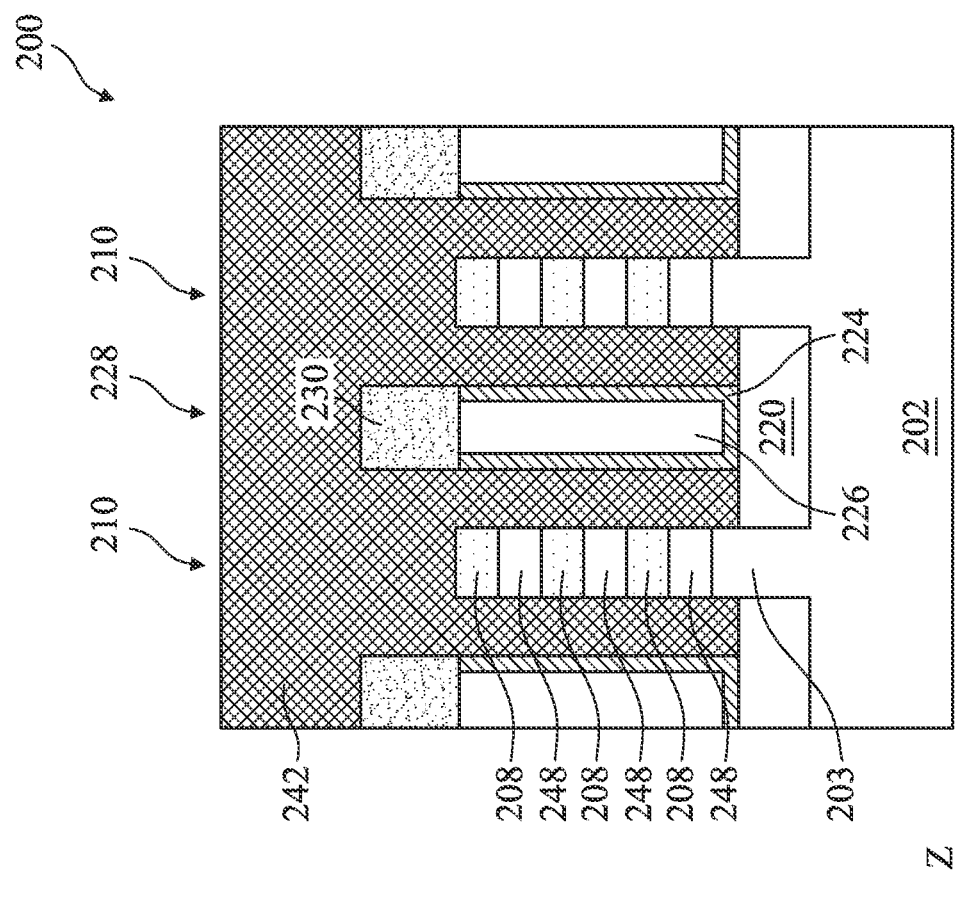
Figure 12C:
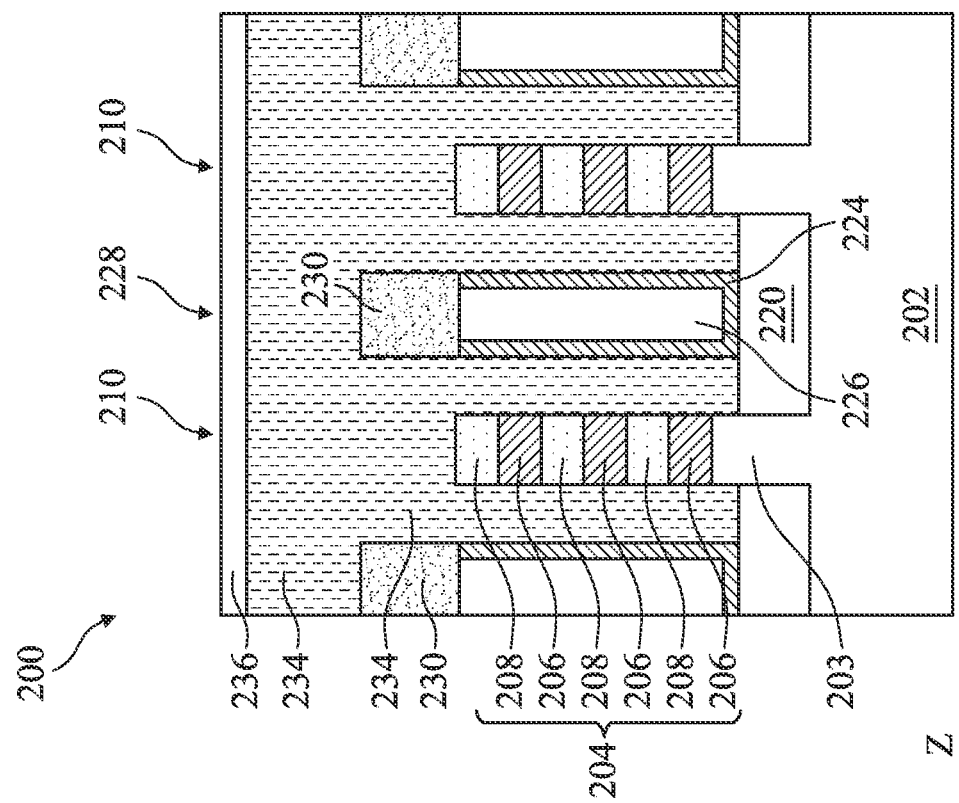
Figure 12F:
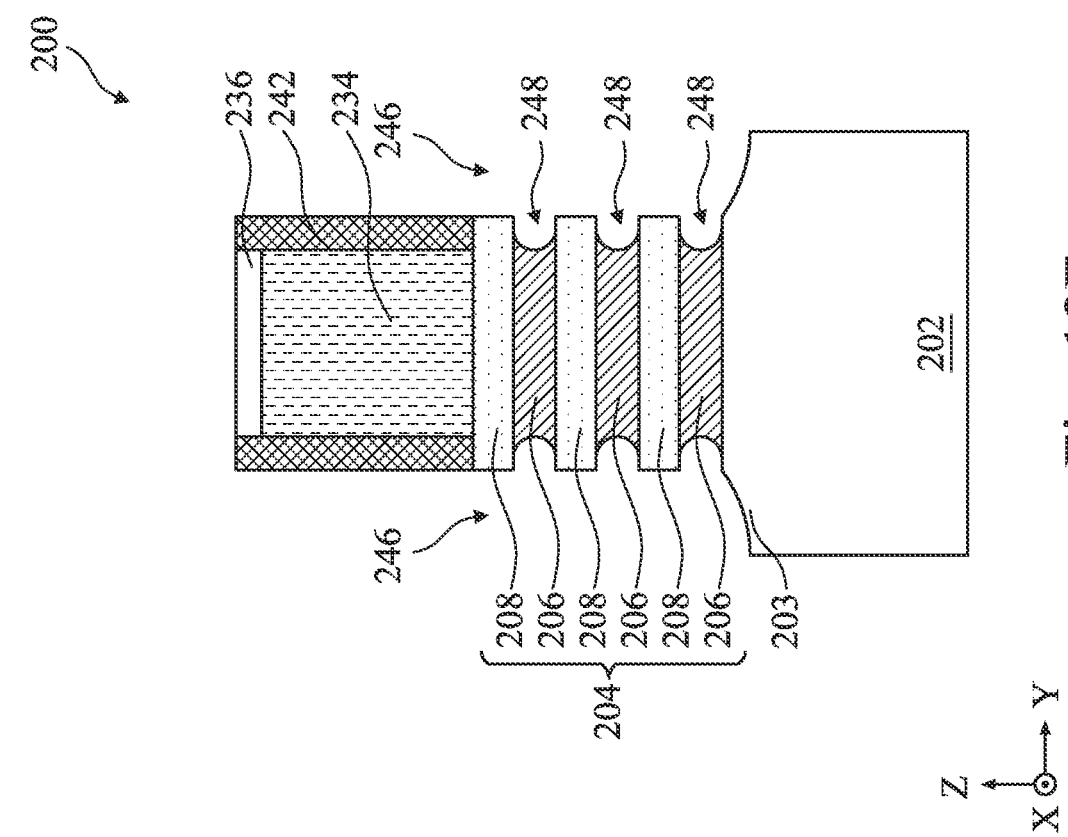
Figure 12E:
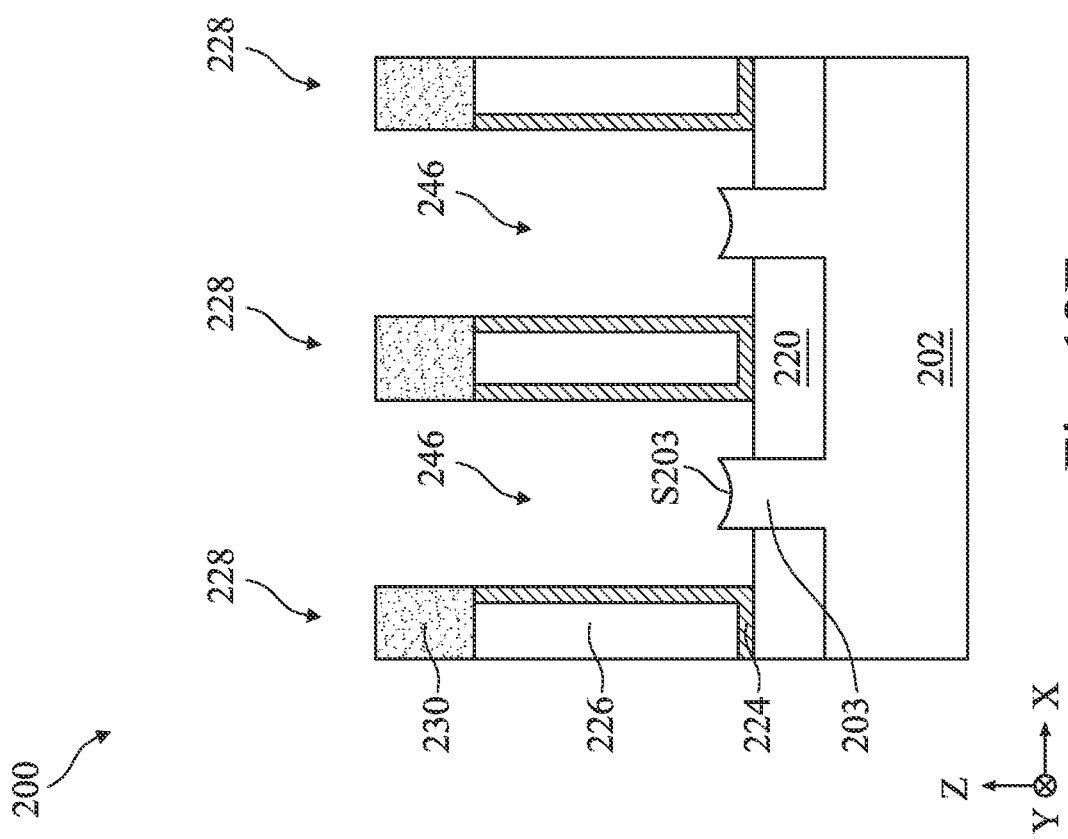
Figures 13A, 13B:
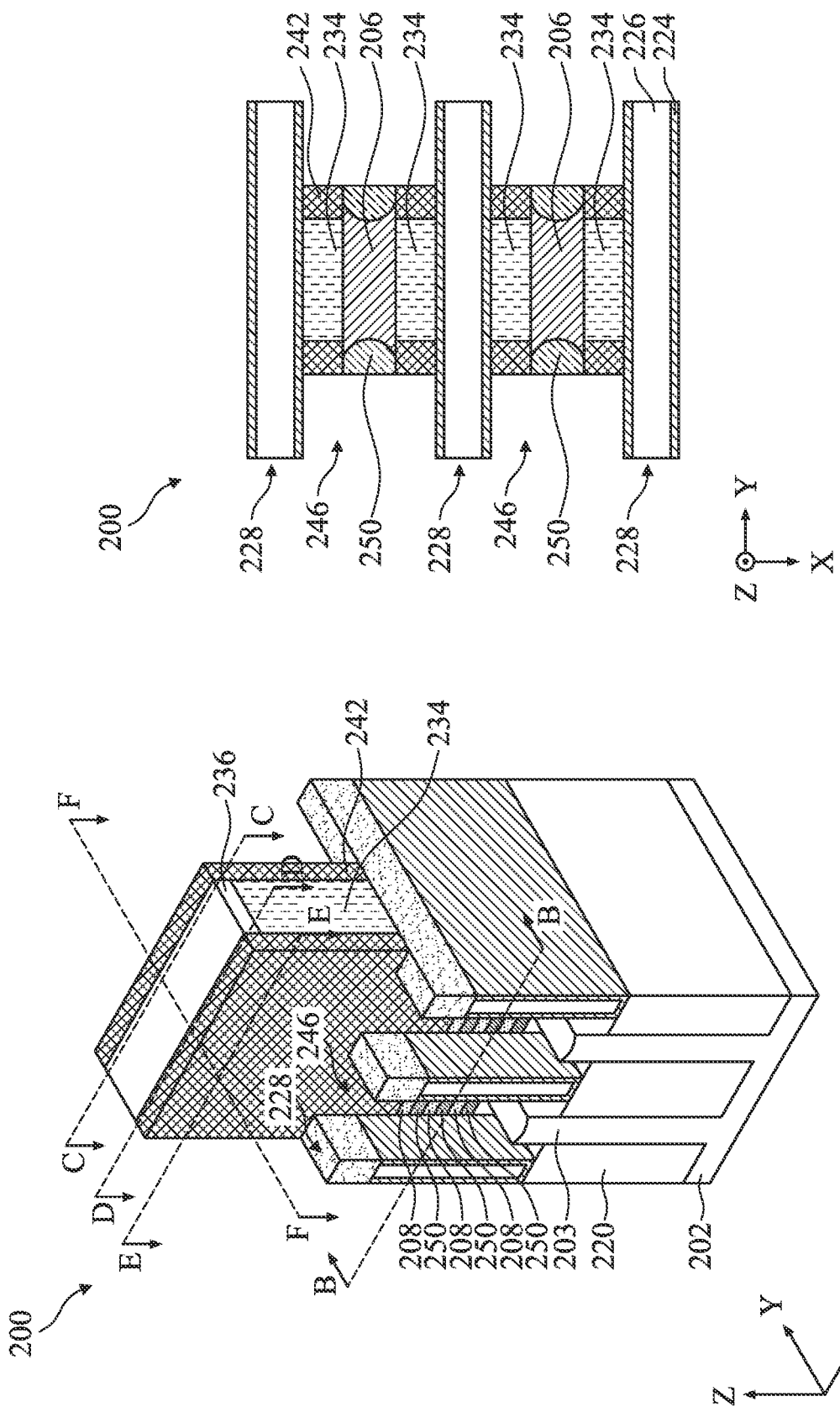
Figure 13D:
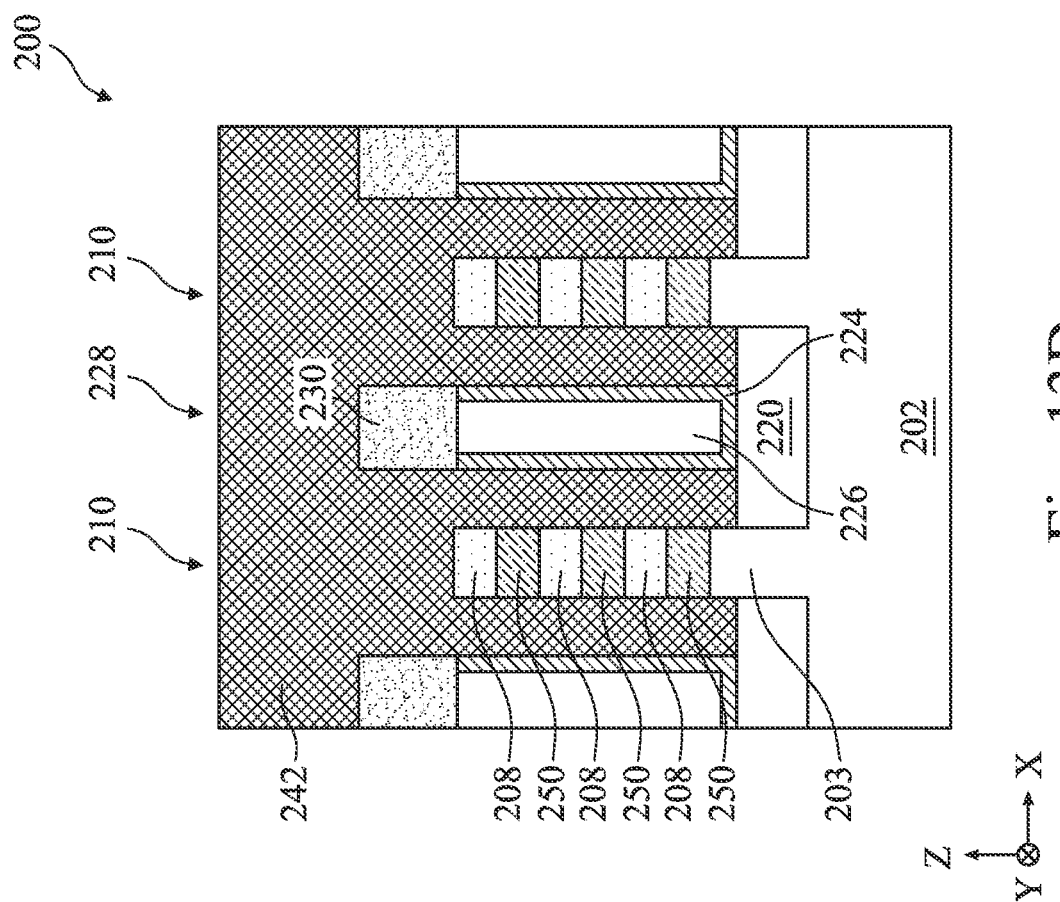
Figure 13C:
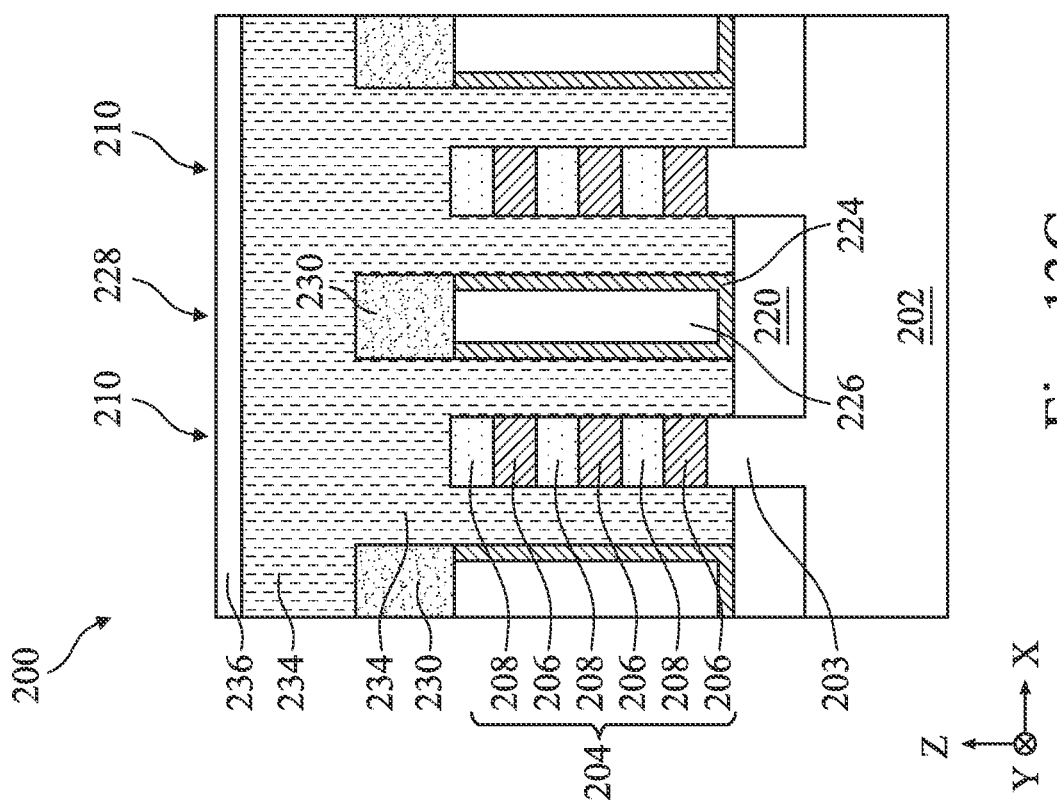

Referring to FIGS. 12B and 12D, as the cladding layer 222 has been removed and replaced by the dummy gate structure 234 and the gate sidewall spacers 242, the etchant selected for lateral etching only needs to selectively etch the epitaxial layer 206, not the cladding layer 222, which simplifies the etching process. If the cladding layer 222 still presents in locations where the dummy gate structure 234 and the gate sidewall spacers 242 presently are, etching rates would be different for the epitaxial layer 206 and the cladding layer 222 due to different material compositions (e.g., different germanium concentrations), which would result in poor uniformity of inner spacer cavity dimensions.

At operation 124, the method 100 (FIG. 1B) forms inner spacers. With reference to FIGS. 13A-13F, inner spacers 250 are formed in the inner spacer cavities 248. A length D2 of the inner spacers 250 (along the Y-direction) may range from about 3 nm to about 8 nm, in some embodiments. In some embodiments of operation 124, an insulating layer is formed on the lateral ends of the epitaxial layers 206 to fill the inner spacer cavities 248, thereby forming inner spacers 250. The insulating layer may include a dielectric material, such as SiN, SiOC, SiOCN, SiCN, SiO2, and/or other suitable material. In some embodiments, the insulating layer is conformally deposited, for example, by ALD or any other suitable method. After the conformal deposition of the insulating layer, an etch-back process is performed to partially remove the insulating layer from outside of the inner spacer cavities 248. By this etching the insulating layer remains substantially within the inner spacer cavities 248. In some examples, the etch-back process may also etch a portion of the high-k dielectric layer 230 of the dielectric fins 228 not covered by the dummy gate structure 234.

Figure 14D:
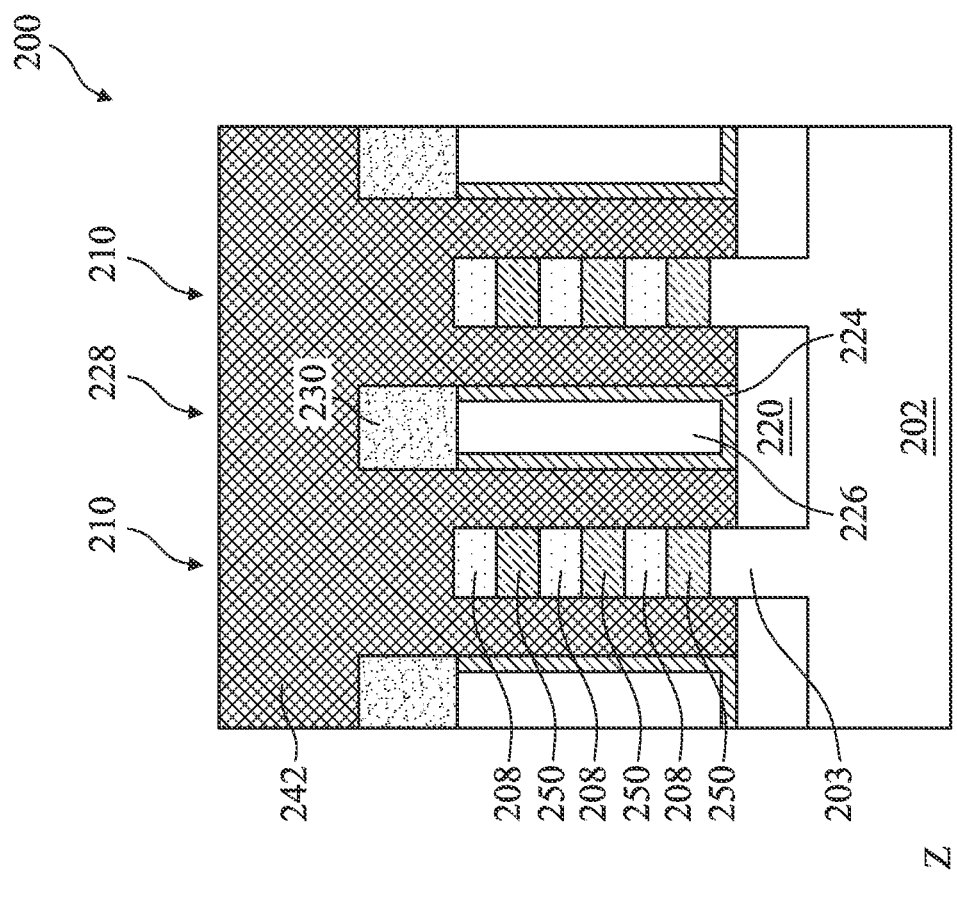
Figure 14C:
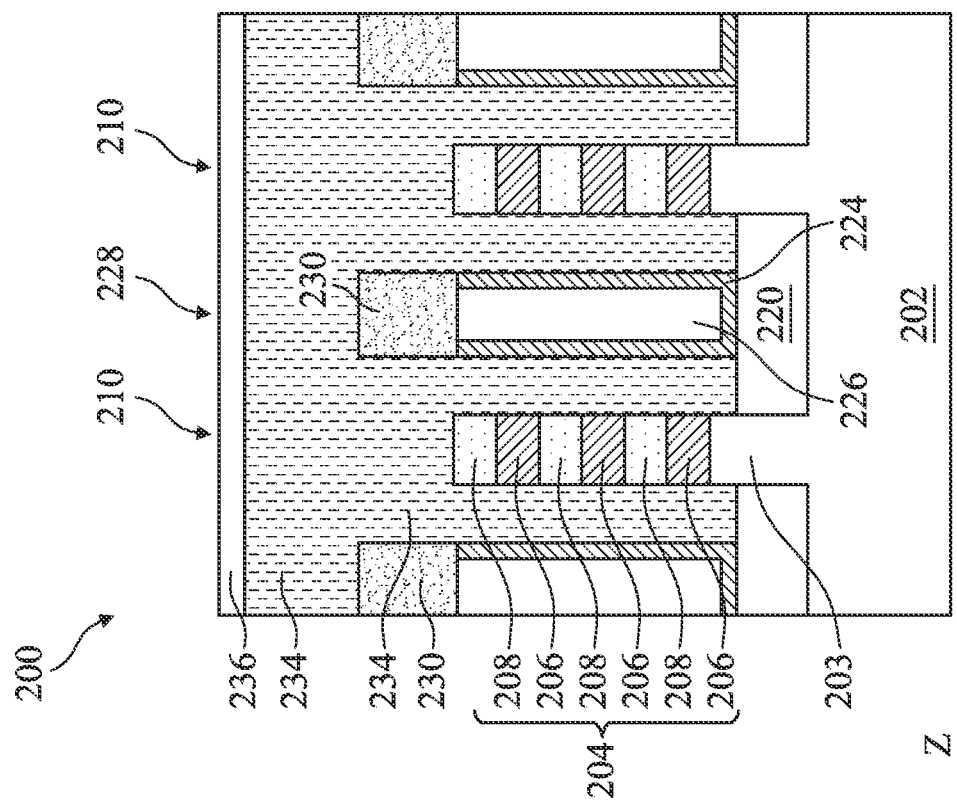
Figures 14E, 14F:
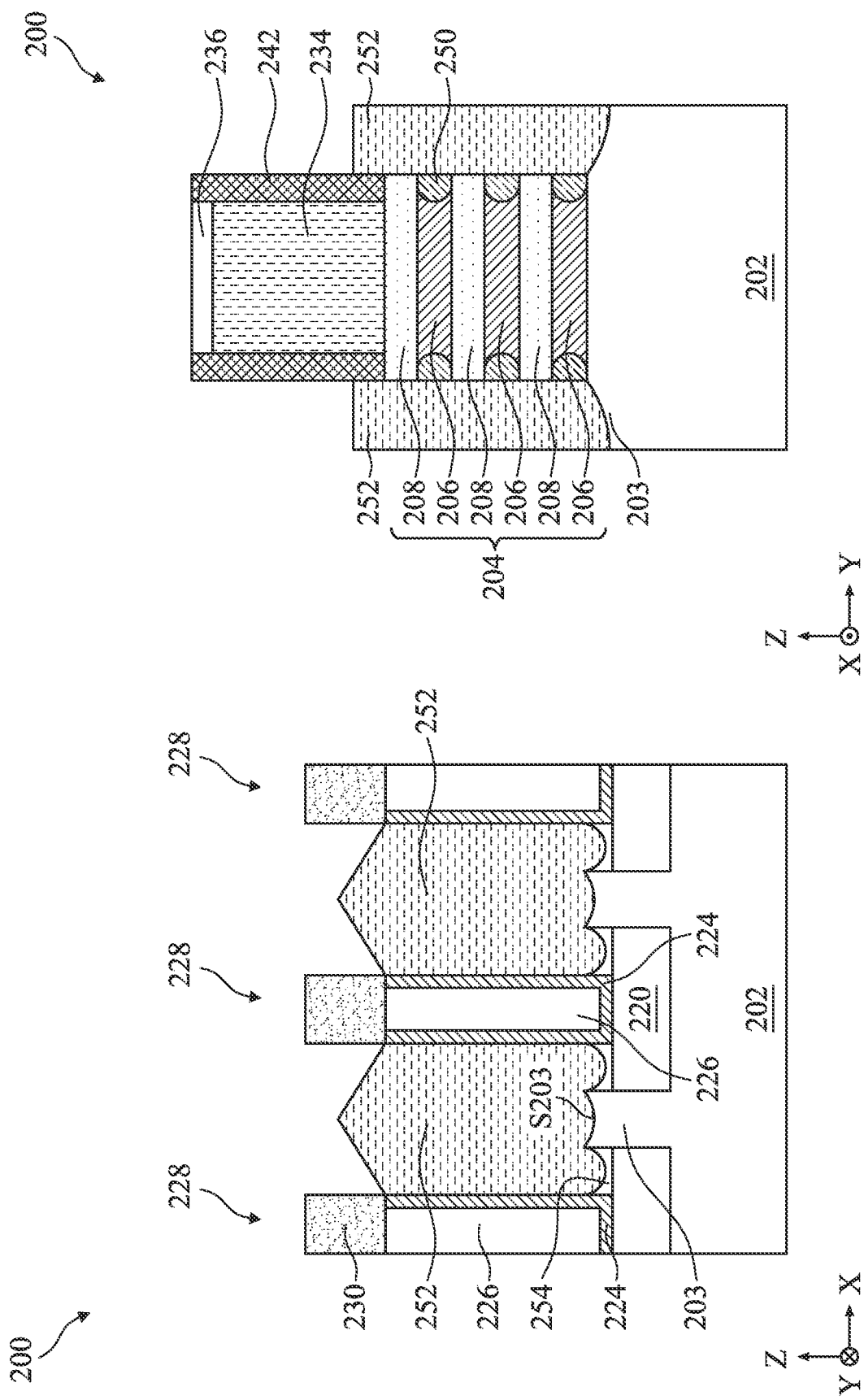
Figure 15D:
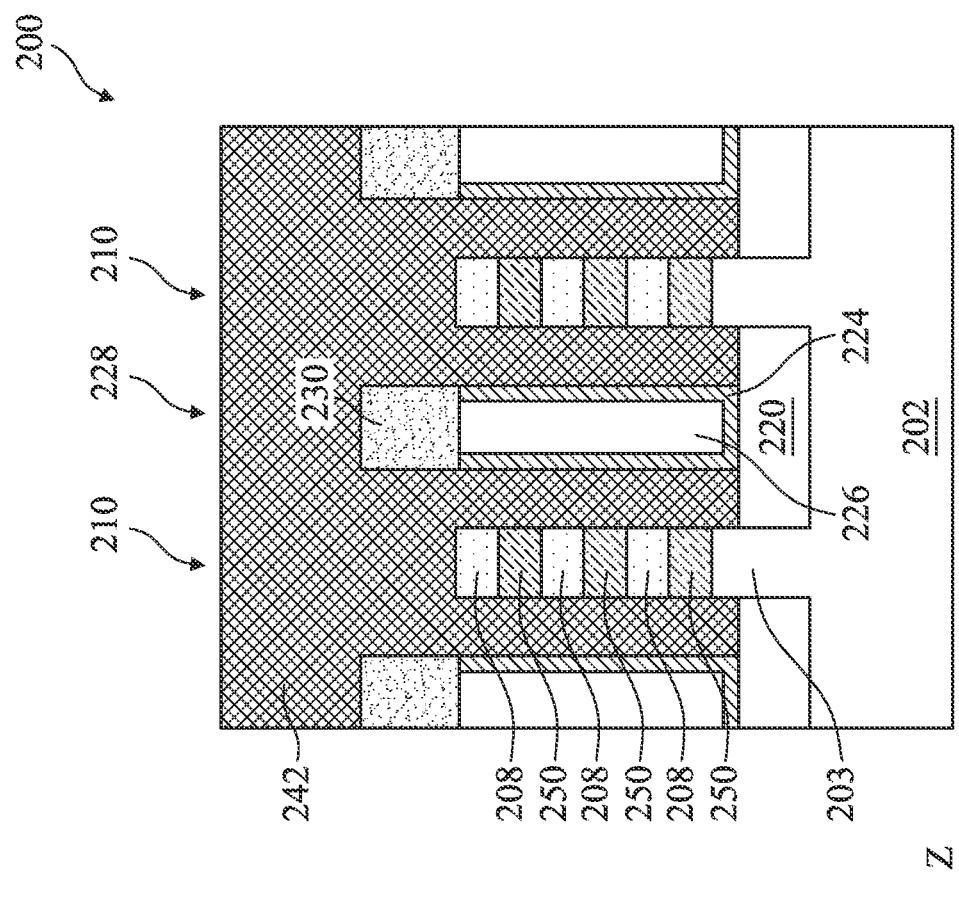
Figure 15C:
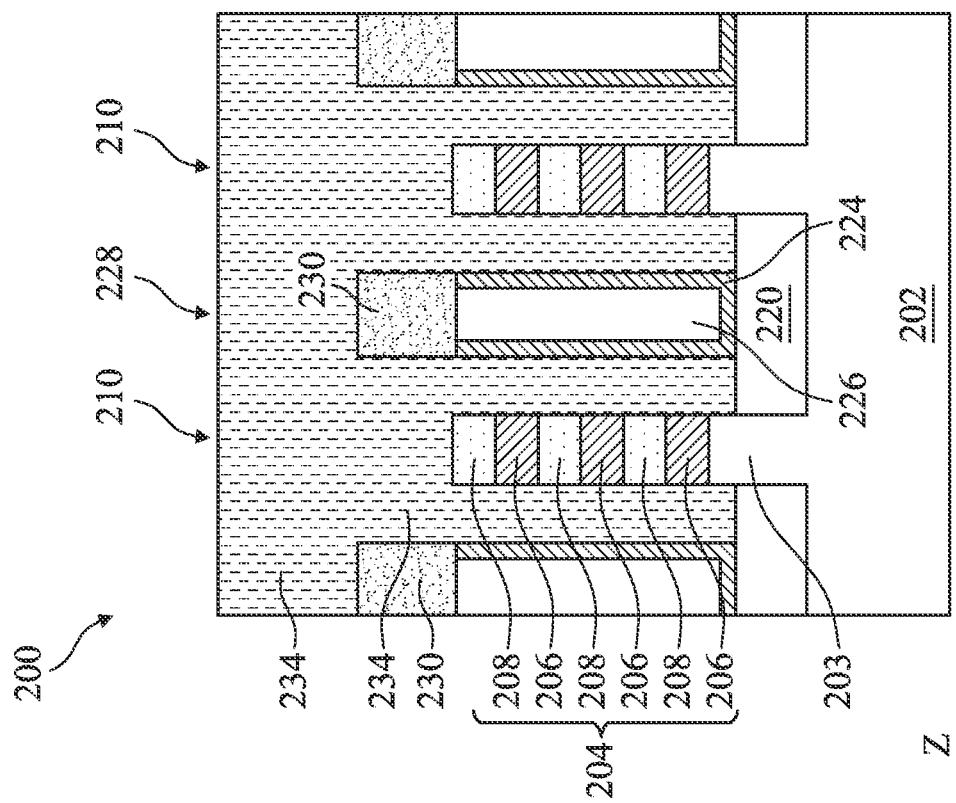
Figure 15F:
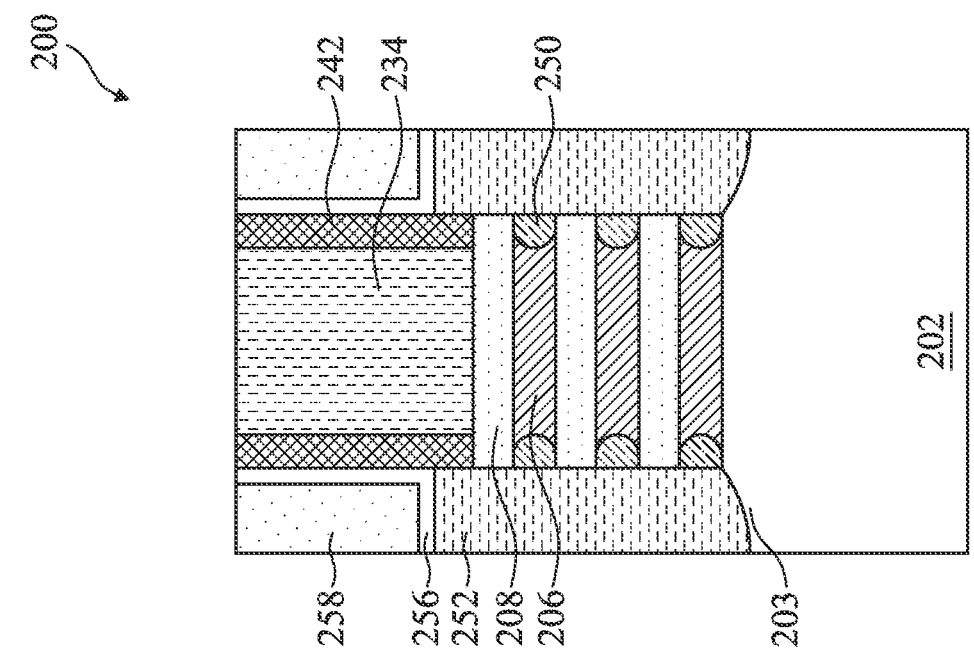
Figure 15E:
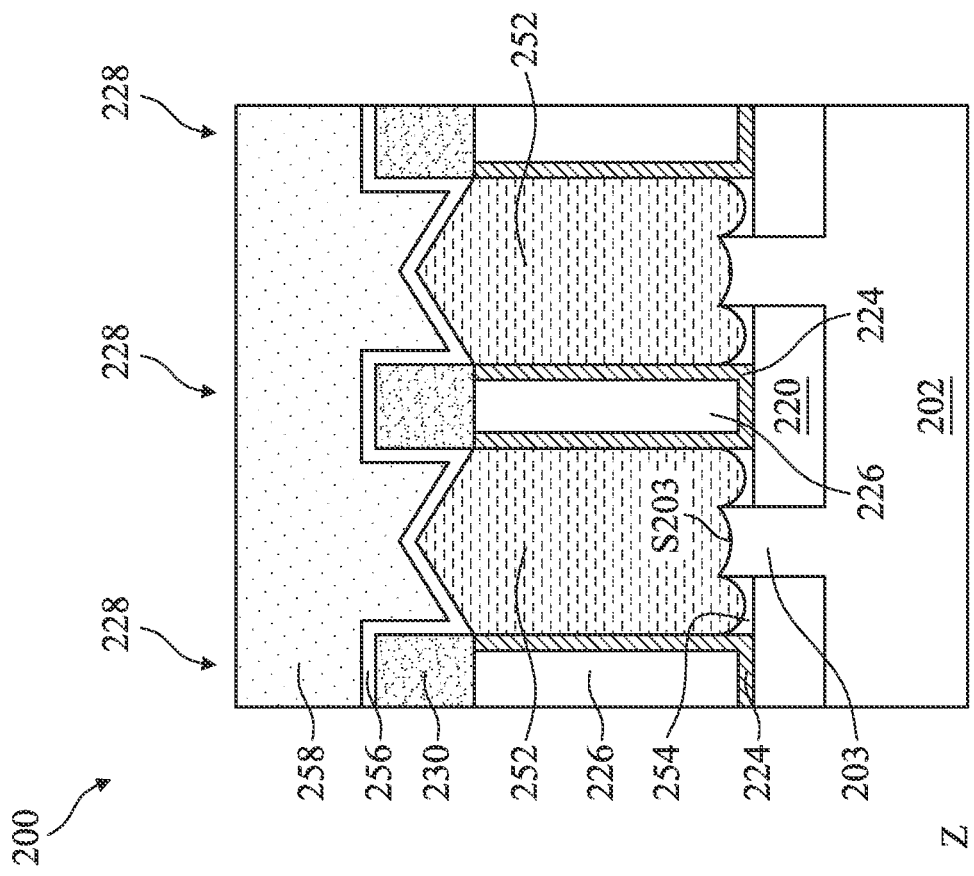

At operation 126, the method 100 (FIG. 1B) forms S/D features (also referred to as epitaxial S/D features). With reference to FIGS. 14A-14F, S/D features 252 are formed in the S/D recesses 246. In some embodiments of operation 126, the S/D features 252 are formed in S/D regions adjacent to and on either side of the dummy gate structure 234. For example, the S/D features 252 may be formed over the exposed base portions 203 of the semiconductor fins 210 and in contact with the adjacent inner spacers 250 and the channel layers (epitaxial layers 208). The S/D features 252 is also in contact with sidewalls of the dielectric fins 228 in the X-direction. The dielectric fins 228, which may have a partially etched-back high-K dielectric layer 230, effectively prevents the lateral merging of the S/D features 252 formed on adjacent semiconductor fins 210. Referring to FIG. 14E, in the illustrated embodiment, due to the elevated top surface S203 of the protruding base portion 203, the S/D features 252 is not in contact with the top surface of the STI features 220, even though a bottom portion of the S/D features 252 extends downwardly towards the STI features 220 and is lower than the top surface S203. Voids 254 (or gaps) are trapped between the bottom surface of the S/D features 252 and the top surface of the STI features 220. The voids 254 may be filled with ambient environment conditions (e.g., air, nitrogen).

In some embodiments, the S/D features 252 are formed by epitaxially growing a semiconductor material layer in the S/D regions. In various embodiments, the S/D features 252 may include Ge, Si, GaAs, AlGaAs, SiGe, GaAsP, SiP, or other suitable material. The S/D features 252 may be in-situ doped during the epitaxial process by introducing doping species including: p-type dopants, such as boron or BF$_2$; n-type dopants, such as phosphorus or arsenic; and/or other suitable dopants including combinations thereof. If the S/D features 252 are not in-situ doped, an implantation process (i.e., a junction implant process) is performed to dope the S/D features 252. In an exemplary embodiment, the S/D features 252 in an NMOS device include SiP, while those in a PMOS device include GeSnB and/or SiGeSnB. Furthermore, silicidation or germano-silicidation may be formed on the S/D features 252. For example, silicidation, such as nickel silicide, may be formed by depositing a metal layer over the epitaxial S/D features 252, annealing the metal layer such that the metal layer reacts with silicon in the S/D features 252 to form the metal silicidation, and thereafter removing the non-reacted metal layer.

At operation 128, the method 100 (FIG. 1B) forms a contact etch stop layer (CESL) and an inter-layer dielectric (ILD) layer. With reference to FIGS. 15A-15F, a CESL 256 is deposited over the S/D features 252 and an ILD layer 258 is deposited over the CESL 256. In some embodiments of operation 128, the CESL 256 includes a silicon nitride layer, silicon oxide layer, a silicon oxynitride layer, and/or other materials known in the art. The CESL 256 may be formed by plasma-enhanced chemical vapor deposition (PECVD) process and/or other suitable deposition or oxidation processes. In some embodiments, the ILD layer 258 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 258 may be deposited by a PECVD process or other suitable deposition technique. In some embodiments, after formation of the ILD layer 258, the semiconductor device 200 may be subject to a high thermal budget process to anneal the ILD layer.

In some examples, after depositing the ILD layer, a planarization process may be performed to remove excessive dielectric materials. For example, a planarization process includes a chemical mechanical planarization (CMP) process which removes portions of the ILD layer 258 (and CESL 256, if present) overlying the dummy gate structure 234 and planarizes a top surface of the semiconductor device 200. In some embodiments, the CMP process also removes the hard mask 236 and exposes the dummy electrode layer of the dummy gate structure 234.

Figure 16B:
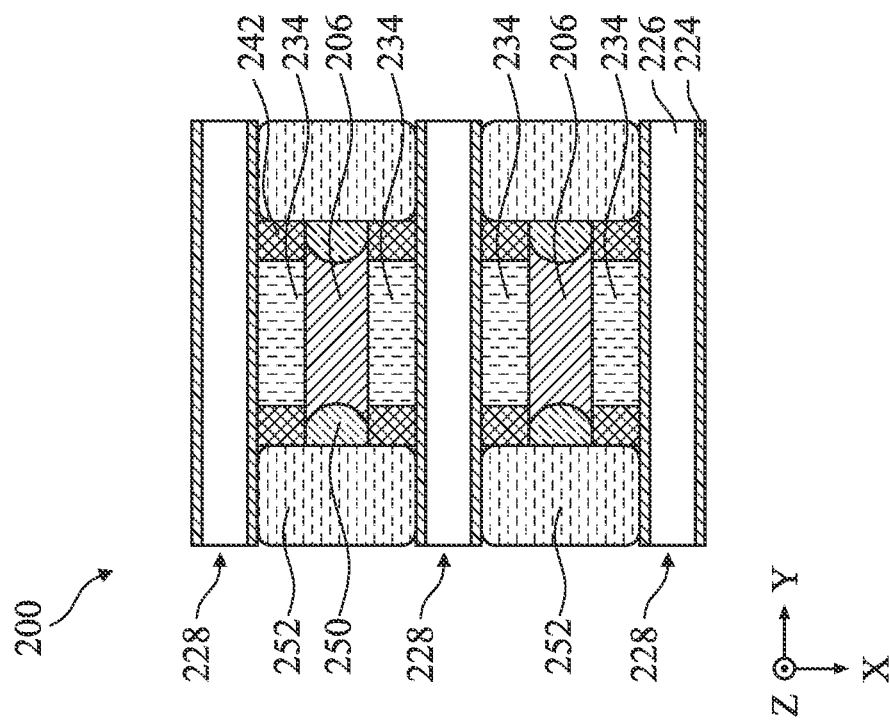
Figure 16A:
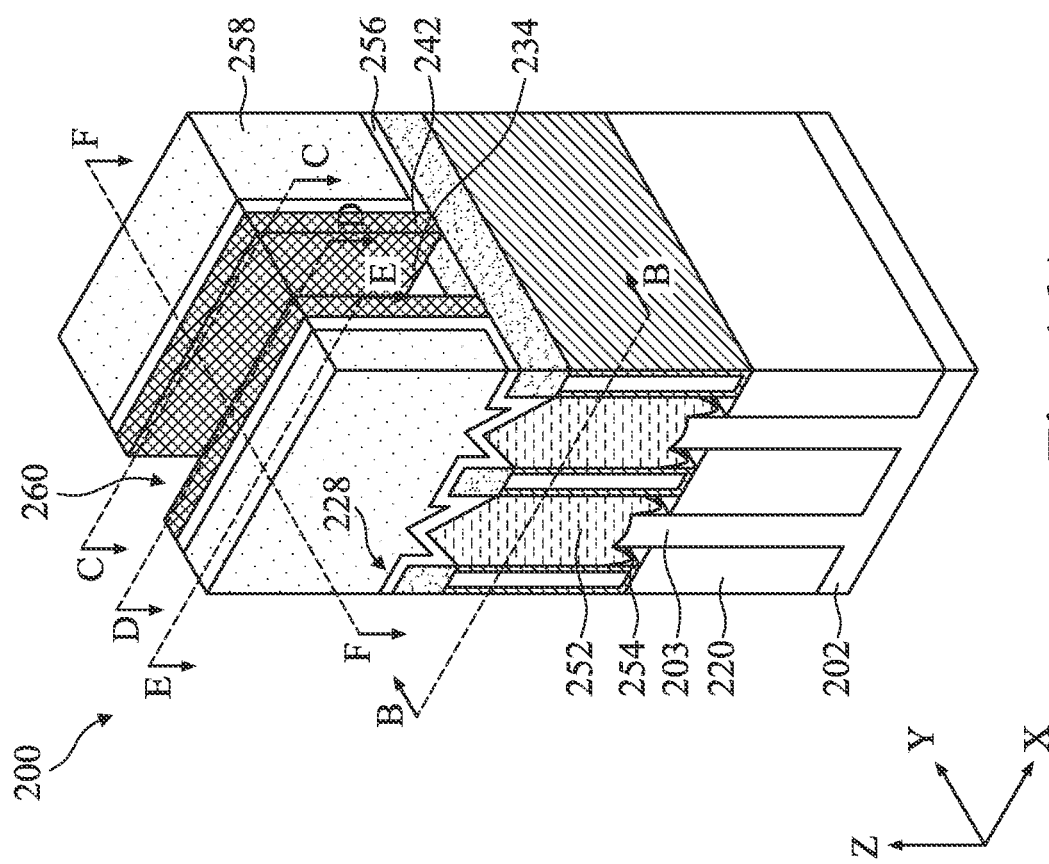
Figure 16D:
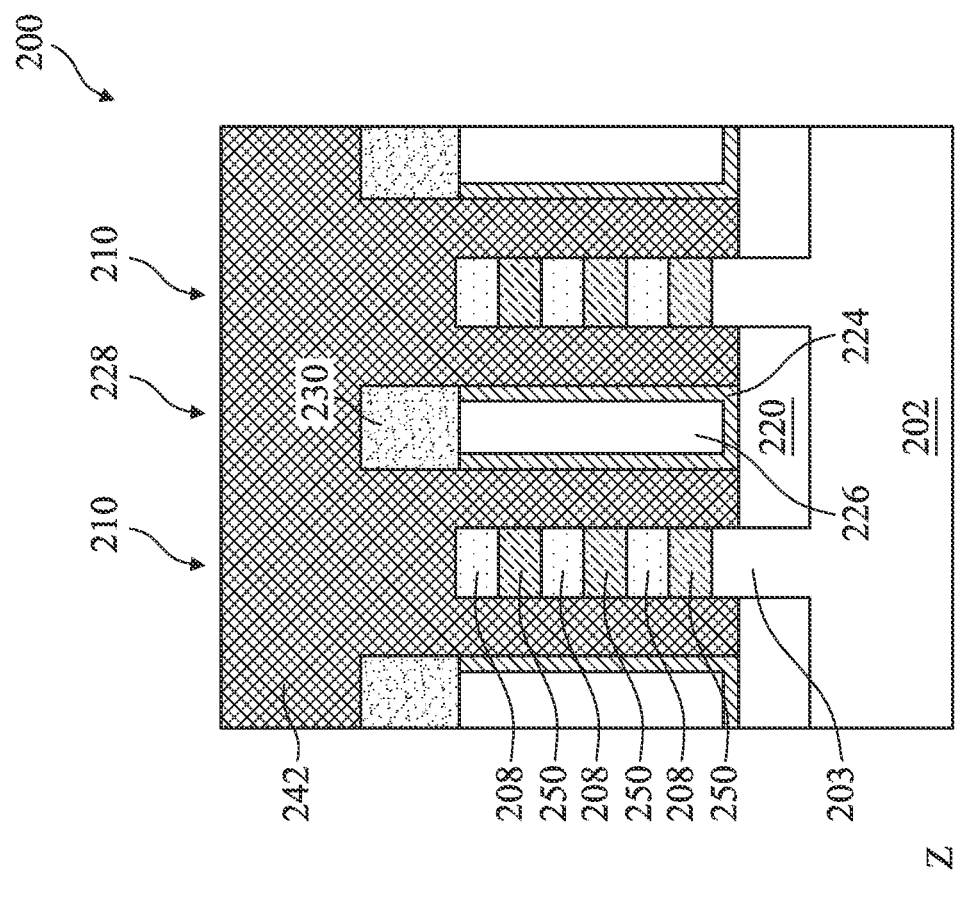
Figure 16C:
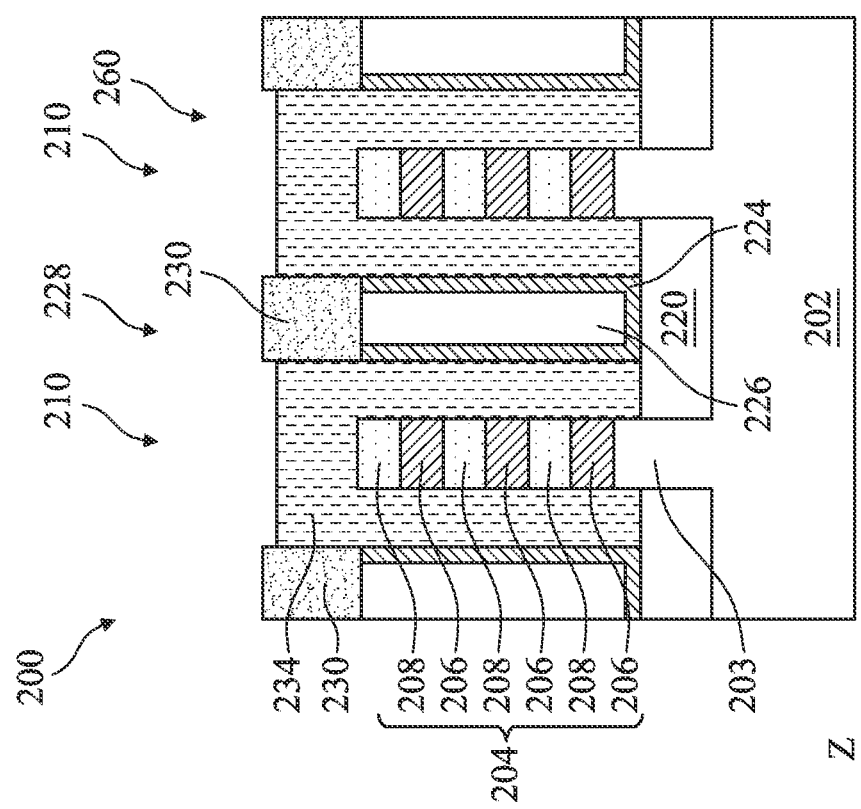
Figure 17B:
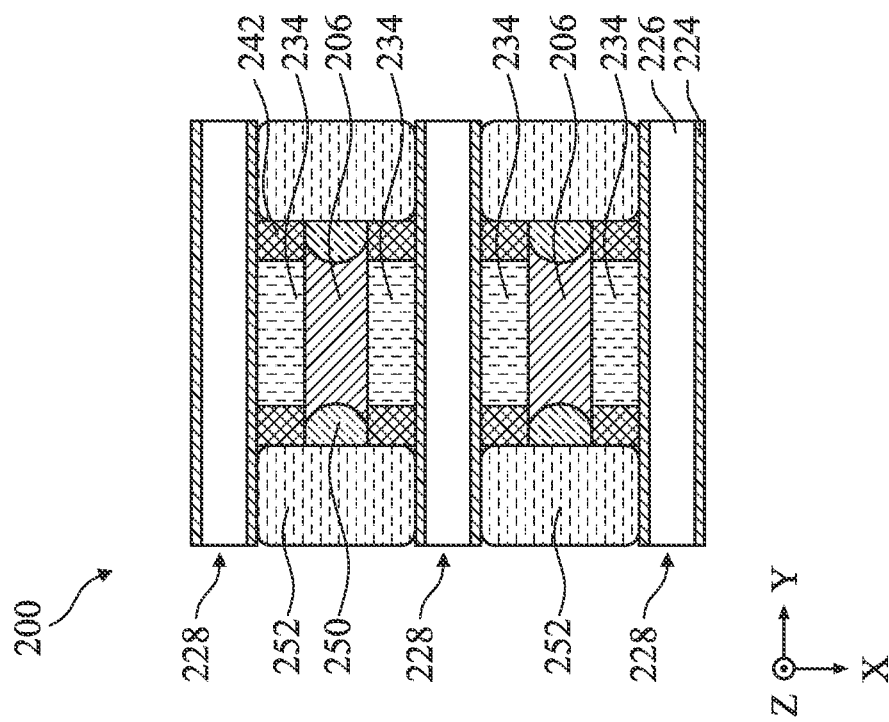
Figure 17A:
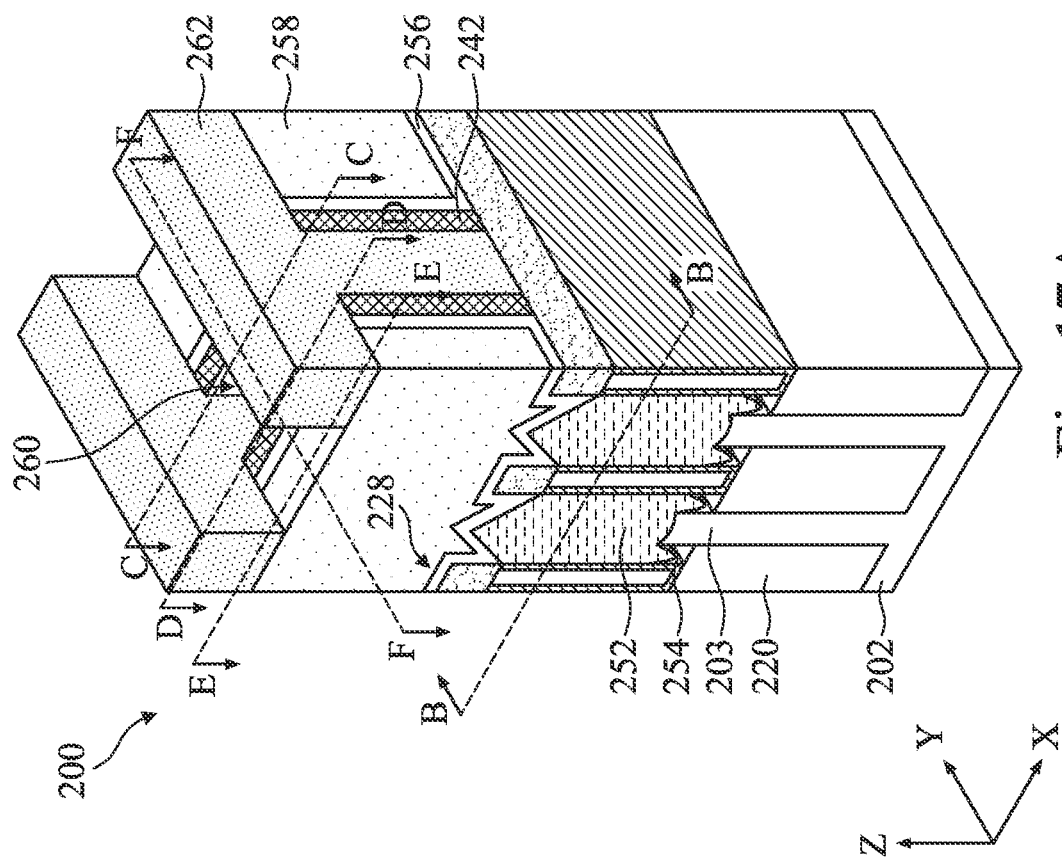
Figure 18B:
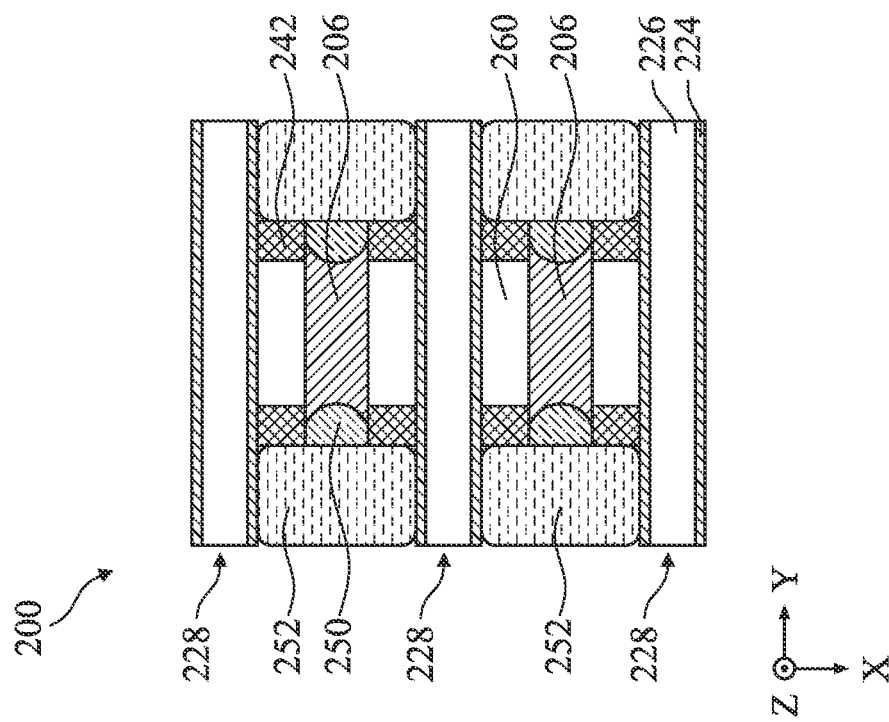
Figure 18A:
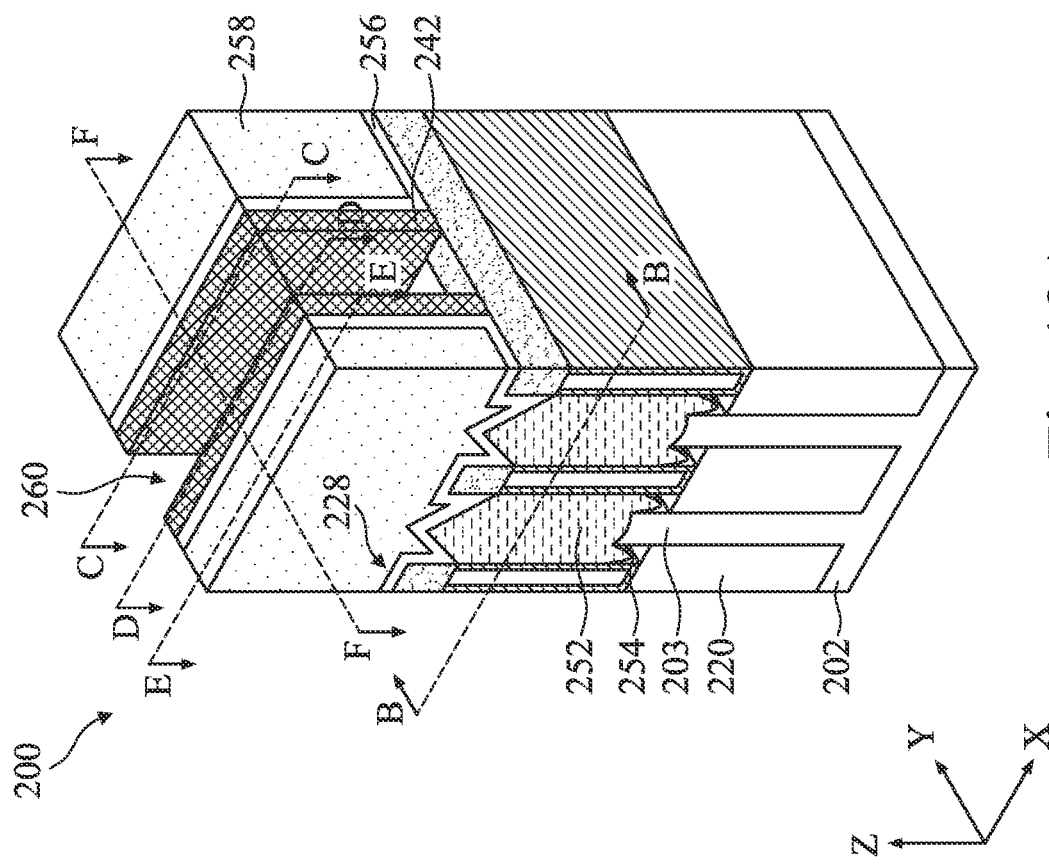
Figure 18F:
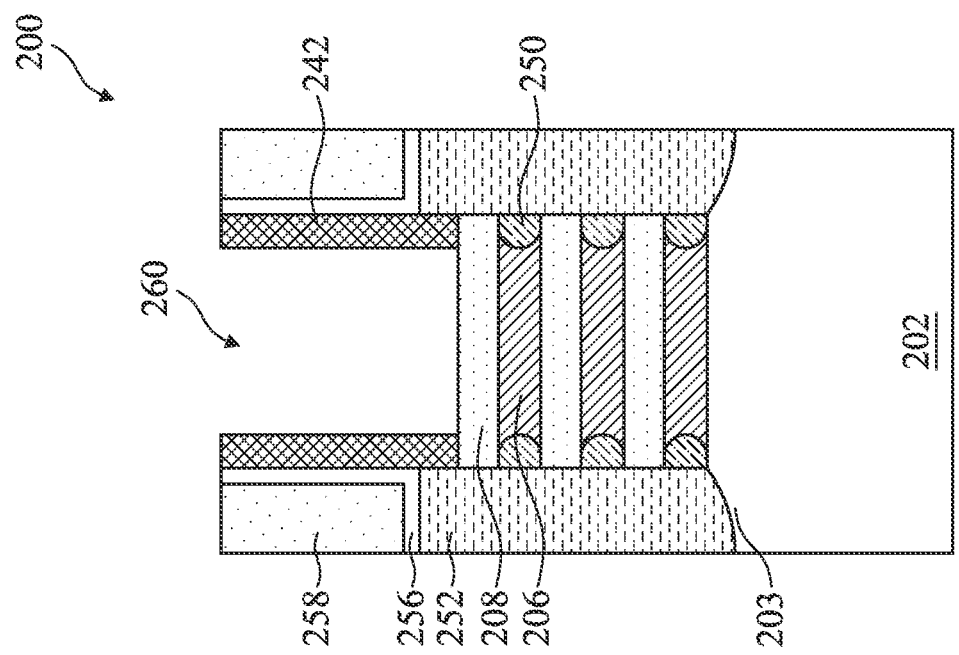
Figure 18E:
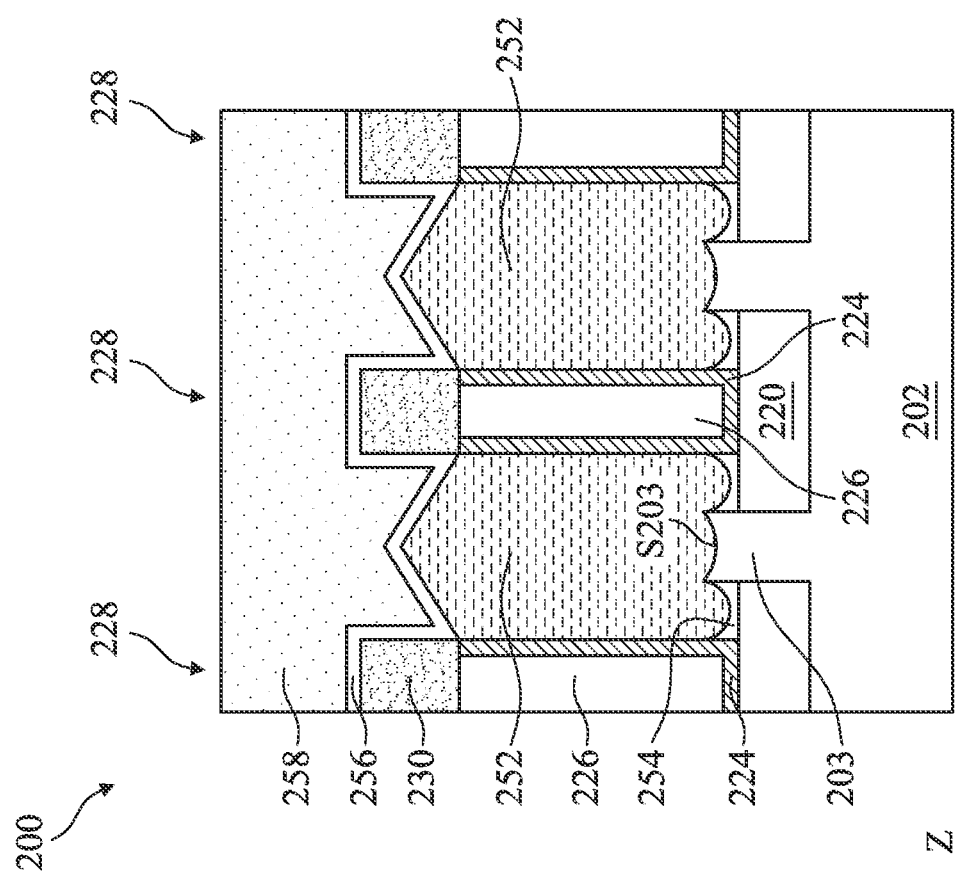
Figure 19B:
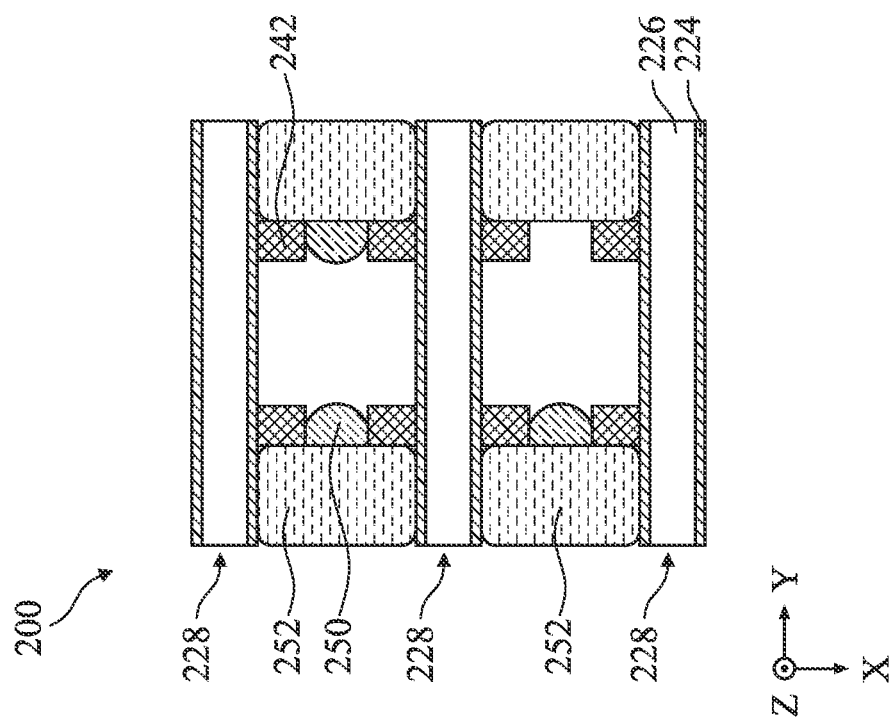
Figure 19A:
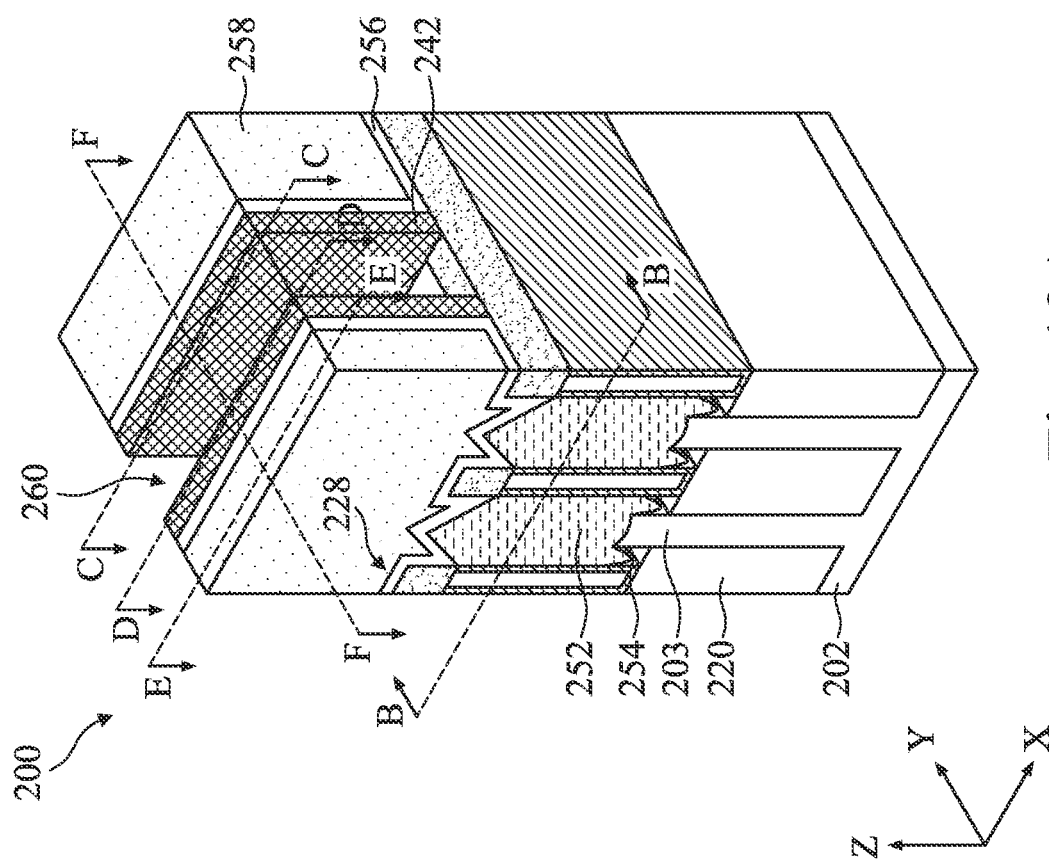
Figure 19D:
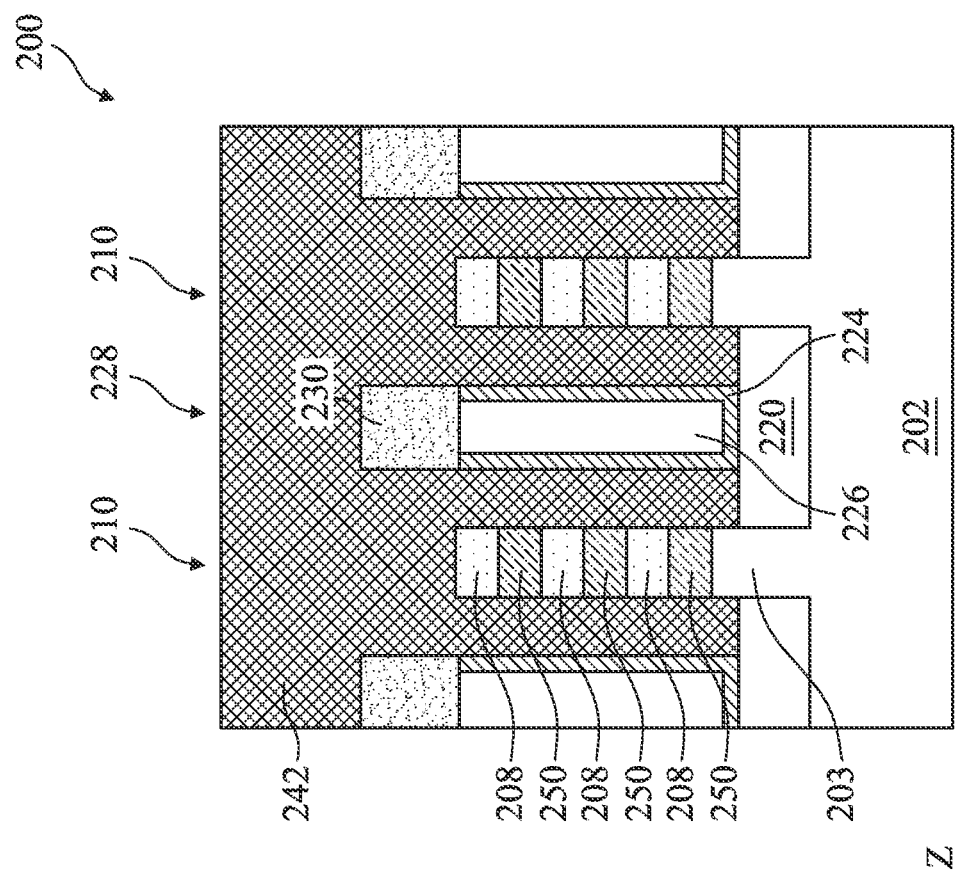
Figure 19C:
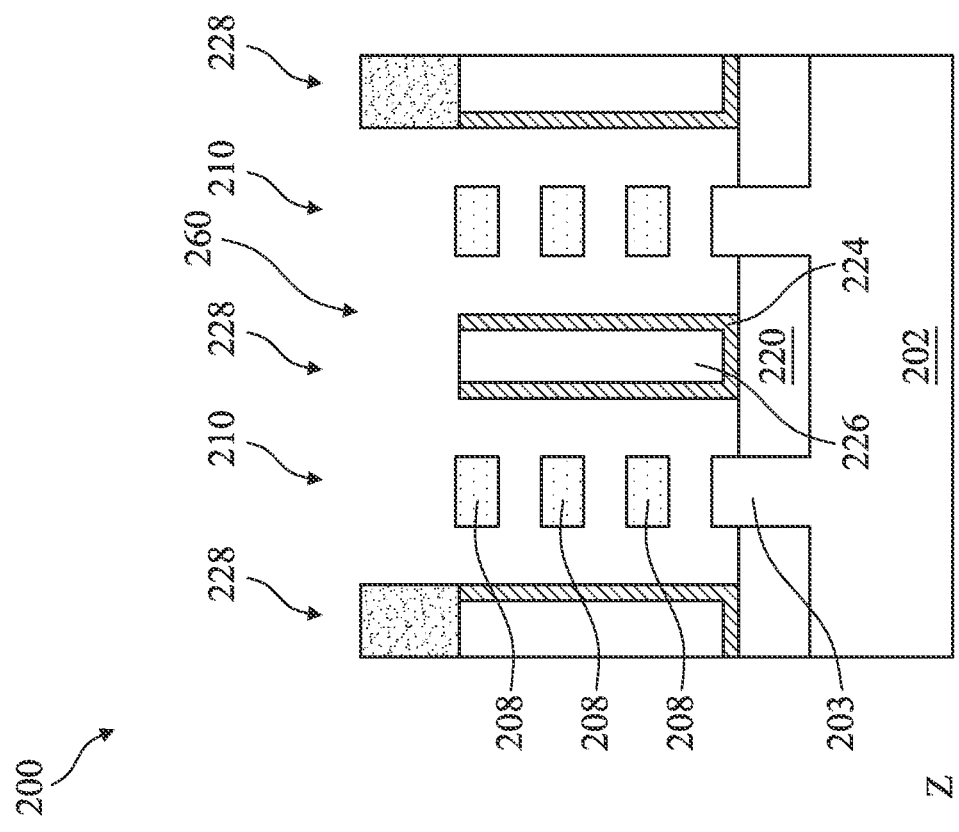

At operation 130, the method 100 (FIG. 1B) recesses the dummy gate structure 234 to form a gate trench 260. With reference to FIGS. 16A-16F, the dummy gate structure 234 is recessed to expose top surfaces of the dielectric fins 228 in the gate trench 260. In some embodiments of operation 130, a recessing depth of the dummy gate structure 234 is controlled (e.g., by controlling an etching time) so as to result in a desired height of the exposed upper portion of the dielectric fins 228. Referring to FIG. 16C, in the illustrated embodiment, the top surface of the recessed dummy gate structure 234 is below top surfaces of the high-k dielectric layer 230 but higher than bottom surfaces of the high-k dielectric layer 230. In other words, sidewalls of the high-k dielectric layer 230 of the dielectric fins 228 are partially exposed in the gate trench 260. Operation 130 may include one or more etching processes that are selective to the material in the dummy gate structure 234. For example, recessing the dummy gate structure 234 may be performed using a selective etch process such as a selective wet etch, a selective dry etch, or a combination thereof.

At operation 132, the method 100 (FIG. 1B) selectively removes the high-k dielectric layer 230 from a dielectric fin 228 at the location where a joint metal gate stack is subsequently formed. With reference to FIGS. 17A-17F, a mask layer 262 is formed over the recessed dummy gate structure 234 with an opening in the mask layer 262 that exposes one of the dielectric fins 228. In some embodiments of operation 132, the mask layer 262 is made of silicon oxide, silicon nitride, silicon carbon nitride, or other suitable material, and patterned using any suitable methods such as a photolithography process, which may include forming a resist layer on the mask layer 262, exposing the resist by a lithography exposure process, performing a post-exposure bake process, developing the photoresist layer to form the patterned photoresist layer that exposes part of the mask layer 262, patterning the mask layer 262, and finally removing the patterned resist layer. In some embodiments, the removal of the high-k dielectric layer 230 may be performed using a selective etch process such as a selective wet etch, a selective dry etch, or a combination thereof. The dielectric layers 224 and 226 of the dielectric fins 228 are exposed in the gate trench 260. The mask layer 262 is subsequently removed.

At operation 134, the method 100 (FIG. 1B) removes the dummy gate structure 234 to extend the gate trench 260 downwardly and expose the STI features 220 in the channel region. With reference to FIGS. 18A-18F, after the removal of the dummy gate structure 234, the epitaxial layers 206 and 208 are exposed in the gate trench 260. In some embodiments, operation 134 may include one or more etching processes that are selective to the material in the dummy gate structure 234. For example, the removal of the dummy gate structure 234 may be performed using a selective etch process such as a selective wet etch, a selective dry etch, or a combination thereof. A final gate structure (e.g., a high-k metal gate stack) may be subsequently formed in the gate trench 260, as will be described below.

At operation 136, the method 100 (FIG. 1B) removes the epitaxial layers 206 from the semiconductor fins 210. With reference to FIGS. 19A-19F, after the removal of the epitaxial layers 206, the epitaxial layers 208 are released in the gate trench 260 as channel members. In some embodiments, the epitaxial layers 206 include SiGe and the epitaxial layers 208 are silicon, allowing for the selective removal of the epitaxial layers 206. In furtherance of some embodiments, the epitaxial layers 206 are removed by a selective wet etching process. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by $O_3$ clean and then SiGeOx removed by an etchant such as $NH_4OH$.

Due to the removal of the cladding layer 222 prior to the forming of the dummy gate structure 234, operation 136 only needs to selectively etch the epitaxial layers 206 instead of a combination of the epitaxial layer 206 and the cladding layer 222. If the cladding layer 222 is not removed until operation 136, different etch rates between the epitaxial layer 206 and the cladding layer 222 (e.g., as due to different germanium concentrations) may complicate the etching process. For example, the etching time may be extended to ensure both the epitaxial layer 206 and the cladding layer 222 are sufficiently removed, which may in turn damage the channel members 208 in an extended etching process.

The method 100 then proceeds to operation 138 (FIG. 1B) where a gate structure is formed. The gate structure may be the gate of one or more multi-gate transistors. The gate structure may be a high-k metal gate (HK MG) stack, however other compositions are possible. In some embodiments, the gate structure forms the gate associated with the multi-channels provided by the plurality of channel members (e.g., nanosheets or nanowires having gaps therebetween) in the channel region. The resultant structure is shown in FIGS. 20A-20F. In an embodiment of operation 138, a HK MG stack 270 is formed within the gate trench 260 of the device 200 provided by the release of the epitaxial layers 208, described above with reference to prior operation 136. In various embodiments, the HK MG stack 270 includes an interfacial layer (not shown), a high-K gate dielectric layer 272 formed over the interfacial layer, and a gate electrode layer 274 formed over the high-k gate dielectric layer 272. High-k gate dielectrics, as used and described herein, include dielectric materials having a high dielectric constant, for example, greater than that of thermal silicon oxide (~3.9). The gate electrode layer used within HK MG stack may include a metal, metal alloy, or metal silicide. Additionally, the formation of the HK MG stack may include depositions to form various gate materials, one or more liner layers, and one or more CMP processes to remove excessive gate materials and thereby planarize a top surface of the semiconductor device 200. Interposing the HK MG stack 270 and the S/D features 252 is the inner spacers 250, providing isolation.

The HK MG stack 270 includes portions that interpose each of the epitaxial layers (channel members) 208, which form channels of the multi-gate device 200. In some embodiments, the interfacial layer of the HK MG stack 270 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k gate dielectric layer 272 of the HK MG stack 270 may include a high-K dielectric such as hafnium oxide ($HfO_2$). Alternatively, the high-k gate dielectric layer 272 of the HK MG stack 270 may include other high-K dielectrics, such as $TiO_2$, HfZrO, $Ta_2O_3$, $HfSiO_4$, $ZrO_2$, ZrSiO2, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material.

Figures 20C, 20D:
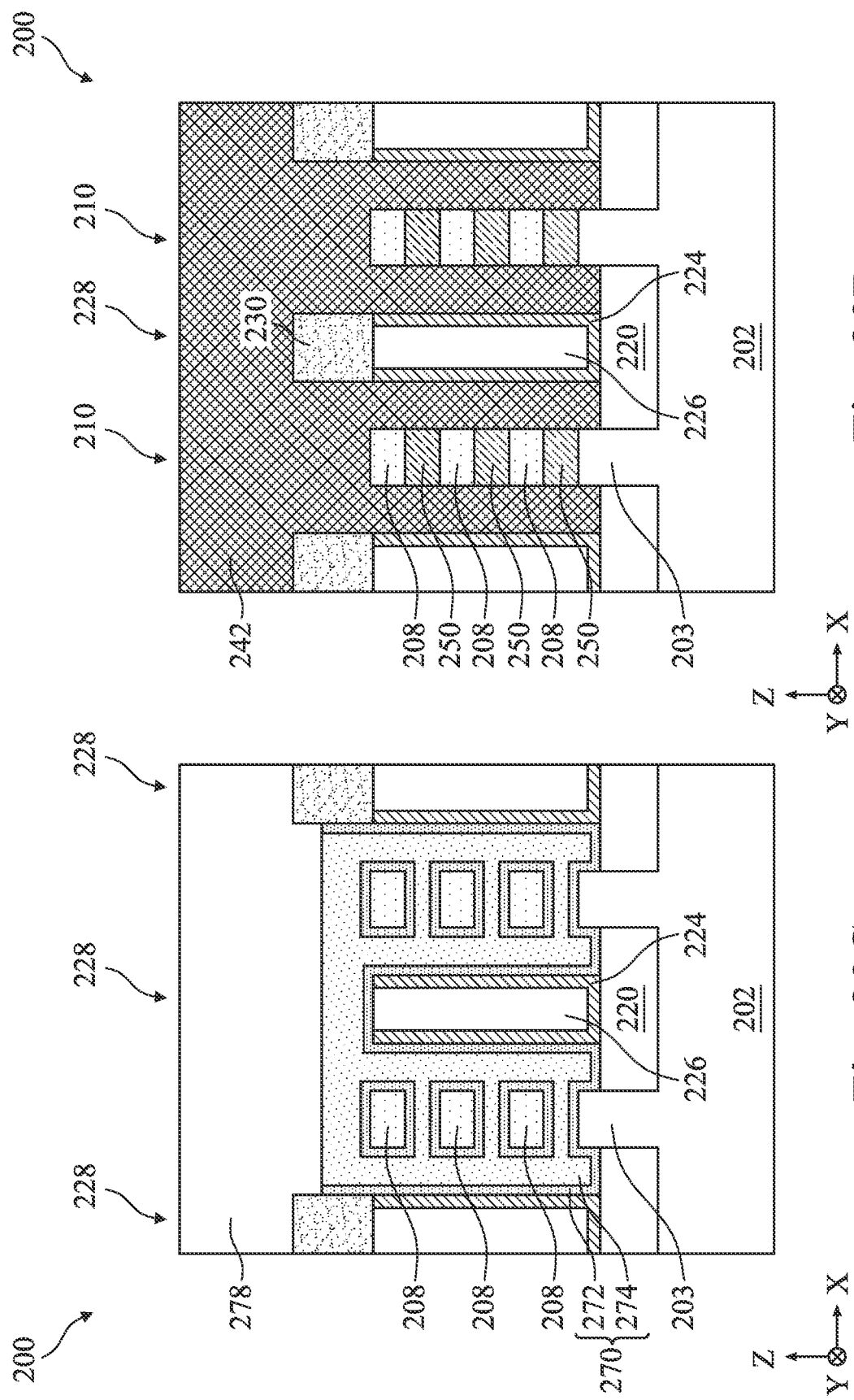
Figure 20F:
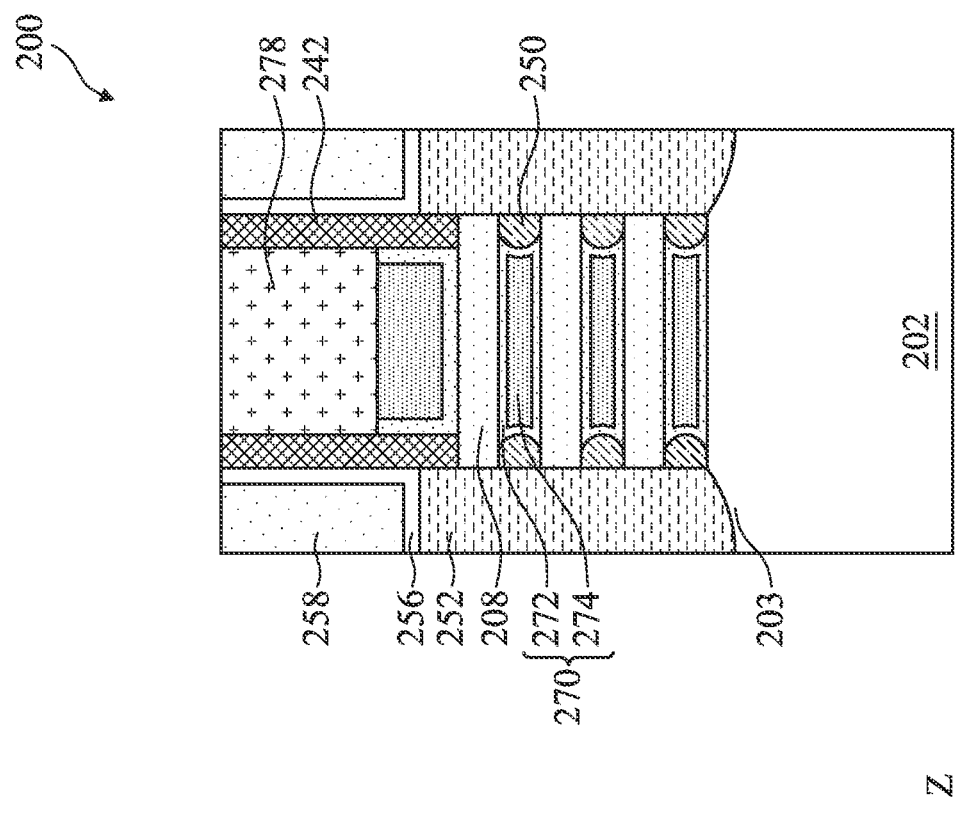
Figure 20E:
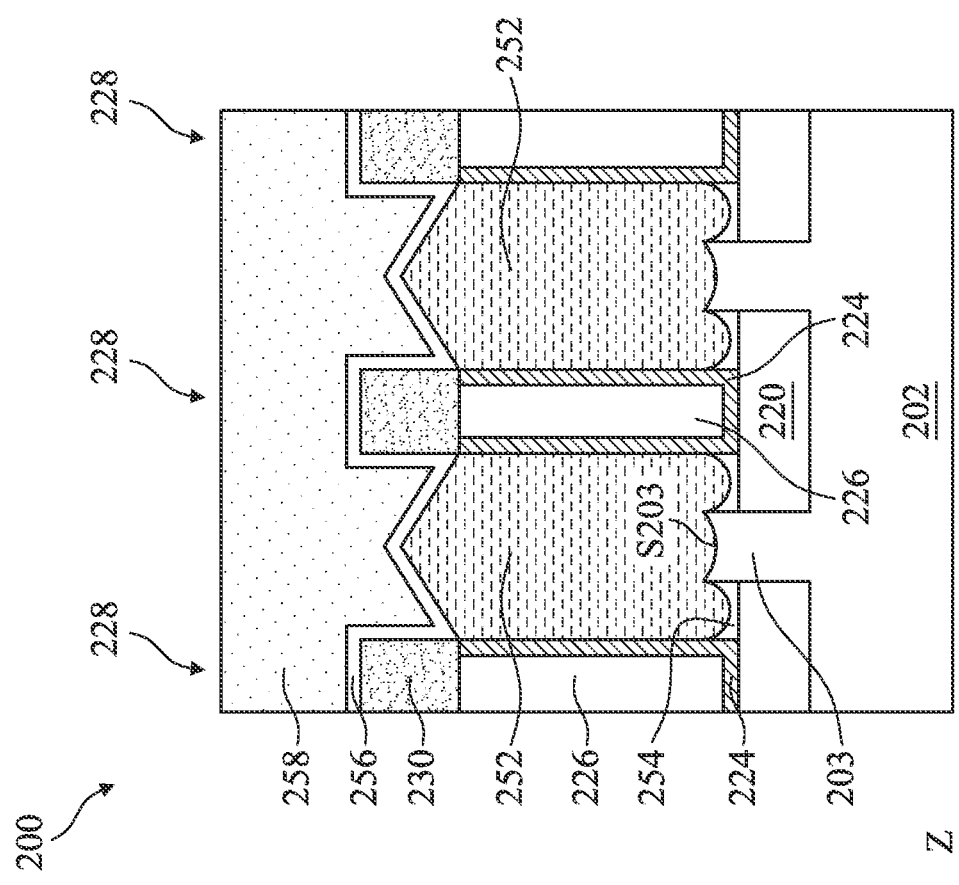

The high-k gate dielectric layer 272 may be formed by ALD, physical vapor deposition (PVD), CVD, oxidation, and/or other suitable methods. As illustrated in FIGS. 20B and 20C, in some embodiments, the high-k gate dielectric layer 272 is deposited conformally on sidewalls of the inner spacers 250 and top surfaces of the STI features 220.

The gate electrode layer 274 of the HK MG stack 270 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 274 of HK MG stack 270 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate electrode layer 274 of the HK MG stack 270 may be formed by ALD, PVD, CVD, e-beam evaporation, or other suitable process. Further, the gate electrode layer 274 may be formed separately for N-FET and P-FET transistors which may use different metal layers (e.g., for providing an N-type or P-type work function).

Referring to FIG. 20C, in the illustrated embodiment, the HK MG stack 270 straddles the middle dielectric fin 228 due to the prior removal of its high-k dielectric layer 230 and engages two stacks of channel members 208 on both sides of the middle dielectric fin 228, such that two transistors share the same gate stack. The HK MG stack 270 is also referred to as a joint gate stack in such a configuration. The HK MG stack 270 may be etched back so that the top surface of the HK MG stack 270 is lower than the top surface of the high-k dielectric layer 230 of other dielectric fins 228 on both sides of the HK MG stack 270, for example, about 2 nm to about 10 nm lower. The dielectric fins 228 on both sides of the HK MG stack 270 function as gate isolation features that isolate the HK MG stack 270 from other adjacent gate stacks. The portion of the etched-back HK MG stack 270 above the top epitaxial layer 208 may have a thickness ranging from about 10 nm to about 20 nm.

After the etching back of the HK MG stack 270, a self-aligned cap (SAC) layer 278 is deposited over the device 200 by CVD, PECVD, or a suitable deposition process. The SAC layer 278 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. In various embodiments, a CMP process may be performed to remove excessive metal from the SAC layer 278, and thereby provide a substantially planar top surface of the device 200.

The device 200 may undergo further processing to form various features and regions known in the art. For example, subsequent processing may form contact openings, contact metal, as well as various contacts/vias/lines and multilayers interconnect features (e.g., metal layers and interlayer dielectrics), configured to connect the various features to form a functional circuit that may include one or more multi-gate devices. In furtherance of the example, a multi-layer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Although not intended to be limiting, one or more embodiments of the present disclosure provide many benefits to a semiconductor device and the formation thereof. For example, embodiments of the present disclosure provide dielectric fins for improving fin uniformity and defining space for source/drain (S/D) features, and sacrificial cladding layers for reserving space for metal gate stacks. The removal of the sacrificial cladding layers prior to the forming of dummy gate structures allows less etching of a base portion of the semiconductor fins underneath the S/D features, which in turn suppresses substrate leakage current. The removal of the sacrificial cladding layers prior to the forming of dummy gate structures also increases the uniformity of inner spacer dimensions and reduces risks of over etching channel members during the channel member release process. Furthermore, the dielectric fin and sacrificial cladding layer formation method can be easily integrated into existing semiconductor fabrication processes.

In one exemplary aspect, the present disclosure is directed to a method. The method includes forming a semiconductor fin protruding from a substrate, forming a cladding layer on sidewalls of the semiconductor fin, forming first and second dielectric fins sandwiching the semiconductor fin, removing the cladding layer, thereby forming trenches between the semiconductor fin and the first and second dielectric fins, after the removing of the cladding layer, forming a dummy gate structure over the semiconductor fin and in the trenches, recessing the semiconductor fin in a region proximal to the dummy gate structure, a top surface of the recessed semiconductor fin in the region having a concave shape, forming an epitaxial feature on the recessed semiconductor fin, and forming a metal gate stack replacing the dummy gate structure. In some embodiments, the method further includes forming an isolation feature on the substrate. The semiconductor fin protrudes through the isolation feature. After the removing of the cladding layer, the trenches expose the isolation feature. In some embodiments, a bottom portion of the dummy gate structure in the trenches is in contact with the isolation feature. In some embodiments, the top surface of the recessed semiconductor fin in the region is above the isolation feature. In some embodiments, the method further includes depositing gate sidewall spacers on sidewalls of the dummy gate structure and in the trenches. In some embodiments, a bottom surface of the epitaxial feature is below a top surface of the recessed semiconductor fin in the region. In some embodiments, the forming of the epitaxial feature defines voids positioned laterally between the semiconductor fin and the first and second dielectric fins and vertically between the epitaxial feature and the substrate. In some embodiments, the cladding layer includes amorphous or polycrystalline semiconductor material. In some embodiments, the semiconductor material is silicon germanium. In some embodiments, the semiconductor fin includes a plurality of sacrificial layers and a plurality of channel layers alternately arranged, and the method further includes laterally recessing end portions of the sacrificial layers, thereby forming cavities, and forming inner spacers in the cavities, the inner spacers interposing the epitaxial feature and the metal gate stack.

In another exemplary aspect, the present disclosure is directed to a method. The method includes forming a stack of first type and second type epitaxial layers on a semiconductor substrate, the first type and second type epitaxial layers having different material compositions and the first type and second type epitaxial layers being alternatingly disposed in a vertical direction, patterning the stack and a top portion of the semiconductor substrate to form a fin, depositing a sacrificial layer on a sidewall of the fin, forming a dielectric pillar on a sidewall of the sacrificial layer, etching the sacrificial layer, thereby exposing a bottom second type epitaxial layer, after the etching of the sacrificial layer, depositing a sacrificial structure over the fin and the dielectric pillar, the sacrificial structure being in contact with the bottom second type epitaxial layer, removing the sacrificial structure and the second type epitaxial layers, thereby forming a trench, and depositing a conductive feature in the trench and wrapping around the first type epitaxial layers. In some embodiments, the second type epitaxial layers and the sacrificial layer include a same semiconductor material. In some embodiments, the semiconductor material is silicon germanium, and germanium concentration is different in the second type epitaxial layers and the sacrificial layer. In some embodiments, the dielectric pillar includes a lower portion of a first dielectric material and an upper portion of a second dielectric material different from the first dielectric material, the method further includes recessing the sacrificial structure to expose the upper portion of the dielectric pillar, and prior to the depositing of the conductive feature, removing the upper portion of the dielectric pillar. In some embodiments, the method further includes recessing the fin in a region proximal to the sacrificial structure, such that the stack is removed from the region and a top surface of the top portion of the semiconductor substrate is exposed in the region, the top surface of the top portion of the semiconductor substrate in the region being above a bottom surface of the dielectric pillar. In some embodiments, the method further includes epitaxially growing a semiconductor feature from the top surface of the top portion of the semiconductor substrate, a bottommost portion of the semiconductor feature being below the top surface of the top portion of the semiconductor substrate. In some embodiments, the method further includes depositing a dielectric layer on sidewalls of the sacrificial structure, the dielectric layer being in contact with the bottom second type epitaxial layer.

In yet another exemplary aspect, the present disclosure is directed to a multi-gate semiconductor device. The multi-gate semiconductor device includes an isolation feature disposed over a substrate, a top portion of the substrate protruding through the isolation feature, channel members disposed over the substrate, first and second dielectric features disposed over the isolation feature and sandwiching the channel members, an epitaxial feature abutting the channel members and directly above a top surface of the top portion of the substrate, the top surface of the top portion of the substrate being above the isolation feature, and a gate structure engaging the channel members. In some embodiments, a bottommost portion of the epitaxial feature is above the isolation feature. In some embodiments, a top surface of the first dielectric feature is above a top surface of the second dielectric feature, and the gate structure covers the top surface of the second dielectric feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a semiconductor fin protruding from a substrate;
   forming an isolation feature on the substrate, wherein the semiconductor fin protrudes through the isolation feature;
   after the forming of the isolation feature, forming a cladding layer on sidewalls of the semiconductor fin, wherein the cladding layer and the isolation feature include different material compositions;
   forming first and second dielectric fins sandwiching the semiconductor fin;
   removing the cladding layer, thereby forming trenches between the semiconductor fin and the first and second dielectric fins;
   after the removing of the cladding layer, forming a dummy gate structure over the semiconductor fin and in the trenches;
   depositing gate sidewall spacers on sidewalls of the dummy gate structure and in the trenches;
   recessing the semiconductor fin in a region proximal to the dummy gate structure, wherein a top surface of the recessed semiconductor fin in the region has a concave shape;
   forming an epitaxial feature on the recessed semiconductor fin; and
   forming a metal gate stack replacing the dummy gate structure.

2. The method of claim 1,
   wherein after the removing of the cladding layer, the trenches expose the isolation feature.

3. The method of claim 1, wherein a bottom portion of the dummy gate structure in the trenches is in contact with the isolation feature.

4. The method of claim 1, wherein the top surface of the recessed semiconductor fin in the region is above the isolation feature.

5. The method of claim 1, wherein a bottom surface of the epitaxial feature is below a top surface of the recessed semiconductor fin in the region.

6. The method of claim 1, wherein the forming of the epitaxial feature defines voids positioned laterally between the semiconductor fin and the first and second dielectric fins and vertically between the epitaxial feature and the substrate.

7. The method of claim 1, wherein the cladding layer includes amorphous or polycrystalline semiconductor material.

8. The method of claim 7, wherein the semiconductor material is silicon germanium.

9. The method of claim 1, wherein the semiconductor fin includes a plurality of sacrificial layers and a plurality of channel layers alternately arranged, the method further comprising:
   laterally recessing end portions of the sacrificial layers, thereby forming cavities; and
   forming inner spacers in the cavities, wherein the inner spacers interpose the epitaxial feature and the metal gate stack.

10. A method, comprising:
    forming a stack of first type and second type epitaxial layers on a semiconductor substrate, the first type and second type epitaxial layers having different material compositions and the first type and second type epitaxial layers being alternatingly disposed in a vertical direction;

patterning the stack and a top portion of the semiconductor substrate to form a fin;

forming an isolation feature on the semiconductor substrate such that the fin protrudes from the isolation feature;

depositing a sacrificial layer over a top surface of the isolation feature and on a sidewall of the fin;

forming a dielectric pillar on a sidewall of the sacrificial layer;

etching the sacrificial layer, thereby exposing a bottom second type epitaxial layer and the top surface of the isolation feature;

after the etching of the sacrificial layer, depositing a sacrificial structure over the fin and the dielectric pillar, wherein the sacrificial structure is in contact with the bottom second type epitaxial layer;

removing the sacrificial structure and the second type epitaxial layers, thereby forming a trench; and depositing a conductive feature in the trench and wrapping around the first type epitaxial layers.

11. The method of claim 10, wherein the second type epitaxial layers and the sacrificial layer include a same semiconductor material.

12. The method of claim 11, wherein the semiconductor material is silicon germanium, and wherein germanium concentration is different in the second type epitaxial layers and the sacrificial layer.

13. The method of claim 10, wherein the dielectric pillar includes a lower portion of a first dielectric material and an upper portion of a second dielectric material different from the first dielectric material, the method further comprising:
recessing the sacrificial structure to expose the upper portion of the dielectric pillar; and
prior to the depositing of the conductive feature, removing the upper portion of the dielectric pillar.

14. The method of claim 10, further comprising:
recessing the fin in a region proximal to the sacrificial structure, such that the stack is removed from the region and a top surface of the top portion of the semiconductor substrate is exposed in the region, wherein the top surface of the top portion of the semiconductor substrate in the region is above a bottom surface of the dielectric pillar.

15. The method of claim 14, further comprising:
epitaxially growing a semiconductor feature from the top surface of the top portion of the semiconductor substrate,
wherein a bottommost portion of the semiconductor feature is below the top surface of the top portion of the semiconductor substrate.

16. The method of claim 10, further comprising:
depositing a dielectric layer on sidewalls of the sacrificial structure, wherein the dielectric layer is in contact with the bottom second type epitaxial layer.

17. A multi-gate semiconductor device, comprising:
an isolation feature disposed over a substrate, wherein a top portion of the substrate protrudes through the isolation feature;
channel members disposed over the substrate;
first and second dielectric features disposed over the isolation feature and sandwiching the channel members, wherein bottom surfaces of the first and second dielectric features are above a topmost surface of the isolation feature;
an epitaxial feature abutting the channel members and directly above a top surface of the top portion of the substrate, wherein the top surface of the top portion of the substrate is above the isolation feature, and wherein a bottom surface of the epitaxial feature is spaced apart from a top surface of the isolation feature such that an air gap is trapped therebetween; and
a gate structure engaging the channel members.

18. The multi-gate semiconductor device of claim 17, wherein a bottommost portion of the epitaxial feature is above the isolation feature.

19. The multi-gate semiconductor device of claim 17, wherein a top surface of the first dielectric feature is above a top surface of the second dielectric feature, and wherein the gate structure covers the top surface of the second dielectric feature.

20. The multi-gate semiconductor device of claim 17, wherein the epitaxial feature is free of contact with the isolation feature.

* * * * *